(12) United States Patent
Nakayama et al.

(10) Patent No.: US 10,014,403 B2
(45) Date of Patent: *Jul. 3, 2018

(54) SEMICONDUCTOR DEVICE

(71) Applicant: Renesas Electronics Corporation, Tokyo (JP)

(72) Inventors: Tatsuo Nakayama, Tokyo (JP); Hironobu Miyamoto, Tokyo (JP); Yasuhiro Okamoto, Tokyo (JP); Yoshinao Miura, Tokyo (JP); Takashi Inoue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/437,559

(22) Filed: Feb. 21, 2017

(65) Prior Publication Data

US 2017/0162683 A1 Jun. 8, 2017

Related U.S. Application Data

(62) Division of application No. 14/569,492, filed on Dec. 12, 2014, now Pat. No. 9,601,609.

(30) Foreign Application Priority Data

Dec. 16, 2013 (JP) .................................. 2013-259064

(51) Int. Cl.
*H01L 29/778* (2006.01)
*H01L 29/40* (2006.01)
(Continued)

(52) U.S. Cl.
CPC ...... *H01L 29/7787* (2013.01); *H01L 21/0274* (2013.01); *H01L 21/3065* (2013.01);
(Continued)

(58) Field of Classification Search
CPC ............ H01L 29/7787; H01L 29/0649; H01L 29/1075; H01L 29/1087; H01L 29/155;
(Continued)

(56) References Cited

U.S. PATENT DOCUMENTS 7,800,097 B2  9/2010 Hirose et al.
8,405,064 B2  3/2013 Yamaguchi et al.
(Continued)

FOREIGN PATENT DOCUMENTS

JP  2006-196869 A  7/2006
JP  2008-288474 A  11/2008
(Continued)

OTHER PUBLICATIONS

Nienhaus et al, "Ionization Energy and Electron Affinity of Clean and Oxidized AlxGa1—xN(0001) Surfaces," Mat. Res. Soc. Symp. Proc. vol. 680E, 2001, pp. E.4.5.1-E.4.5.6.*

(Continued)

*Primary Examiner* — Joseph C Nicely
(74) *Attorney, Agent, or Firm* — McGinn IP Law Group, PLLC.

(57) ABSTRACT

A semiconductor device includes a first nitride semiconductor layer formed over a substrate, a second nitride semiconductor layer formed over the first nitride semiconductor layer, a third nitride semiconductor layer formed over the second nitride semiconductor layer, a fourth nitride semiconductor layer formed over the third nitride semiconductor layer, a trench that penetrates the fourth nitride semiconductor layer and reaches as far as the third nitride semiconductor layer, a gate electrode disposed by way of a gate insulation film in the trench, a first electrode and a second electrode formed respectively over the fourth nitride semi- (Continued)

conductor layer on both sides of the gate electrode, and a coupling portion for coupling the first electrode and the first nitride semiconductor layer.

11 Claims, 42 Drawing Sheets

(51) Int. Cl.
| | |
|---|---|
| H01L 29/417 | (2006.01) |
| H01L 29/423 | (2006.01) |
| H01L 29/66 | (2006.01) |
| H01L 29/06 | (2006.01) |
| H01L 29/15 | (2006.01) |
| H01L 29/201 | (2006.01) |
| H01L 21/027 | (2006.01) |
| H01L 21/3065 | (2006.01) |
| H01L 23/535 | (2006.01) |
| H01L 29/205 | (2006.01) |
| H01L 29/10 | (2006.01) |
| H01L 29/20 | (2006.01) |

(52) U.S. Cl.
CPC ........ *H01L 23/535* (2013.01); *H01L 29/0649* (2013.01); *H01L 29/1075* (2013.01); *H01L 29/1087* (2013.01); *H01L 29/155* (2013.01); *H01L 29/201* (2013.01); *H01L 29/205* (2013.01); *H01L 29/402* (2013.01); *H01L 29/4175* (2013.01); *H01L 29/4236* (2013.01); *H01L 29/66462* (2013.01); *H01L 29/7783* (2013.01); *H01L 29/7786* (2013.01); *H01L 29/1066* (2013.01); *H01L 29/2003* (2013.01); *H01L 29/41758* (2013.01); *H01L 29/42376* (2013.01)

(58) Field of Classification Search
CPC ............. H01L 29/4175; H01L 29/4236; H01L 29/66462; H01L 29/7783; H01L 29/7786
See application file for complete search history.

(56) References Cited

U.S. PATENT DOCUMENTS

| | | | |
|---|---|---|---|
| 8,664,696 B2 | 3/2014 | Yoshioka et al. | |
| 8,907,349 B2 | 12/2014 | Ando et al. | |
| 9,520,489 B2* | 12/2016 | Nakayama | H01L 27/0605 |
| 9,601,609 B2* | 3/2017 | Nakayama | H01L 29/0649 |
| 2009/0166677 A1 | 7/2009 | Shibata | |
| 2011/0227093 A1* | 9/2011 | Hikita | H01L 29/808 257/76 |
| 2011/0272665 A1 | 11/2011 | Yamaguchi | |
| 2011/0272708 A1* | 11/2011 | Yoshioka | H01L 21/28264 257/77 |
| 2012/0025205 A1 | 2/2012 | Nakata et al. | |
| 2013/0087803 A1 | 4/2013 | Kizilyalli et al. | |
| 2013/0193485 A1 | 8/2013 | Akiyama et al. | |
| 2014/0016360 A1* | 1/2014 | Makiyama | H01L 29/778 363/16 |
| 2014/0094223 A1* | 4/2014 | Dasgupta | H01L 29/66462 455/566 |
| 2015/0076508 A1 | 3/2015 | Saito | |
| 2015/0076511 A1 | 3/2015 | Okamoto | |
| 2015/0221757 A1 | 8/2015 | Nakayama | |
| 2015/0221758 A1 | 8/2015 | Miura | |
| 2017/0162683 A1* | 6/2017 | Nakayama | H01L 29/7787 |

FOREIGN PATENT DOCUMENTS

| | | |
|---|---|---|
| JP | 2009-026975 A | 2/2009 |
| JP | 2011-238654 A | 11/2011 |
| JP | 2011-238685 A | 11/2011 |
| JP | 2013-125913 A | 6/2013 |
| JP | 2013-157407 A | 8/2013 |
| JP | 2013-235873 A | 11/2013 |

OTHER PUBLICATIONS

Office Action in U.S. Appl. No. 14/569,492 dated Mar. 4, 2016.
Office Action in U.S. Appl. No. 14/569,492 dated Jul. 13, 2016.
Notice of Allowance in U.S. Appl. No. 14/569,492 dated Sep. 19, 2016.
Notice of Allowance in U.S. Appl. No. 14/569,492 dated Nov. 14, 2016.
European Search report dated May 13, 2015.
European Office Action dated Aug. 3, 2016.
Japanese Office Action, dated Aug. 1, 2017, in Japanese Application No. 2013-259064 and English Translation thereof.
Taiwanese Office Action, dated Nov. 3, 2017 and English Translation thereof.

* cited by examiner

SEMICONDUCTOR DEVICE

The present application is a Divisional Application of U.S. patent application Ser. No. 14/569,492, filed on Dec. 12, 2014, which is based on and claims priority from Japanese Patent Application No. 2013-259064, filed on Dec. 16, 2013, the entire contents of which are incorporated herein by reference.

BACKGROUND

The present invention relates to a semiconductor device, which can be utilized suitably to semiconductor devices using, for example, nitride semiconductors.

In recent years, semiconductor devices using group III-V compounds having a larger band gap than silicon (Si) have attracted attention. Among them, MISFETs using gallium nitride (GaN) have advantages that (1) a breakdown field is large, (2) an electron saturation velocity is high, (3) a thermal conductivity is high, (4) a good hetero-junction can be formed between AlGaN and GaN, and (5) constituent materials are non-toxic and have high safety.

For example, Japanese Unexamined Patent Application Publication No. 2008-288474 discloses an AlGaN/GaN double hetero-junction field effect transistor including a GaN buffer layer containing Fe as an impurity and an AlGaN first barrier layer. Fe in the buffer layer provides a carrier trap effect and increases the energy level in the conduction band of the buffer layer. This suppresses accumulation of carriers to the interface of the buffer layer/first barrier layer to decrease a leak current.

Further, Japanese Unexamined Patent Application Publication No. 2011-238685 discloses a HEMT having a first GaN/AlN super lattice layer in which GaN layers and AlN layers are alternately stacked in pairs and a second GaN/AlN super lattice layer in which GaN layer and AlN layer are alternately stacked in pairs so as to be in contact with the first GaN/AlN super lattice layer.

SUMMARY

The present inventors have been engaged in the research and development of semiconductor devices using the nitride semiconductors as described above and now under earnest study for the improvement of characteristics thereof. In the course of the study, it has been found that there is a still room for the improvement of characteristics of the semiconductor devices using the nitride semiconductors.

Other subjects and novel features of the invention will become apparent in view of the descriptions in the present specification and the appended drawings.

Among preferred embodiments disclosed in the present application, outlines of typical embodiments are to be explained simply as below.

A semiconductor device shown as a preferred embodiment disclosed in the present application has a potential fixing layer, a channel underlayer, a channel layer, and a barrier layer formed above a substrate. Then, the semiconductor device has a gate electrode disposed over the channel layer and a source electrode and a drain electrode formed over the channel layer on both sides of the gate electrode respectively. Then, the potential fixing layer and the source electrode are coupled by a coupling portion inside a through hole that reaches as far as the potential fixing layer.

According to the semiconductor devices shown in the typical embodiments disclosed in the present application, characteristics of the semiconductor devices can be improved.

DETAILED DESCRIPTION

Figure 1:
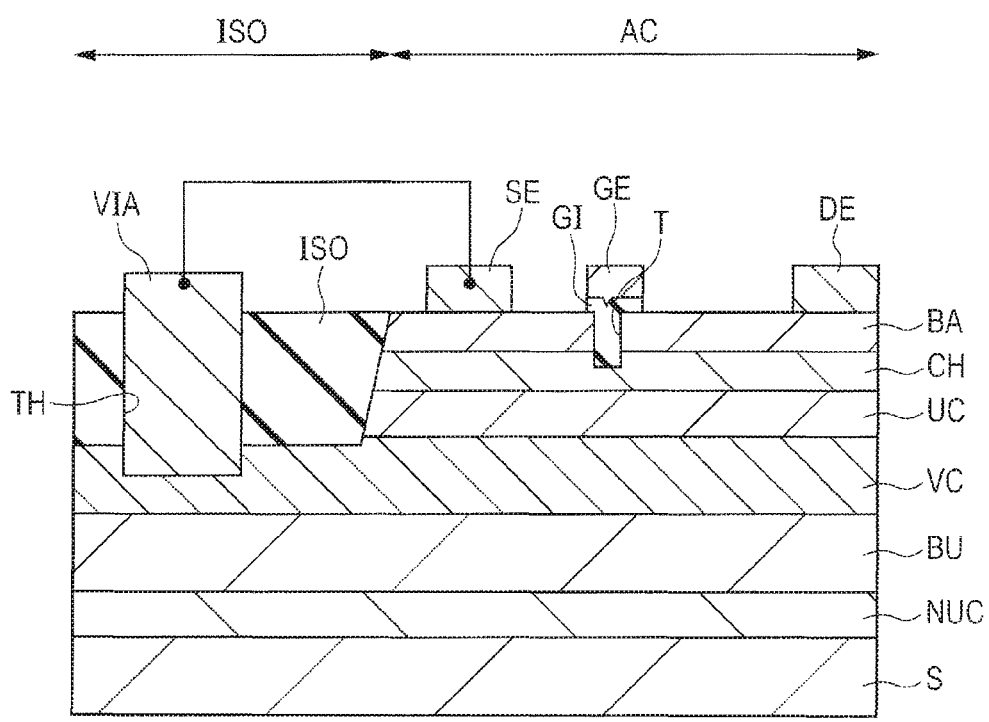
FIG. 1 is a cross sectional view schematically illustrating a configuration of a semiconductor device of a first embodiment.

In the following embodiments, the embodiments may be described in a plurality of divided sections or embodiments if required for the sake of convenience. However, unless otherwise specified, they are not independent of each other, but are in such a relation that one is a modification example, an application example, detailed explanation, supplementary explanation, or the like of a part or the entirety of the other. Further, in the following embodiments, when reference is made to the number of elements or the like (including number of piece, numerical value, quantity, range, or the like), the number of elements is not limited to the specified number, but may be greater than or less than the specified number unless otherwise specified and except the case where the number is apparently limited to the specified number in principle.

Further, in the following embodiments, configurational elements thereof (including element steps, etc.) are not always essential unless otherwise specified and except the case where they are apparently considered essential in principle. Similarly, in the following embodiments, when reference is made to shapes, positional relationships, or the like of the configurational elements or the like, they include ones substantially analogous or similar to the shapes or the like unless otherwise specified and except the case where it is considered that they are apparently not so in principle. This is also applicable to the foregoing number or the like (including number of piece, numerical value, quantity, range, or the like).

Embodiments of the present invention are to be described below in details by reference to the drawings. Throughout the drawings for describing the embodiments, members having the same function are given with same or corresponding reference signs, and duplicate description therefor is omitted. Further, when a plurality of similar members (portions) are present, individual or specified portions are sometimes shown by adding symbols to collective signs. Further, in the following embodiments, description for same or similar portions will not be repeated in principle unless it is particularly required.

Further, in the drawings used for embodiments, hatching may sometimes be omitted even in a cross-sectional view for easy understanding of the drawings. Further hatching may sometimes be attached even in a plane view for easy understanding of the drawings.

Further, in cross sectional views and plan views, the size for each of portions does not correspond to that of an actual device but a specified portion is sometimes depicted relatively larger for easy understanding of the drawings.

First Embodiment

A semiconductor device of this embodiment is to be described specifically with reference to the drawings.

[Explanation for Structure]

FIG. 1 is a cross sectional view schematically illustrating a configuration of the semiconductor device of this embodiment. The semiconductor device (semiconductor element) of this embodiment illustrated in FIG. 1 or the like is a MIS (Metal Insulator Semiconductor) type field effect transistor (FET) using nitride semiconductors. The semiconductor device can be used as a high electron mobility transistor (HEMT) type power transistor. The semiconductor device of this embodiment is a so-called recessed gate type semiconductor device.

In the semiconductor device of this embodiment, a nucleation layer NUC, a buffer layer BU, a potential fixing layer VC, a channel underlayer UC, a channel layer (also referred to as an electron transport layer) CH and a barrier layer BA are formed successively above a substrate S. The nucleation layer NUC comprises a nitride semiconductor. The buffer layer BU comprises one or a plurality of nitride semiconductor with addition of an impurity forming a deep energy level to the nitride semiconductor. In this embodiment, a super lattice structure (also referred to as a super lattice layer) comprising a plurality of nitride semiconductor layers is used. The potential fixing layer VC comprises a nitride semiconductor layer with addition of an impurity which is p-type to the nitride semiconductor and has an electroconductivity. The channel underlayer UC comprises a nitride semiconductor layer having an electron affinity smaller than that of the channel layer CH and an average lattice constant in the direction of a substrate surface smaller than that of the channel layer CH. The channel layer CH comprises a nitride semiconductor layer having an electron affinity larger than that of the channel underlayer UC. The barrier layer BA comprises a nitride semiconductor layer having an electron affinity smaller than that of the channel layer CH and an electron affinity smaller than that of the channel underlayer UC. An insulation film (not illustrated) is formed over the barrier layer BA. A cap layer may also be provided between the insulation film (protective film) and the barrier layer BA. The cap layer comprises a nitride semiconductor layer having an electron affinity larger than that of the barrier layer BA.

The MISFET of this embodiment has a gate electrode GE formed by way of a gate insulation film GI over the channel layer CH, and a source electrode SE and a drain electrode DE formed over the barrier layer BA on both sides of the gate electrode GE. The MISFET is formed in an active region AC defined by a device isolation region ISO. Further, the gate electrode GE penetrates the barrier layer BA and is formed by way of the gate insulation film GI inside a trench T reaching as far as a middle of the channel layer CH.

A 2-dimensional electron gas (2DEG) is formed near the interface between the channel layer CH and the barrier layer BA on the side of the channel layer CH. When a positive voltage (threshold voltage) is applied to the gate electrode GE, a channel is formed near the interface between the gate insulating film GI and the channel layer CH.

The 2-dimensional electron gas (2DEG) is formed by the following mechanism. Nitride semiconductor layers that form the channel layer CH and the barrier layer BA (gallium nitride semiconductor layer in this embodiment) have different electron affinity (forbidden band width (band gap)) respectively and the barrier layer BA comprises a nitride semiconductor layer having an electron affinity smaller than that of the channel layer CH. Accordingly, a well-type potential is formed to the junction face of the semiconductor layers. When electrons are accumulated in the well-type potential, the 2-dimensional electron gas (2DEG) is formed near the interface between the channel layer CH and the barrier layer BA. Particularly, since the channel layer CH and the barrier layer BA are epitaxially formed from a nitride semiconductor materials growing on gallium (or aluminum) face, a positive fixed polarization charge is generated at the interface between the channel layer CH and the barrier layer BA and since electrons are accumulated tending to neutralize positive polarized charges, the 2-dimensional electron gas (2DEG) is tended to be formed more easily.

The 2-dimensional electron gas (2DEG) formed near the interface between the channel layer CH and the barrier layer BA is decoupled by the trench T in which the gate electrode GE is famed. Accordingly, in the semiconductor device of this embodiment, an off state can be maintained in a state where positive voltage (threshold voltage) is not applied to the gate electrode GE and the on-state can be maintained in a state where the positive voltage (threshold voltage) is applied to the gate electrode GE. Thus, a normally off operation can be conducted. In the on-state and the off-state, the potential of the source electrode SE is, for example, at a ground potential.

Further, an electron confining effect is improved by putting the channel layer CH between the barrier layer BA and the channel underlayer UC having the electron affinity smaller than that of the channel layer CH. Thus, a short channel effect can be suppressed, an amplification factor can be enhanced, and an operation speed can be improved. Further, when the channel underlayer UC is strained undergoing a tensile strain, since negative charges due to piezo polarization and spontaneous polarization are induced at the interface between the channel underlayer UC and the channel layer CH, the threshold voltage transfers to the positive side. Thus, the normally off operation property can be improved. Further, when the strain of the channel underlayer UC is relaxed, since negative charges due to the spontaneous polarization are induced to the interface between the channel underlayer UC and the channel layer CH, the threshold voltage transfers to the positive side. Thus, the normally off operation property can be improved.

In this embodiment, a coupling portion (also referred to as a via) VIA that penetrates the device isolation region ISO and reaches as far as the potential fixing layer VC therebelow is provided in a device isolation region ISO and the coupling portion VIA is electrically coupled with the source electrode SE. By providing the potential fixing layer VC which is coupled with the source electrode SE, fluctuation of characteristics such as a threshold voltage and an on-resistance can be reduced as will be described specifically.

Figure 2:
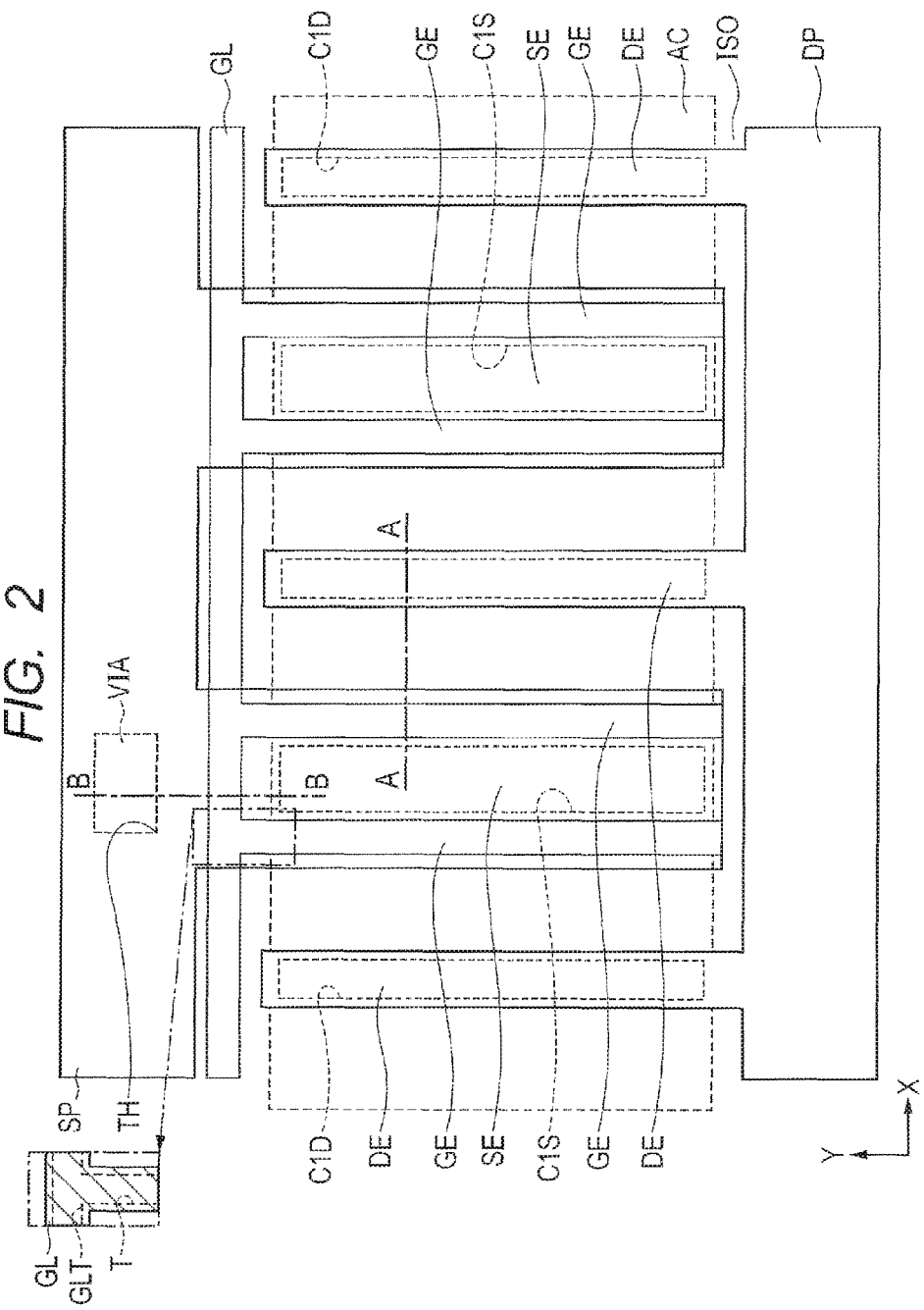
FIG. 2 is a plan view illustrating the configuration of the semiconductor device of the first embodiment.
Figure 3:
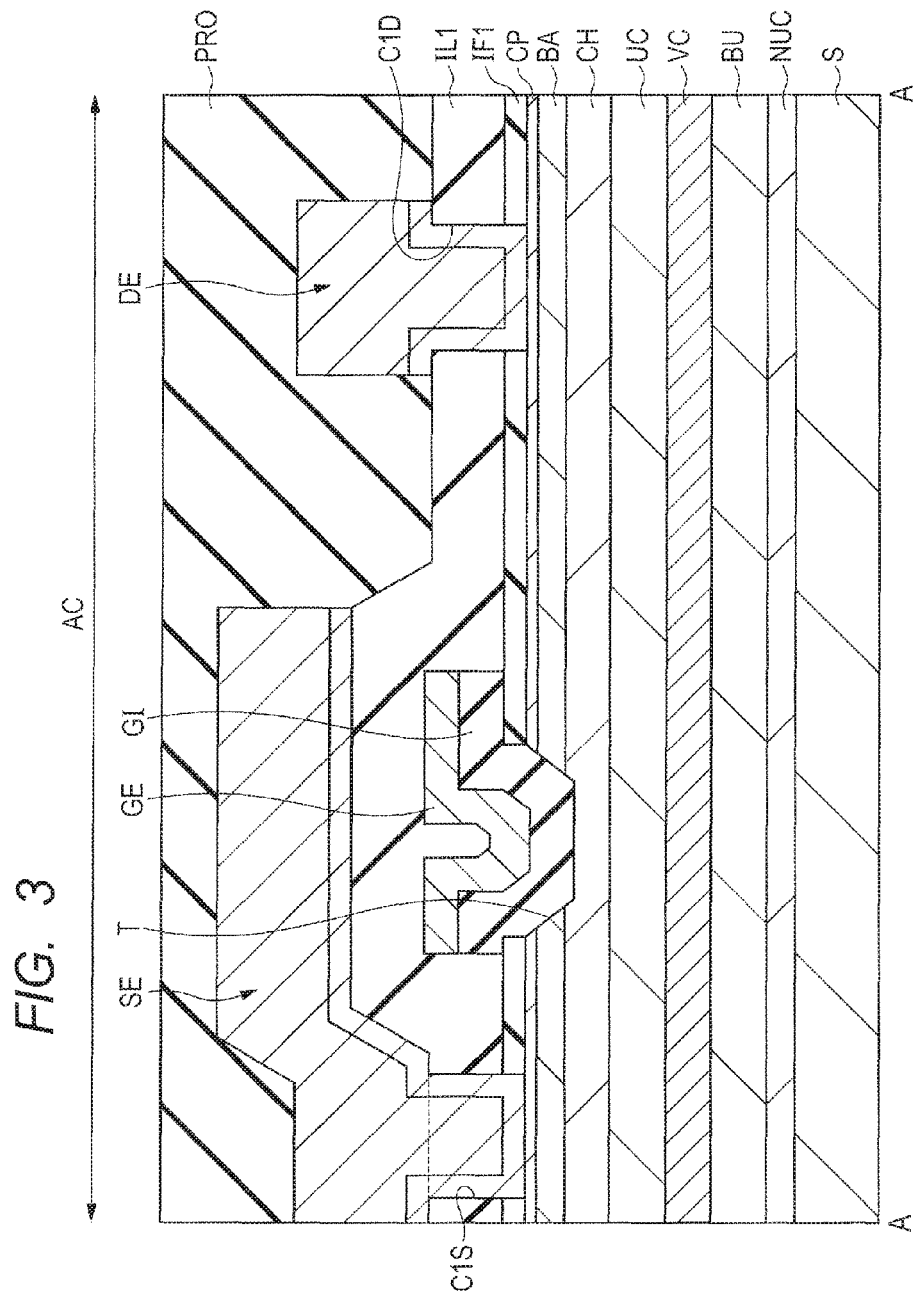
FIG. 3 is a cross sectional view illustrating the configuration of the semiconductor device of the first embodiment.
Figure 4:
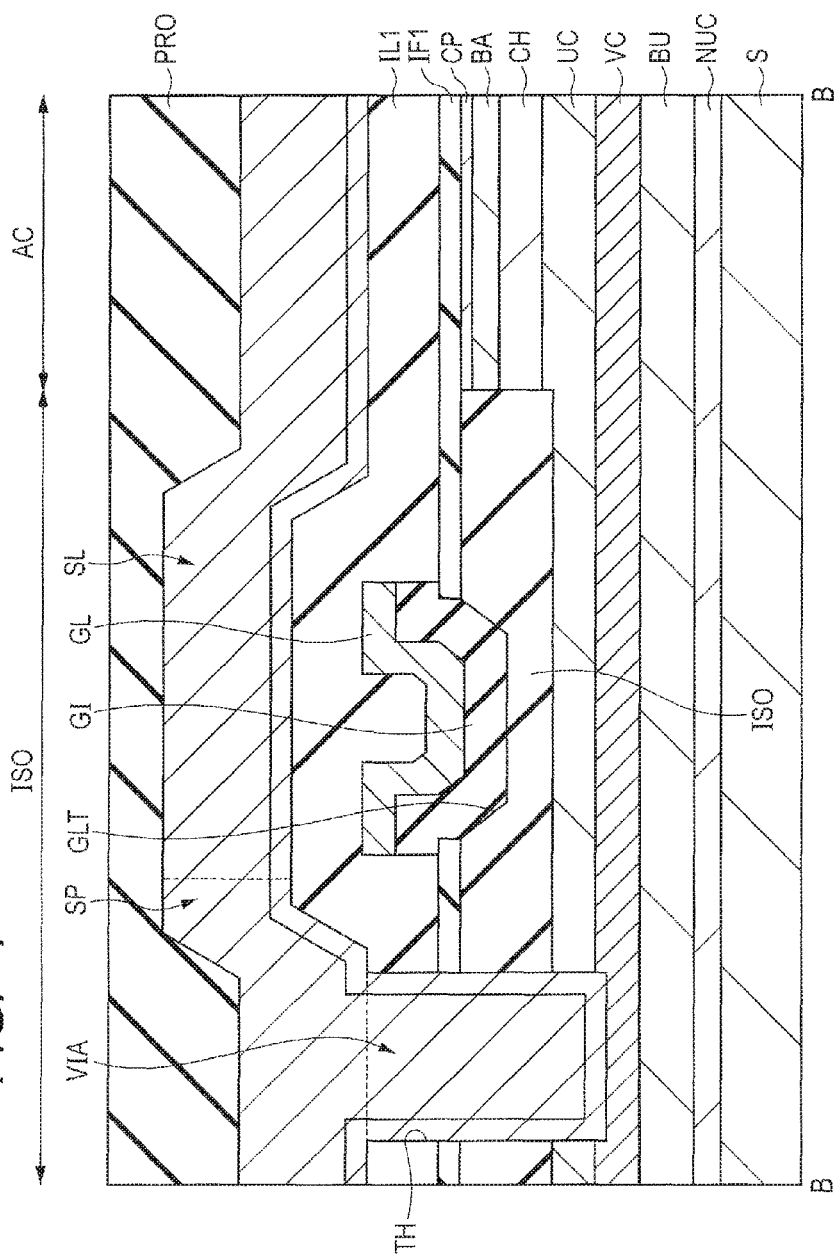
FIG. 4 is a cross sectional view illustrating the configuration of the semiconductor device of the first embodiment.

The semiconductor device of the first embodiment is to be described more in details with reference to FIG. 2 to FIG. 4. FIG. 2 is a plan view illustrating a configuration of the semiconductor device of this embodiment. FIG. 3 and FIG. 4 are cross sectional views illustrating the configuration of the semiconductor device of this embodiment. FIG. 3 corresponds to a cross section A-A in FIG. 2 and FIG. 4 corresponds to a cross section B-B to FIG. 2.

As illustrated in FIG. 2, a planar shape of a drain electrode DE is a rectangular shape having a longer side in the direction Y. A plurality of linear drain electrodes DE are arranged each at a predetermined distance in the direction X. Further, the planar shape of the source electrode SE is a rectangular shape having a longer side in the direction Y. A plurality of linear source electrodes SE are arranged each at a predetermined distance in the direction X. Each of the source electrodes SE and each of the drain electrodes DE are disposed alternately to each other in the direction X.

A contact hole C1D as a coupling portion between the drain electrode DE and the cap CP (barrier layer BA) is disposed below the drain electrode DE. The planar shape of the contact hole C1D is a rectangular shape having a longer side in the direction Y. A contact hole C1S as a coupling portion between the source electrode SE and the cap CP (barrier layer BA) is disposed below the source electrode SE. The planar shape of the contact hole C1S is a rectangular shape having a longer side in the direction Y.

Then, a gate electrode GE is disposed between the contact hole C1D below the drain electrode DE and the contact hole C1S below the source electrode SE. The gate electrode GE is in a rectangular shape having a longer side in the direction Y. Two (paired) gate electrodes GE are disposed below one source electrode SE. The two gate electrodes GE are disposed on both sides of the contact hole C1S below the source electrode SE. As described above, two gate electrodes GE are disposed repetitively to the plurality of source electrodes SE.

The plurality of drain electrodes DE are coupled by a drain pad (also referred to as a terminal portion) DP. The drain pad DP is disposed on one end of the drain electrodes DE (lower side in FIG. 2) so as to extend in the direction X. That is, the drain electrodes DE are disposed so as to protrude in the direction Y from the drain pad DP extending in the direction X. Such a shape is sometimes referred to as a comb shape.

A plurality of source electrodes SE are coupled by a source pad (also referred to as a terminal portion) SP. The source pad SP is disposed on the other end of the source electrodes SE (upper side in FIG. 2) so as to extend in the direction X. That is, the source electrodes SE are disposed so as to protrude in the direction Y from the source pad SP extending in the direction X. Such a shape is sometimes referred to as a comb shape.

A plurality of gate electrodes GE is coupled by a gate line GL. The gate lines GL are disposed so as to extend in the direction X on one side of the gate electrode GE (upper side in FIG. 2). In other words, the gate electrodes GE are disposed so as to extend in the direction Y from the gate line GL extending in the direction X. The gate line GL is coupled, for example, with the gate pad (not illustrated) disposed on both sides (on the right and left in FIG. 2) the direction X of the gate line GL.

The source electrode SE, the drain electrode DE, and the gate electrode GE are disposed mainly over an active region AC surrounded by a device isolation region ISO. The planar shape of the active region AC is a rectangular shape having a longer side in the direction X. On the other hand, the drain pad DP, the gate line GL, and the source pad SP are disposed over the device isolation region ISO. The gate line GL is disposed between the active region AC and the source pad SP.

A through hole (also referred to as an aperture, a hole, or a recess) TH is disposed below the source pad SP. An electroconductive film is filled in the through hole TH to form a coupling portion VIA. As will be described later, the coupling portion VIA is electrically coupled with a potential fixing layer VC. Accordingly, the source electrode SE and the potential fixing layer VC are electrically coupled by way of the source pad SP and the coupling portion VIA.

As illustrated in FIG. 2 and FIG. 3, the MISFET of this embodiment has the gate electrode GE formed over the active region AC of the substrate S, and the source electrode SE and the drain electrode DE famed over the cap layer CP on both sides of the gate electrode GE, in a region forming the contact holes (C1S, C1D). A protective film (also referred to as an insulation film, cover film, surface protective film) PRO is disposed over the source electrode SE and the drain electrode DE.

As described shove, the nucleation layer NUC, the buffer layer BU, the potential fixing layer VC, the channel underlayer UC, the channel layer (also referred to as an electron transport layer) CH, the buffer layer BA, the cap layer CP and the insulation film IF1 are formed successively above the substrate S. Then, the gate electrode GE is formed by way of the gate insulation film GI inside the trench T that penetrates the insulation film IF1, the cap layer CP, and the barrier layer BA, and reaches as far as the middle of the channel CH.

A semiconductor substrate, for example, comprising silicon (Si) can be used as the substrate S. In addition to the silicon, a substrate comprising a nitride semiconductor such as GaN, or a substrate comprising such as AlN, SiC, or sapphire may also be used as the substrate S. Among all, when a nitride semiconductor layer such as a GaN layer is formed over the silicon substrate, a buffer layer BU is often used as will be described later for improving the crystallinity and relaxing the strain (internal stress) of the substrate. Accordingly, since accumulation of charges to be described later tend to be generated, use of the semiconductor device of this embodiment is effective when the silicon substrate and the nitride semiconductor are used together.

The nucleation layer NUC is formed for forming crystal nuclei upon growing a layer to be formed over the buffer layer BU, etc. The nucleation layer NUC is formed also for preventing constituent elements (for example, Ga) of the layer formed above from diffusing thereby deteriorating the substrate S. For example, an aluminum nitride (AlN) layer can be used as the nucleation layer NUC. The thickness of the AlN layer is about 200 nm. The material and the thickness of the nucleation layer NUC can be selected properly according to the material of the substrate S or the application use of the semiconductor device. The nucleation layer NUC can be saved in a case where a GaN substrate or the like is used as the substrate S, or in a case where the nucleation layer is not necessary depending on the deposition condition of the buffer layer, etc.

The buffer layer BU is formed for controlling the lattice constant, enhancing the crystallinity of the nitride semiconductors formed above and relaxing the film stress of the stacked nitride semiconductors. This improves the crystallinity of the nitride semiconductors. Further, strain (internal stress) of the substrate S can be relaxed to suppress generation of wasp or crack in the substrate S. As the buffer layer BU, a super lattice structure comprising a stacked film (AlN/GaN film) of a gallium nitride (GaN) layer and an aluminum nitride (AlN) layer stacked by a plurality of periods can be used. The super lattice structure is formed by disposing two or more stacks of nitride semiconductors having different electron affinity. The super lattice structure is doped with carbon (C). A super lattice structure, for example, comprising a GaN layer of about 20 nm thickness and an AlN layer of about 5 nm thickness which are stacked by 80 periods can be used. The concentration of carbon (doping amount) is, for example, about $1 \times 10^{19}$ (1E19) cm$^{-3}$. The material and the thickness of each of the films configuring the stacked film may be selected properly in accordance with the application use of the semiconductor device. Other layer than the super lattice structure may also be incorporated as the buffer layer BU. For example, other material film may also be formed over the super lattice structure. For example, a mono-layer film not including the super lattice structure can also be used as the buffer layer BU.

As the material for the super lattice structure and the mono-layer film described above, InN can also be used in addition to AlN and GaN. Further, mixed crystals of the nitride semiconductors may also be used. For example, AlGaN/GaN film can be used in addition to the AlN/GaN film as the stacked film of the structure. For example, an AlGaN layer or an InAlN layer can be used as the mono layer film.

While the super lattice structure is doped (added) with carbon, other doping impurity may also be used. As the doping impurity, elements forming deep energy level are preferred and transition metals such as iron (Fe), magnesium (Mg), beryllium (Be), etc. may also be used in addition to carbon. The doping amount and the impurity element may be selected property in accordance with the application use of the semiconductor device.

As the potential fixing layer VC, an impurity-doped GaN layer can be used, for example. In addition to the GaN layer, an AlN layer or an InN layer may also be used. Further, mixed crystals of such nitride semiconductors may also be used.

The potential fixing layer VC is doped with an impurity and has an electroconductivity. For example, a GaN layer doped with Mg at about $5\times10^{18}$ (5E18) $cm^{-3}$ as the impurity can be used for the potential fixing layer. The thickness of the potential fixing layer VC is about 200 nm.

As described above, it is necessary to dope the impurity about by an amount of providing the electroconductivity (for example, $5\times10^{16}$ (5E16) $cm^{-3}$ or more of doping amount as the concentration of activated impurity in the layer structure of this embodiment). As the doping impurity, n-type impurity or p-type impurity can be used. The n-type impurity includes, for example, Si, sulfur (S), and selenium (Se), and the p-type impurity includes, for example, Be, C, and Mg. Further, in view of the breakdown voltage in the longitudinal direction, the doping amount of the impurity is preferably at $1\times10^{18}$ (1E18) $cm^{-3}$ or less as the concentration of the activated impurity. For example, the doping amount is preferably $5\times10^{17}$ (5E17) $cm^{-3}$ or less as the concentration of activated impurity for ensuring breakdown voltage of 500 V or higher in the layer structure of this embodiment.

For example, an AlGaN layer can be used as the channel underlayer UC. Impurity doping is not applied intentionally in the channel underlayer UC. If a deep energy level is formed by the impurity doping, this causes fluctuation in the characteristics such as threshold voltage as will be described in details. Accordingly, the doping amount of impurity is preferably $1\times10^{16}$ (1E16) $cm^{-3}$ or less.

The thickness of the AlGaN layer is, for example, about 1000 nm and the Al composition is about 3%. As the channel underlayer UC, an InAlN layer, etc. can be used in addition to the AlGaN layer.

In this embodiment, in-plane lattice constant of the channel underlayer UC is succeeded to the channel layer CH and the barrier layer BA in the upper layers by epitaxial growing. When a layer having a lattice constant larger than that of the channel underlayer (AlGaN layer) UC, for example, a GaN layer, $In_xGa_{(1-x)}N$ layer ($0 \leq X \leq 1$), InAlN layer, etc. are formed in the layers above the channel underlayer UC, compressive strain applies on the upper layers. Conversely, when layers having a lattice constant smaller than that of the channel underlayer (AlGaN layer) UC, for example, an InAlN layer having a high Al compositional ratio is formed in the layer above the channel underlayer UC, tensile strain applies on the upper layers.

For example, a GaN layer can be used as the channel layer CH. Impurity doping is not applied intentionally in the channel layer CH. The thickness of the GaN layer is, for example, about 80 nm. As the material for the channel layer CH, AlN, InN, etc. can be used in addition to GaN. Further, mixed crystals of the nitride semiconductors may also be used. The material and the thickness of the channel layer CH can be properly selected in accordance with the application use of the semiconductor device. In this embodiment, while the non-doped channel layer CH is used, other imparities may also be used appropriately for the doping in accordance with the application use. As the doping impurity, an n-type impurity or a p-type impurity can be used. The n-type impurity include, for example, Si, S, and Se, and the p-type impurity includes, for example, Be, C, and Mg.

However, since the channel layer CH is a layer in which electrons are transported, if the doping amount of impurity is excessive, mobility may possibly be lowered due to coulomb scattering. Then, the doping amount of the impurity to the channel layer CH is preferably $1\times10^{17}$ (1E17) $cm^{-3}$ or less.

Further, for the channel layer CH, it is necessary to use a nitride semiconductor having an electron affinity larger than that of the channel underlayer UC or the barrier layer BA. As described above, when the AlGaN layer is used for the channel underlayer UC and the GaN layer is used for the channel layer CH and the lattice constants of the layers are different, it is necessary that the thickness of the channel layer CH is at or less than the critical film thickness where dislocation increases.

For example, an $Al_{0.2}Ga_{0.8}N$ layer can be used as the barrier layer BA. The thickness of the $Al_{0.2}Ga_{0.8}N$ layer is, for example, about 30 nm. As the material of the barrier layer BA, an InAlN layer or the like can be used in addition to the AlGaN layer. An Al compositional ratio, etc. may also be adjusted properly. Further, a barrier layer BA of a multi-layer structure formed by stacking films of different Al compositional ratios may also be used. Further, a GaN layer, an AlN layer, an InN layer, etc. can be used as the material for the barrier layer BA. Further, mixed crystals of such nitride semiconductors may also be used. The material, the thickness, etc. of the barrier layer BA can be properly selected in accordance with the application use of the semiconductor device. As the barrier layer BA, a non-doped layer may also be used, or an impurity may be doped properly in accordance with the application use. As the doping impurity, an n-type impurity or a p-type impurity can be used. The n-type impurity includes, for example, Si, S, and Se and the p-type impurity includes, for example, Be, C, and Mg. However, if the amount of the doping impurity in the barrier layer BA is excessive, the effect of the potential of the drain electrode DE tends to exert on the vicinity of the gate electrode GE to be described later to possibly lower the breakdown voltage. Further, since the impurity in the barrier layer BA may possibly cause coulomb scattering in the channel layer CH, the electron mobility may possibly be lowered. Then, the doping amount of the impurity in the barrier layer BA is preferably $1\times10^{17}$ (1E17) $cm^{-3}$ or less. It is more preferred to use a non-doped barrier layer BA.

Further, in a case of using the GaN layer as the channel layer CH and using the AlGaN layer as the barrier layer BA, and where the lattice constants of the layers are different, it is necessary to restrict the thickness of the barrier layer BA at or less than the critical thickness where dislocation increases.

Further, as has been described above, it is necessary to use a nitride semiconductor having an electron affinity smaller than that of the channel layer CH as the barrier layer BA. However, in a case of using a barrier layer BA of a multi-layer structure, a layer having an electron affinity larger than that of the channel layer CH may include in the multiple layers and it may suffice that at least one layer has an electron affinity smaller than that of the channel layer CH.

As the cap layer CP, a GaN layer can be used for example. The thickness of the GaN layer is, for example, about 2 nm. Further, in addition to GaN, an AlN layer, InN layer, etc. may be used as the cap layer CP. Further, mixed crystals of such nitride semiconductors (for example, AlGaN, and InAlN) may also be used. Further, the cap layer CP may be omitted.

For the cap layer CP, it is necessary to use a nitride semiconductor having an electron affinity larger than that of the barrier layer BA. Further, a non-doped layer may be used as the cap layer CP, or an appropriate impurity may also be doped in accordance with the application use. As the doping impurity, an n-type impurity or a p-type impurity can be used. The n-type impurity includes, for example, Si, S, and Se, and the p-type impurity includes, for example, Be, C, and Mg.

In a case of using an AlGaN layer as the channel underlayer UC and using a GaN layer as the cap layer CP, and lattice constants of the layers are different, it is necessary to restrict the thickness of the cap layer CP at or less than the critical thickness where the dislocation increases.

For example, a silicon nitride film can be used as the insulation film IF1. The thickness of the silicon nitride film is for example, about 100 nm. Further, other insulation films than the silicon nitride film may also be used. Further, a stacked structure comprising several kinds of insulation films may also be used. The material and the thickness of the insulation film IF1 can be properly selected in accordance with the application use of the semiconductor device. As the insulation film IF1, a film having a larger band gap and a smaller electron affinity than the nitride semiconductors in the lower layers is preferred. The film that can satisfy such conditions include, in addition to silicon nitride film (SiN), a silicon oxide film ($SiO_2$) film, a silicon oxynitride film, a silicon oxycarbide (SiOC) film, an aluminum oxide ($Al_2O_3$, alumina) film, a hafnium oxide ($HfO_2$) film, a zirconium oxide ($ZrO_2$) film, etc. Various kinds of organic films also satisfy the conditions described above. For suppressing current collapse, it is preferred to select, among them, a film having a low energy level density which is formed at the interface with the nitride semiconductor in the lower layer.

The gate electrode GE is formed by way of a gate insulation film GI inside a groove (also referred to as a trench or a recess) T that is engraved passing through the insulation film IF1, the cap layer CP, and the barrier BA as far as the middle of the channel layer CH.

As the gate insulation film GI, an aluminum oxide ($Al_2O_3$) film can be used. The thickness of the aluminum oxide film is, for example, about 50 nm. As the gate insulation film GI, other insulation films than the aluminum oxide film may also be used. A stacked structure of several kinds of insulation films may also be used. The material and the thickness of the gate insulation film GI can be selected optionally in accordance with the application use of the semiconductor device. As the gate insulation film GI, a film having a larger band gap and a smaller electron affinity than the nitride semiconductors in the lower layers is preferred. The film satisfying such conditions includes, for example, an aluminum oxide film and, in addition, a silicon oxide ($SiO_2$) film, a silicon nitride film (SiN), a hafnium oxide ($HfO_2$) film, and a zirconium oxide ($ZrO_2$) film. Since the gate insulation film GI may give an influence on a voltage applicable to the gate electrode GI and a threshold voltage, the gate insulation film GI is preferably determined while considering the dielectric breakdown voltage, dielectric constant, and film thickness.

As the gate electrode GE, titanium nitride (TiN) film can be used. The thickness of the titanium nitride film is, for example, about 200 nm. As the gate electrode GE, other conductive films than the titanium nitride film can also be used. For example, a polycrystal silicon film doped with an impurity such as boron (B) or phosphorus (P) may also be used. A metal film comprising Ti, Al, Ni, or Au may also be used. Further, a film of a metal compound comprising, for example, Ti, Al, Ni, and Au and Si (metal silicide film) may also be used. Further, a film of a metal nitride comprising, for example, Ti, Al, Ni, and Au may also be used. A stacked structure of a plurality of kinds of conductive films may also be used. The material and the thickness of the gate electrode GE can be selected optionally in accordance with the application use of the semiconductor device.

For the gate electrode GE, a material which is hard to be reactive with films in the lower layers (for example, the gate insulation film GI) or films in the upper layers (for example, an interlayer insulation film IL1) is selected preferably.

An interlayer insulation film IL1 is disposed over the gate electrode GE. The interlayer insulation film IL1 has a through hole TH and contact holes C1S and C1D.

For example, a silicon nitride film can be used as the interlayer insulation film IL1. The thickness of the silicon oxide film is, for example, about 2000 nm. Other insulation films than the silicon oxide film may also be used. Further, a stacked structure comprising a plurality of kinds of insulation films may also be used. The material and the thickness of the interlayer insulation film IL1 can be selected optionally in accordance with the application use of the semiconductor device. For the interlayer insulation film IL1, those films having a larger band gap and a smaller electron affinity of the nitride semiconductors in the lower layers are preferred. Further, as the interlayer insulation film IL1, materials less reactive with the gate electrode GE which is to be in contact therewith are selected preferably. Films capable of satisfying such conditions include, in addition to the silicon oxide film, a silicon nitride film, a silicon oxynitride film, an aluminum oxide ($Al_2O_3$) film, a hafnium oxide ($HfO_2$) film, a zirconium oxide ($ZrO_2$) film, etc.

A conductive film is formed over the interlayer insulation film IL1 including the through hole TH and the contact holes C1S and C1D. In this embodiment, a stacked film of a TiN film and an Al film is formed. In the stacked film, the stacked film in the contact holes C1S and C1D forms the source electrode SE or the drain electrode DE. On the other hand, the stacked film in the through hole TH forms the coupling portion VIA.

As the source electrode SE and the drain electrode DE, a stacked film comprising a TiN film and an Al film thereover can be used. The thickness of the TiN film is, for example, about 50 nm and the thickness of the Al film is, for example, about 1000 nm. As the material for the source electrode SE and the drain electrode DE, any material that can be in ohmic contact with the nitride semiconductor layer (cap layer CP) at the bottom of the contact holes (C1S, C1D) may be used. Particularly, when an n-type impurity is doped in the nitride semiconductor layer (cap layer CP) at the bottom of the contact hole (C1S, C1D) or in the nitride semiconductor layer in the layers below the cap layer CP, they tend to be in ohmic contact. Accordingly, materials for the source electrode SE and the drain electrode DE can be selected from a wide variety of groups. Further, as the material faulting the source electrode SE and the drain electrode DE, materials less reactive with the interlayer insulation film IL1 which is to be in contact therewith are selected preferably. As the material forming the source electrode SE and the drain electrode DE, metal films comprising, for example, Ti, Al, Mo (molybdenum), Nb (niobium), V (vanadium), etc. may also be used. Further, mixtures (alloys) of such metals, or a film of compounds of such metals and Si (metal silicide film), or nitride of such metals can be used. Further, a stacked film of such materials may also be used.

As the coupling portion VIA, a stacked film of a TiN film and an Al film thereover can be used in the same manner as the source electrode SE and the drain electrode DE described above. The thickness of the TiN film is, for example, about 50 nm and the thickness of the Al film is, for example, about 1000 nm. As the material forming the coupling portion VIA, any material that can be in ohmic contact with the nitride semiconductor layer (potential fixing layer VC) at the bottom of the through hole TH can be used. Further, as the material forming the coupling portion VIA, a material less reactive with the interlayer insulation film IL1 in contact therewith is selected preferably.

For example, when the potential fixing layer VC contains a p-type impurity, a metal film comprising, for example, Ti, Ni, Pt (platinum), Rh (rhodium), Pd (palladium), Ir (iridium), Cu (copper), and Ag (silver), a film comprising mixtures (alloys) of such metals, a film comprising the compound of such metal and Si (metal silicide film), or a nitride of such metal is used preferably as the material forming the coupling portion VIA. Further, a stacked film of such materials may also be used.

When the potential fixing layer VC contains an n-type impurity, a film comprising metal, for example, Ti, Al, Mo (molybdenum), Nb (niobium), or V (vanadium), a film comprising a mixture (alloy) of such metals, a film comprising a compound of such metal (metal silicide film), or a film comprising a nitride of such metal is used preferably as the material forming the coupling portion VIA. Further, a stacked film of such materials may also be used.

Further, in this embodiment, while the bottom of the through hole TH is situated in the middle of the potential fixing layer VC and the coupling portion VIA is disposed inside the through hole TH, it may suffice that the coupling portion VIA is disposed so as to be in contact with the potential fixing layer VC. For example, it may be configured such that the bottom of the through hole TH is situated to the upper surface of the potential fixing layer VC and the bottom of the coupling portion VIA is in contact with the potential fixing layer VC. Further, it may be configured such that the bottom of the through hole TH is situated below the bottom of the potential fixing layer VC and a portion of the lateral side of the coupling portion VIA is in contact with the potential fixing layer VC. For example, the bottom of the through hole TH may be situated at the surface of the buffer layer BU or in the middle of the buffer layer BU. The bottom layer of the through hole TH may be situated at the surface of the nucleation layer NUC or in the middle of the nucleation layer NUC. Further, the bottom of the through hole TH may be situated at the surface of the substrate S or in the middle of the substrate S. However, since the area of contact may possibly be decreased in the contact between the portion of the lateral surface of the coupling portion VIA and the potential fixing layer VC, the bottom of the through hole TH is preferably situated in a range from a portion below the upper surface of the potential fixing layer VC to a portion above the lower surface of the potential fixing layer VC.

As described above, the source pad SP and the drain pad DP are formed integrally with the source electrode SE and the drain electrode DE respectively. Accordingly, the source pad SP and the drain pad DP are formed of materials identical with those of the source electrode SE and the drain electrode DE. The coupling portion VIA is disposed below the source pad SP (FIG. 4).

An insulation film, for example, a silicon oxynitride (SiON) film can be used as the protective film PRO.

[Description of Manufacturing Method]

Then, a method of manufacturing the semiconductor device of this embodiment is to be described, and the configuration of the semiconductor device is made clearer with reference to FIG. 5 to FIG. 22. FIG. 5 to FIG. 22 are cross sectional views or plan views illustrating steps of manufacturing the semiconductor device of this embodiment.

Figure 5:
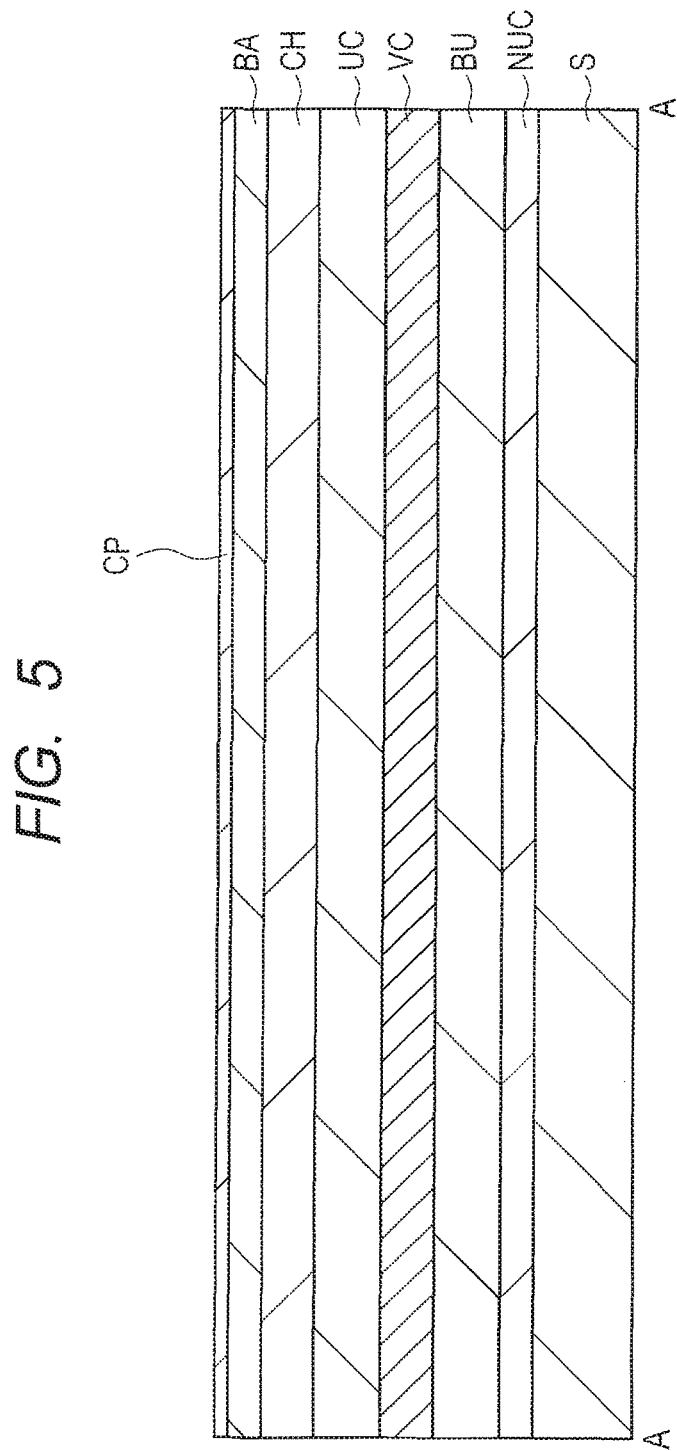
FIG. 5 is a cross sectional view illustrating a manufacturing step of the semiconductor device according to the first embodiment.

As illustrated in FIG. 5, a nucleation layer NUC and a buffer layer BU are formed successively above a substrate S. As the substrate S, a semiconductor substrate comprising, for example, silicon (Si) exposed at the (111) plane is used, over which, a nucleation layer NUC, for example, an aluminum nitride (AlN) layer is epitaxially grown to a thickness of about 200 nm by using, for example, a metal organic chemical vapor deposition (MOCVD) method.

As the substrate S, a substrate comprising SiC or sapphire in addition to silicon may also be used. Usually, all of nitride semiconductor layers (group III-V compound semiconductor layers) of the nucleation layer NUC layers and layers after the nucleation layer NUC are formed by growing on a group III element face (that is, growing on gallium face or growing on aluminum face in this embodiment).

Further, a super lattice structure formed by repetitively stacking a stacked film (AlN/GaN film) comprising a gallium nitride (GaN) layer and an aluminum nitride (AlN) layer is formed as a buffer layer BU over the nucleation layer NUC. For example, a gallium nitride (GaN) layer of about 20 nm thickness and an aluminum nitride (AlN) layer of about 5 nm thickness are heteroepitaxially grown alternately by using, for example, a metal organic chemical vapor deposition method. The stacked films are formed, for example, by 40 layers. When the stacked film is grown, the film may be grown while being doped with carbon (C). For example, carbon doping is conducted such that the concentration of carbon in the stacked film is about $1 \times 10^{19}$ (1E19) cm$^{-3}$.

Further, an AlGaN layer may be heteroepitaxially grown over the buffer layer BU as a portion of the buffer layer BU by using, for example, the metal organic chemical vapor deposition method.

Then, for example, a gallium nitride layer containing a p-type impurity (p-GaN layer) is heteroepitaxially grown as a potential fixing layer VC over the buffer layer BU by using, for example, the metal organic chemical vapor deposition method. The gallium nitride layer is deposited to about 200 nm while being doped, for example, with magnesium (Mg) as a p-type impurity. The concentration of Mg in the stacked film is, for example, about $5 \times 10^{18}$ (5E18) cm$^{-3}$.

Then, a channel underlayer UC is formed over the potential fixing layer VC. For example, an AlGaN layer is heteroepitaxially growing as the channel underlayer UC over the potential fixing layer VC by using, for example, the metal organic chemical vapor deposition method. In this case, the channel underlayer is grown without being intentionally doped with the impurity. The thickness is, for example, about 1000 nm and the Al composition is about 3%.

Then, a channel layer CH is formed over the channel underlayer UC. For example, a gallium nitride layer (GaN layer) is heteroepitaxially grown over the channel underlayer UC by using, for example, the metal organic chemical vapor deposition method. In this case, the channel layer CH is grown without being intentionally doped with an impurity. The thickness of the channel layer CH is, for example about 80 nm.

Then, for example, an AlGaN layer is heteroepitaxially grown as the barrier layer BA over the channel layer CH by using, for example, the metal organic chemical vapor deposition method. For example, an $Al_{0.2}Ga_{0.8}N$ layer is formed at an Al compositional ratio of 0.2 and a Ga compositional ratio of 0.8. The compositional ratio of Al in the AlGaN layer of the barrier layer BA is made larger than the compositional ratio of Al in the AlGaN layer of the buffer layer BU described above.

Thus, a stack of the channel underlayer UC, the channel layer CH, and the barrier layer BA is formed. In the stack, a 2-dimensional electron gas (2DEG) is formed near the interface between the channel layer CH and the barrier layer BA.

Then, a cap layer CP is formed over the barrier layer BA. For example, a gallium nitride layer (GaN layer) is heteroepitaxially grown over the barrier layer BA by using, for example, the metal organic chemical vapor deposition method. The cap layer is grown without being intentionally doped with an impurity. The thickness of the cap layer CP is about 2 nm.

Figure 6:
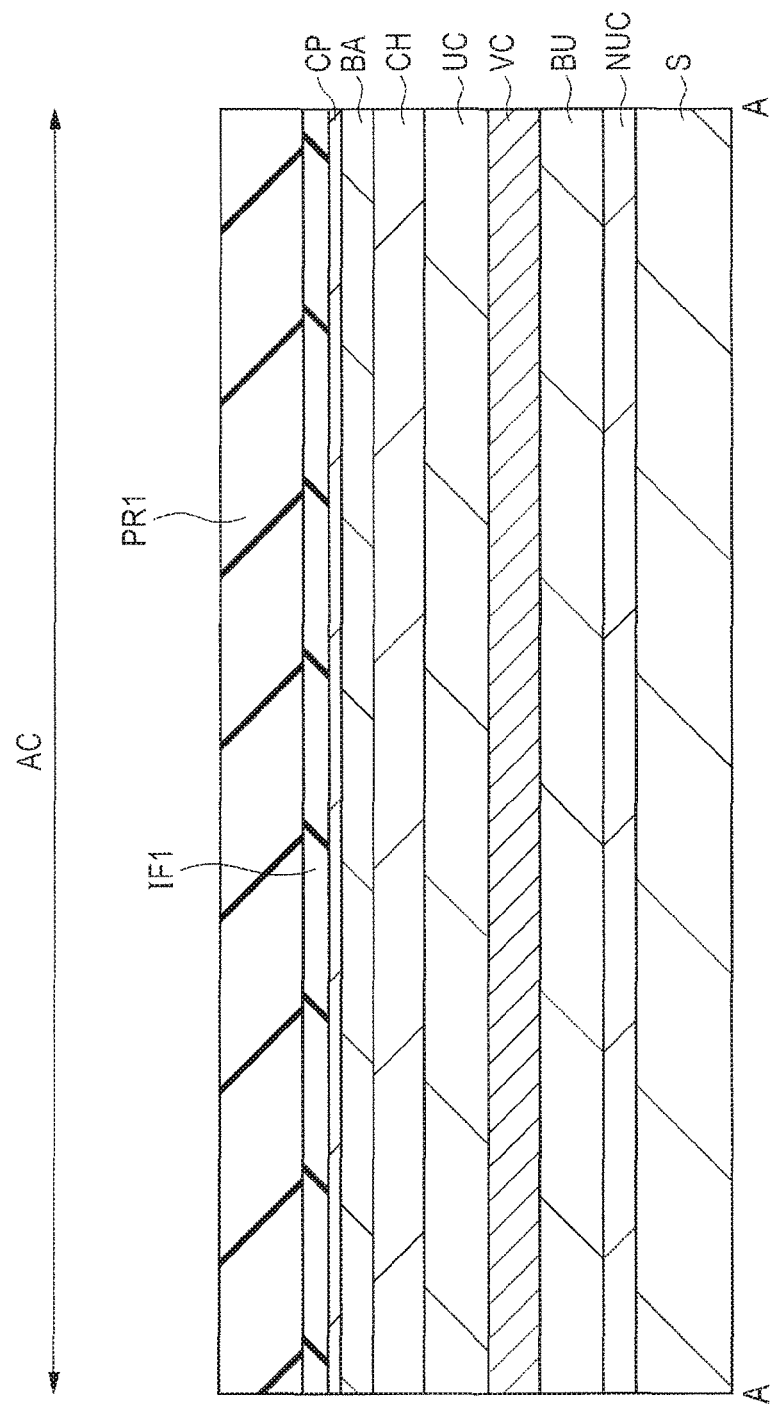
FIG. 6 is a cross sectional view illustrating a manufacturing step of the semiconductor device according to the first embodiment, which is a cross sectional view illustrating a manufacturing step succeeding to FIG. 5.
Figure 7:
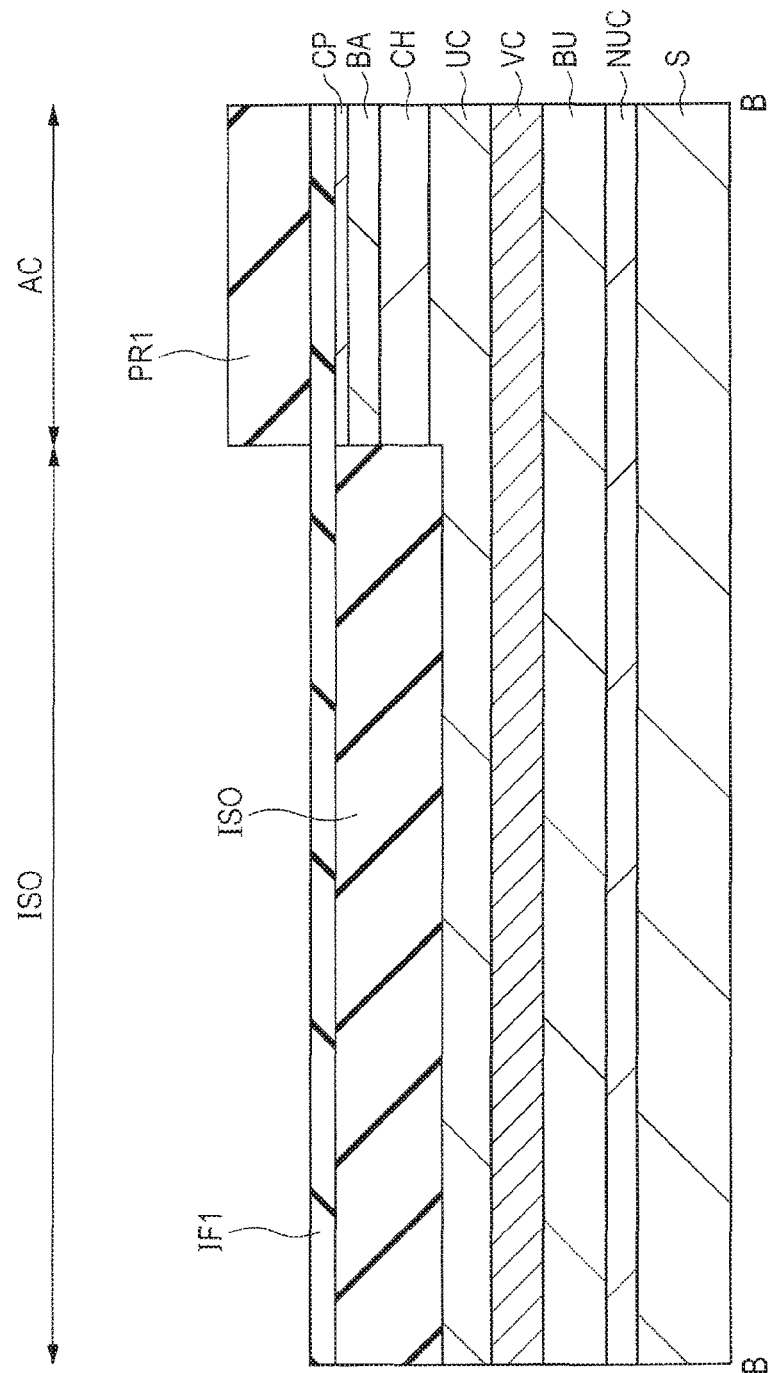
FIG. 7 is a cross sectional view illustrating a manufacturing step of the semiconductor device according to the first embodiment.

Then, as illustrated in FIG. 6 and FIG. 7, a silicon nitride film is deposited to a thickness of about 100 nm as an insulation film IF1 over the cap layer CP by using, for example, a plasma-enhanced chemical vapor deposition (PECVD) method.

Then, a photoresist film PR1 in which a device isolation region is opened is formed over the insulation film IF1 by photolithography. Then, a device isolation region ISO is formed by implanting nitrogen ions using the photoresist film PR1 as a mask. When ion species such as nitrogen (N) or boron (B) are implanted, state of crystals is changed into a high resistance state.

Figure 8:
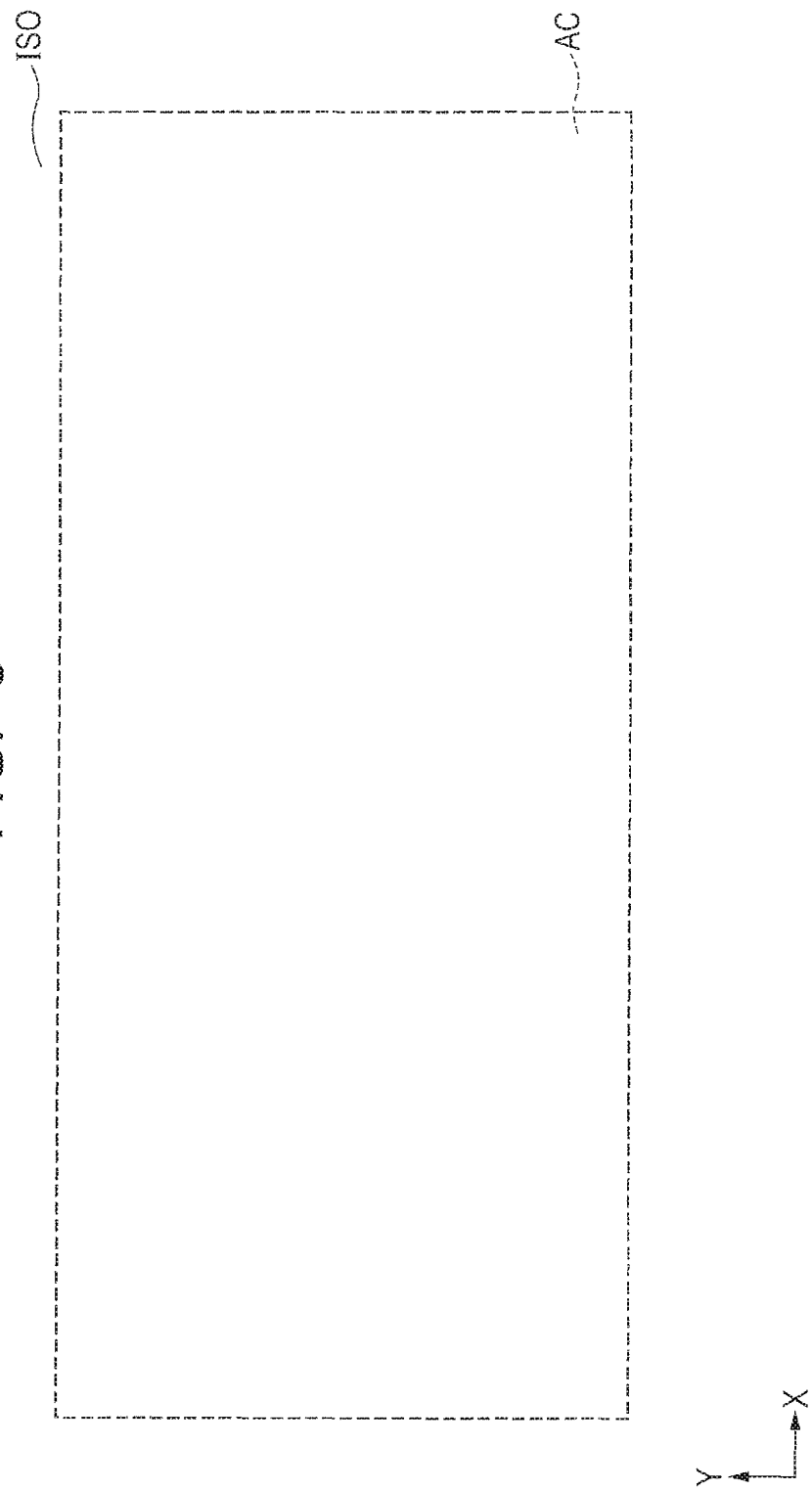
FIG. 8 is a plan view illustrating a manufacturing step of the semiconductor device according to the first embodiment.

For example, nitrogen ions are implanted at a density of about $5 \times 10^{14}$ (5E14) $cm^{-2}$ into the stack comprising the channel underlayer UC, the channel layer CH, and the barrier layer BA by way of the insulation film IF1. The implantation energy is, for example, 120 KeV. The implantation conditions of the nitrogen ions is controlled such that the implantation depth, that is, the bottom of the device isolation region ISO is situated below the bottom of the channel layer CH and situated above the bottom of the potential fixing layer VC. The bottom of the device isolation region ISO is situated above the bottom of a through hole TH (coupling portion VIA) to be described later. Thus, the device isolation region ISO is formed. The region surrounded by the device isolation region ISO is an active region AC. As illustrated in FIG. 8, the active region AC is, for example, in a substantially rectangular shape having a longer side in the direction X. Then, the photoresist film PR1 is removed, for example, by a plasma defoliating treatment.

Figure 9:
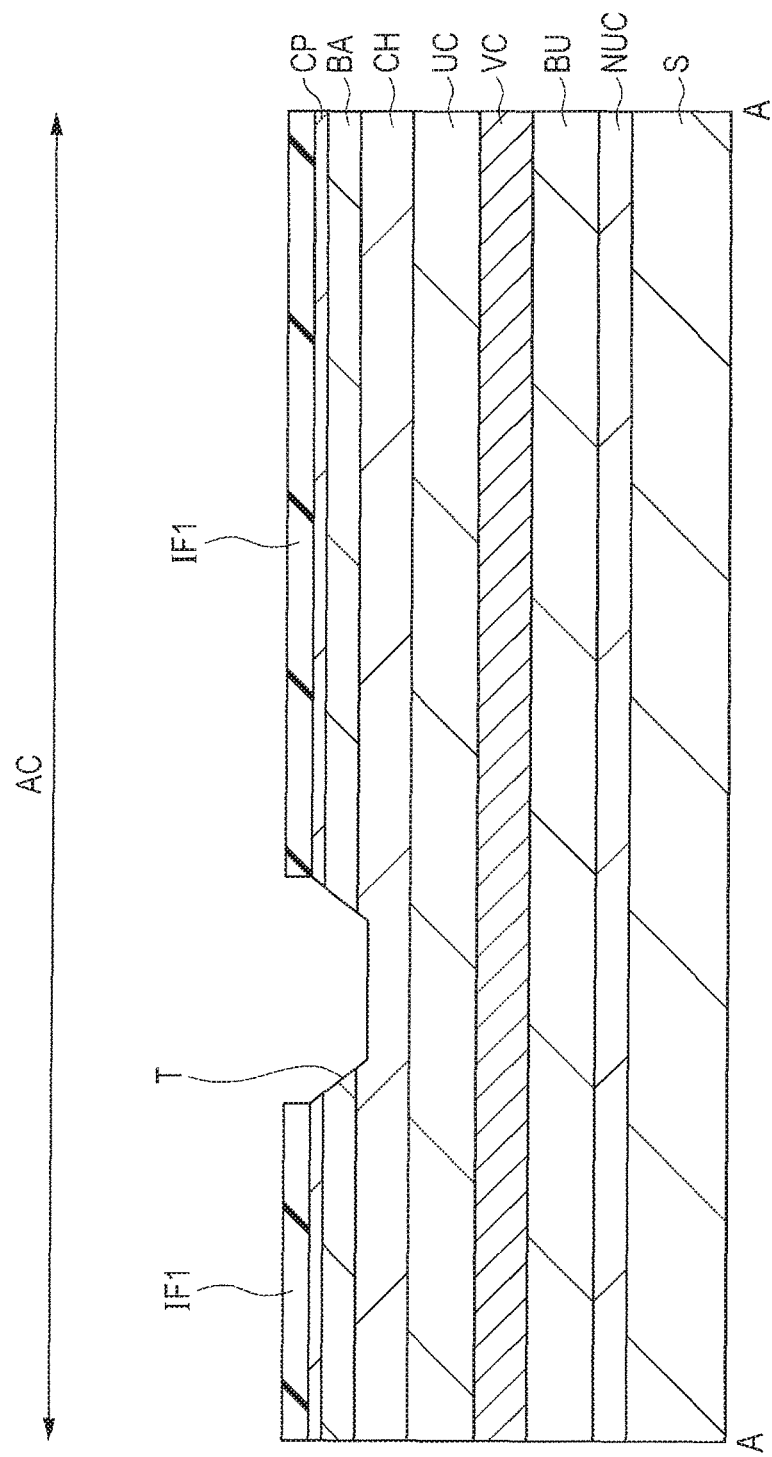
FIG. 9 is a cross sectional view illustrating a manufacturing step of the semiconductor device according to the first embodiment, which is a cross sectional view illustrating a manufacturing step succeeding to FIG. 6.
Figure 10:
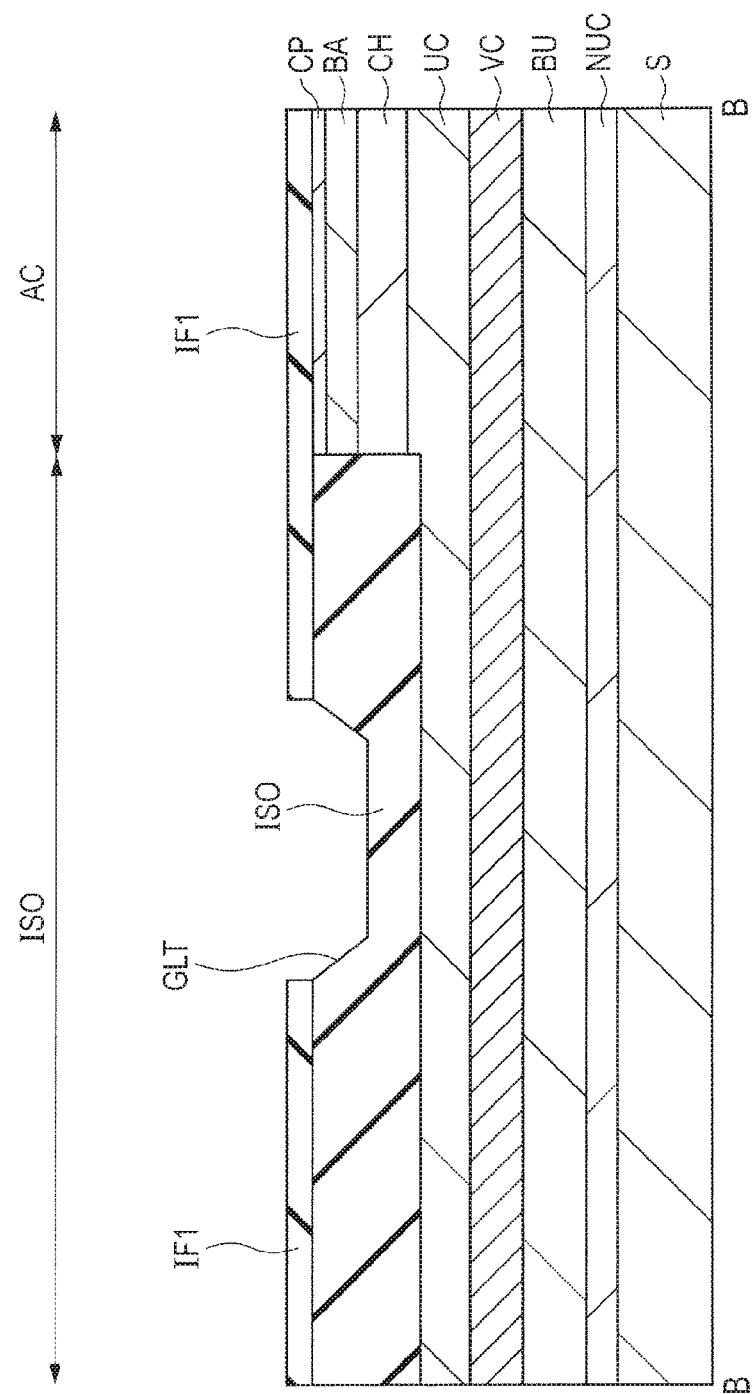
FIG. 10 is a cross sectional view illustrating a manufacturing step of the semiconductor device according to the first embodiment, which is a cross sectional view illustrating a manufacturing step succeeding to FIG. 7.
Figure 11:
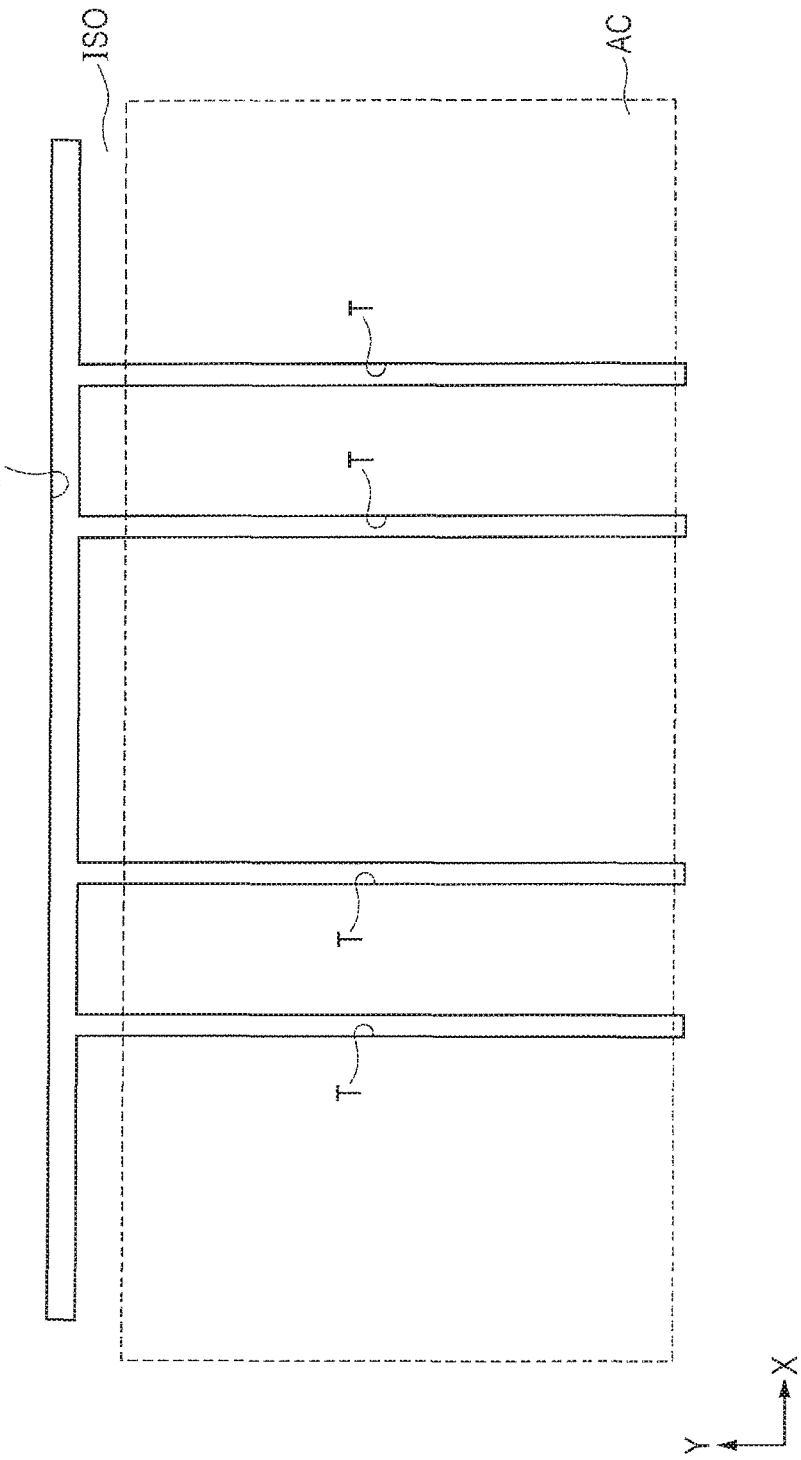
FIG. 11 is a plan view illustrating a manufacturing step of the semiconductor device according to the first embodiment.

Then, as illustrated in FIG. 9 to FIG. 11, the insulation film IF1 is patterned by using photolithography and etching technique. For example, a photoresist film (not illustrated) is formed over the insulation film IF1 and a photoresist film (not illustrated) in a gate electrode forming region (not illustrated) is removed by photolithography. In other words, a photoresist film (not illustrated) having an opening in the gate electrode forming region is formed over the insulation film IF1. Then, the insulation film IF1 is etched by using the photoresist film (not illustrated) as a mask. When a silicon nitride film is used as the insulation film IF1, dry etching is performed by using, for example, a dry etching gas containing a fluorine gas such as $SF_6$. Subsequently, the photoresist film (not illustrated) is removed by a plasma defoliation treatment. Thus, the insulation film IF1 having an opening in the gate electrode forming region is formed over the cap layer CP.

Then, by dry etching the cap layer CP, the barrier layer BA, and the channel layer CH using the insulation film IF1 as a mask, a trench T that penetrates the cap layer CP and the barrier layer BA and reaches as far as the middle of the channel layer CH is formed. As the etching gas, a dry etching gas, for example, containing a chlorine gas such as $BCl_3$ is used. In this step, a trench GLT for a gate line GL is formed in the device isolation region ISO (FIG. 10, FIG. 11).

Figure 12:
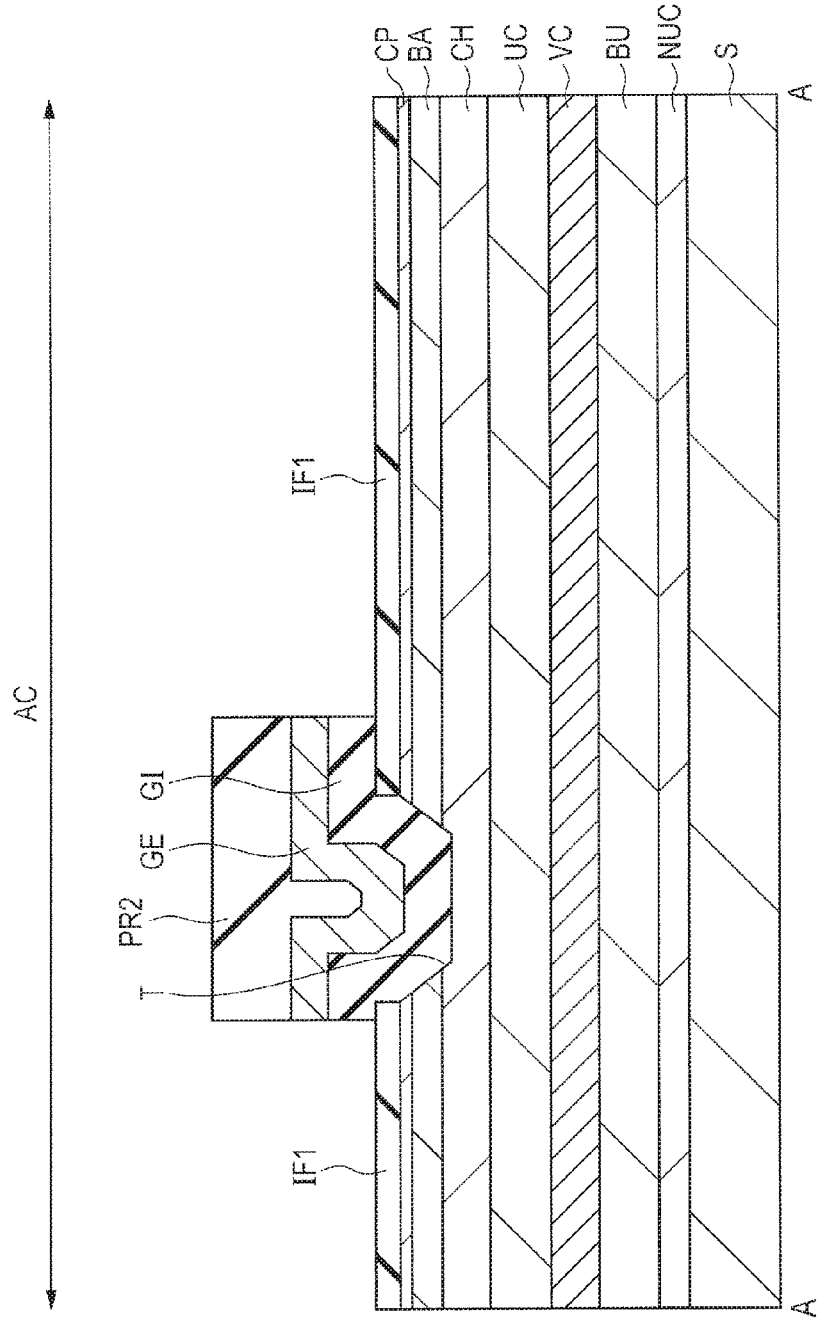
FIG. 12 is a cross sectional view illustrating a manufacturing step of the semiconductor device according to the first embodiment, which is a cross sectional view illustrating a manufacturing step succeeding to FIG. 9.
Figure 13:
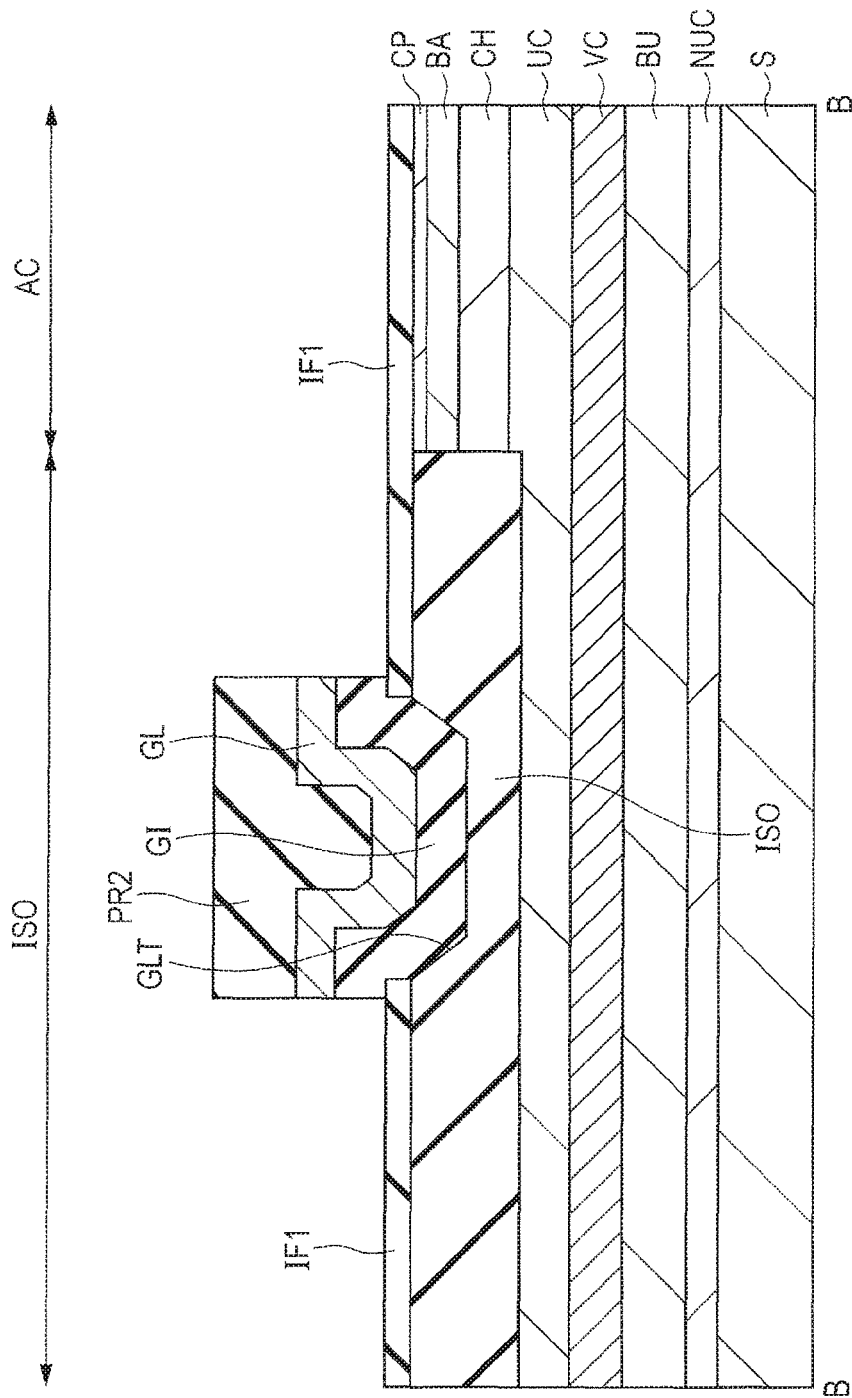
FIG. 13 is a cross sectional view illustrating a manufacturing step of the semiconductor device according to the first embodiment, which is a cross sectional view illustrating a manufacturing step succeeding to FIG. 10.
Figure 14:
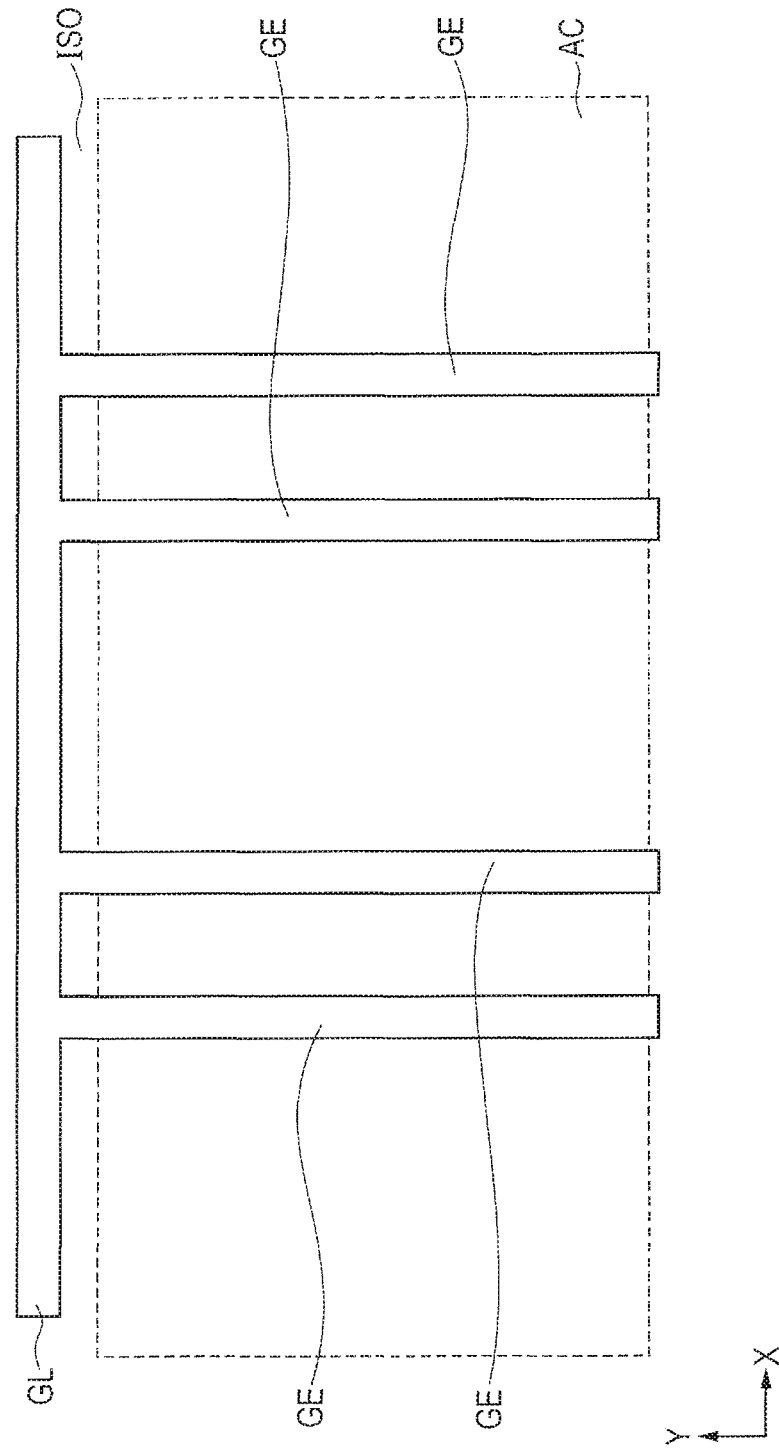
FIG. 14 is a plan view illustrating a manufacturing step of the semiconductor device according to the first embodiment.

Then, as illustrated in FIG. 12 to FIG. 14, a gate electrode GE is famed by way of a gate insulation film GI over the insulation film IF1 including the inside of the trench T. For example, an aluminum oxide film is deposited to a thickness of about 50 nm as the gate insulation film GI over the insulation film IF1 including the inside of the trench T by using, for example, an ADD (atomic layer deposition) method.

As the gate insulation film GI, a silicon oxide film or a high dielectric film having a dielectric constant higher than that of the silicon oxide film may also be used in addition to the aluminum oxide film. As the high dielectric film, an SiN film (silicon nitride) film, and a hafnium type insulation film such as a $HfO_2$ film (hafnium oxide film), a hafnium aluminate film, a HfON film (hafnium oxynitride film), a HfSiO film (hafnium silicate film), a HfSiON film (hafnium silicon oxynitride film), and a HfAlO film may also be used.

Then, for example, a TiN (titanium nitride) film is deposited as a conductive film to a thickness of about 200 nm over the gate insulation film GI by using, for example, a sputtering method. Then, a photoresist film PR2 is formed in a gate electrode forming region by using photolithography and the TiN film is etched by using the photoresist film PR2 as a mask thereby forming a gate electrode GE. In the etching, the aluminum oxide film below the TIN film may also be etched. For example, in a case of processing the TIN film, a dry etching is performed by using a dry etching gas containing a chlorine gas such as $Cl_2$ and, in the case of processing the aluminum oxide film, dry etching is performed by using a dry etching gas containing a chlorine type gas, for example, $BCl_3$.

In the etching, the gate electrode GE is patterned in a shape extended in one direction (to the right, that is, to the side of the drain electrode DE in FIG. 12). The extended portion is referred to as a field plate electrode portion. The field plate electrode portion is a region as a portion of the gate electrode GE extending from the end of the trench T on the side of the drain electrode DE to the side of the drain electrode DE.

Figure 15:
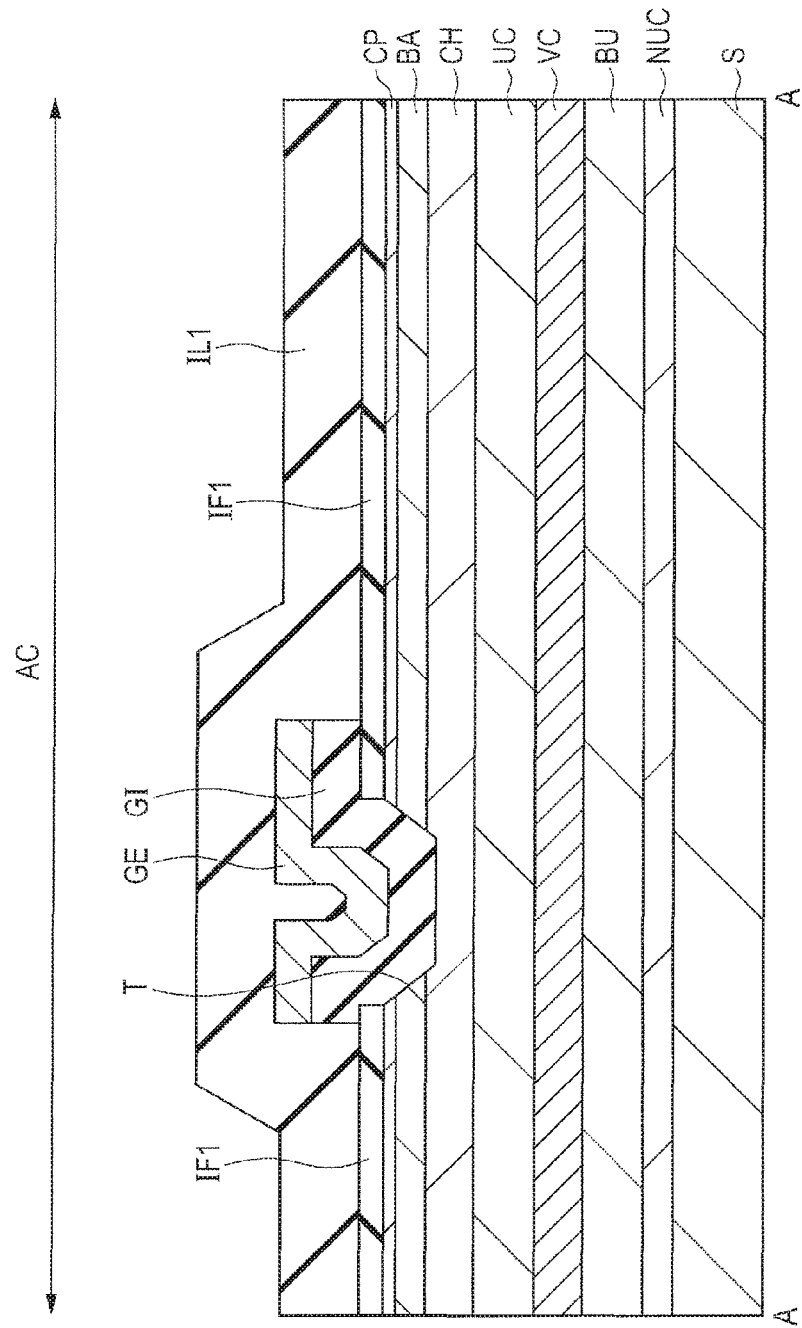
FIG. 15 is a cross sectional view illustrating a manufacturing step of the semiconductor device according to the first embodiment, which is a cross sectional view illustrating a manufacturing step succeeding to FIG. 12.
Figure 16:
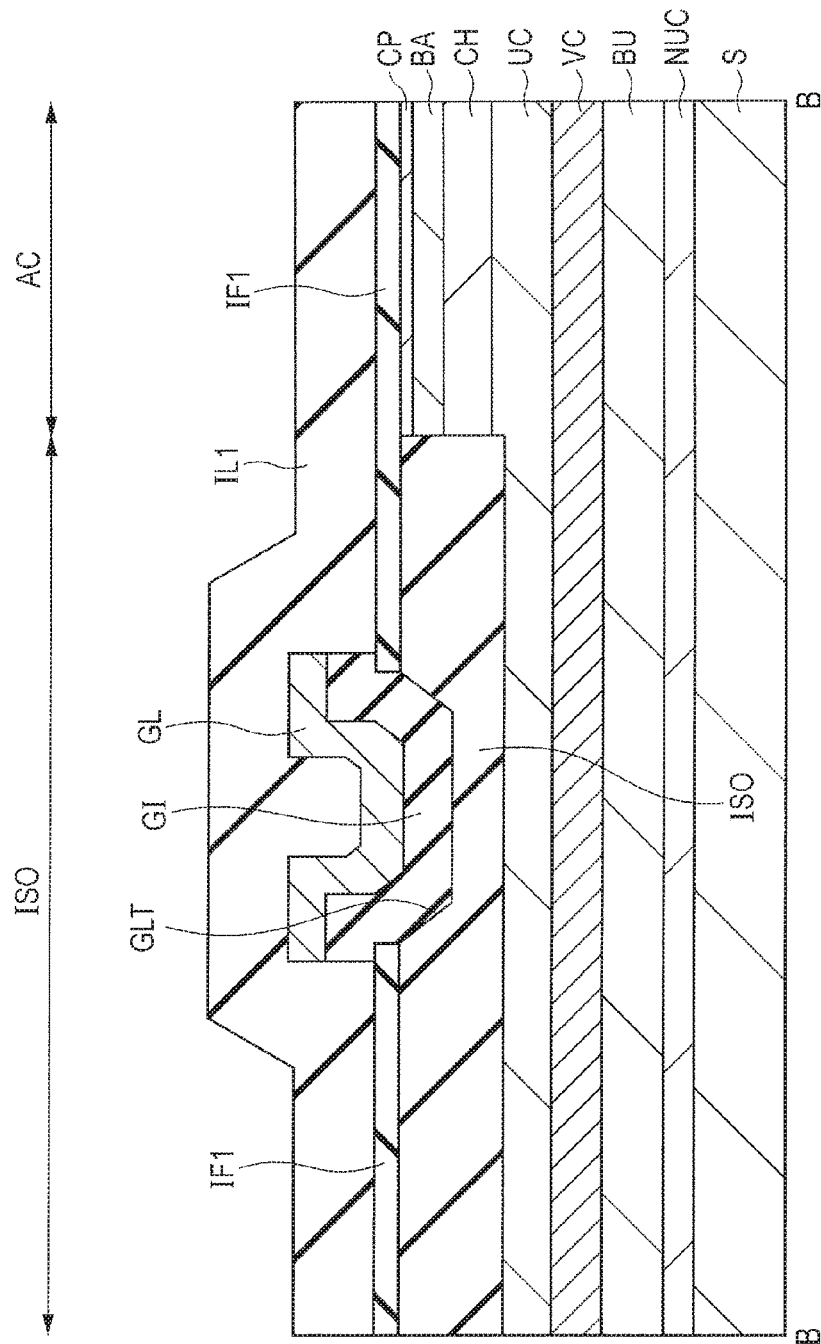
FIG. 16 is a cross sectional view illustrating a manufacturing step of the semiconductor device according to the first embodiment, which is a cross sectional view illustrating a manufacturing step succeeding to FIG. 13.

Then, as illustrated in FIG. 15 and FIG. 16, for example, a silicon nitride oxide film is deposited to a thickness of about 2000 nm as an interlayer insulation film IL1 over the insulation film IF1 including a portion over the gate electrode GE by using, for example, a PECVD method.

Figure 17:
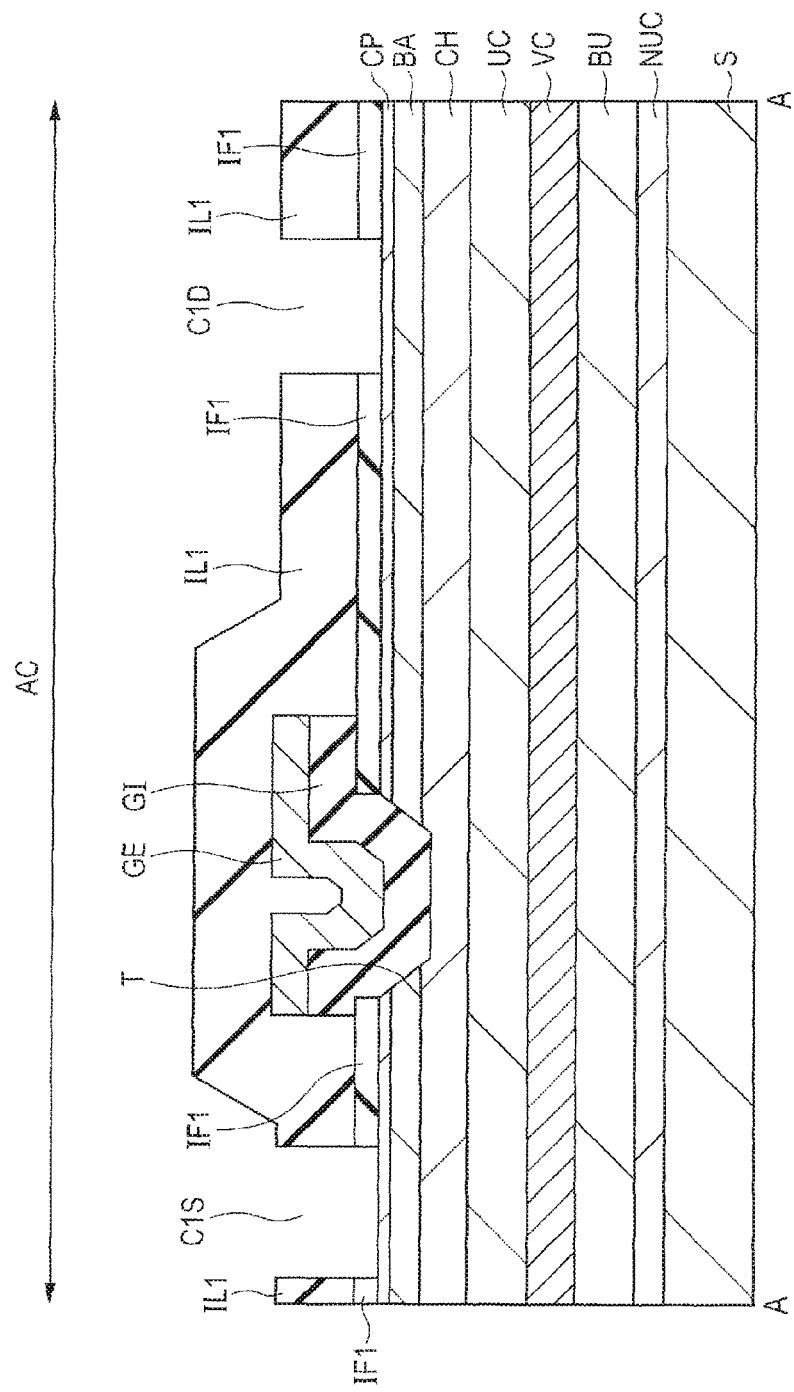
FIG. 17 is a cross sectional view illustrating a manufacturing step of the semiconductor device according to the first embodiment, which is a cross sectional view illustrating a manufacturing step succeeding to FIG. 15.
Figure 18:
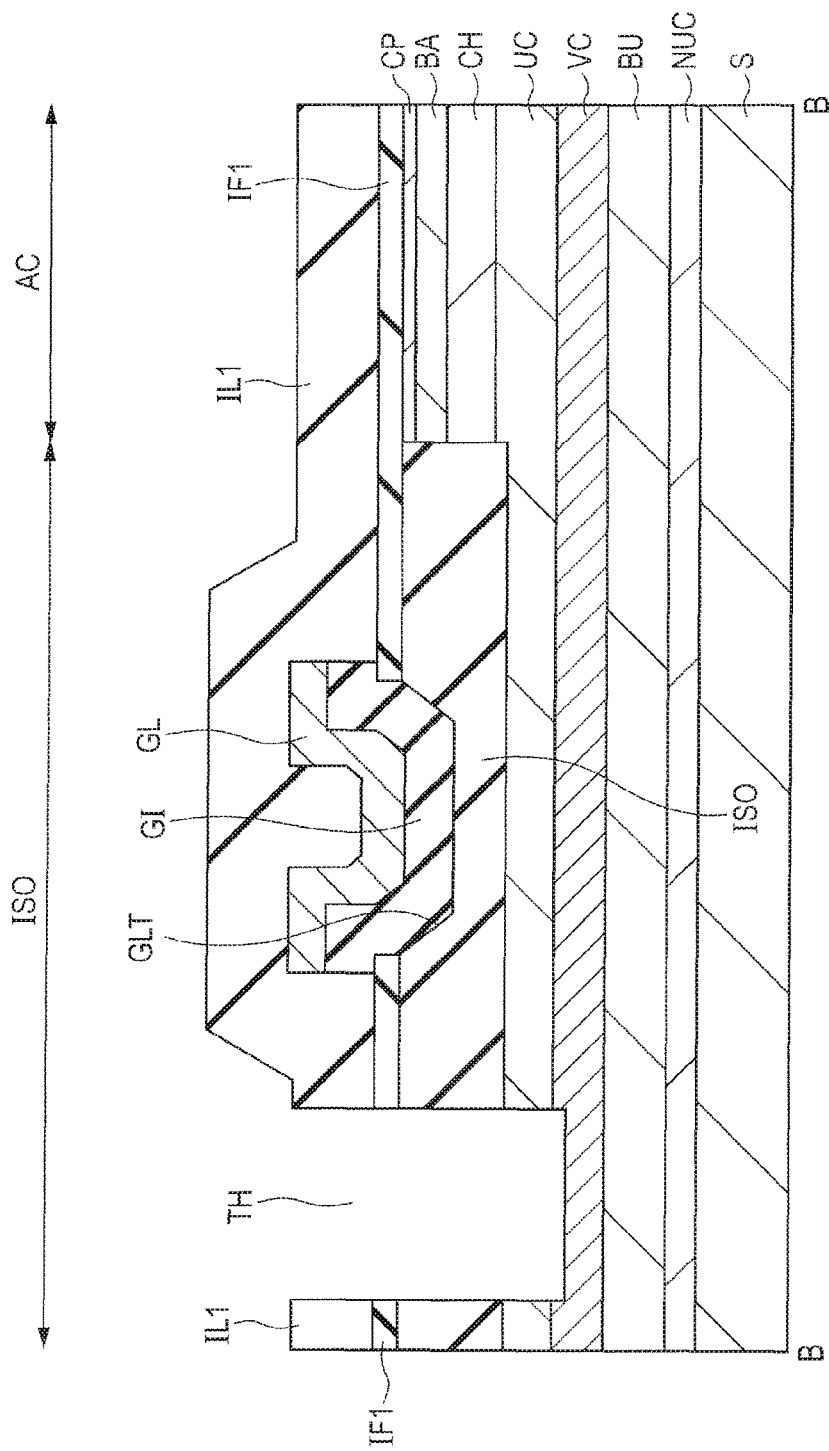
FIG. 18 is a cross sectional view illustrating a manufacturing step of the semiconductor device according to the first embodiment, which is a cross sectional view illustrating a manufacturing step succeeding to FIG. 16.
Figure 19:
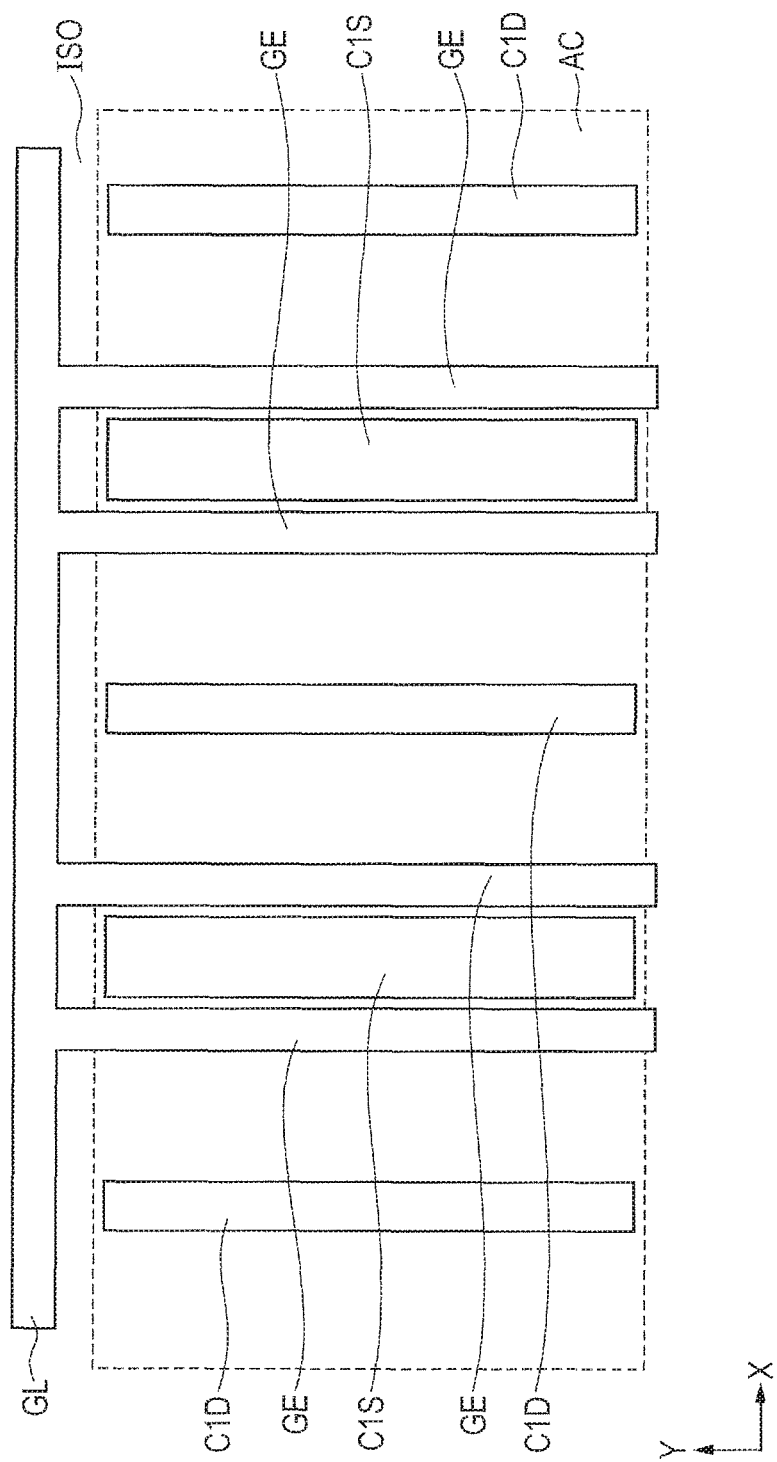
FIG. 19 is a plan view is a plan view illustrating a manufacturing step of the semiconductor device according to the first embodiment.

Then, as illustrated in FIG. 17 to FIG. 19, contact holes C1S and C1D, and a through hole TH are formed in the interlayer insulation film IL1 and the insulation film IF1 by using photolithography and etching technique. The contact holes C1S and C1D are formed in the source electrode forming region and the drain electrode forming region respectively. Further, the through hole TH is formed in a source pad forming region.

A first photoresist film, for example, having openings in a source electrode coupling region and a drain electrode coupling region respectively is formed over the interlayer insulation film IL1. Then, the interlayer insulation film IL1 and the insulation film IF1 are etched by using the first photoresist film as a mask thereby forming the contact holes C1S and C1D.

In a case of using a silicon oxide film as the interlayer insulation film IL1 and using a silicon nitride film as the insulation film IF1, dry etching is performed upon etching the films, for example, by using a dry etching gas containing a fluorine gas such as $SF_6$.

Then, after removing the first photoresist film, a second photoresist film having an opening in a through hole forming region is formed over the interlayer insulation film IF1 including the inside of the contact holes C1S and C1D. Then, the interlayer insulation film IL1, the insulation film IL1, the device isolation region ISO, the channel underlayer UC, and a portion of the potential fixing layer VC are etched by using the second photoresist film as a mask thereby forming a through hole TH. In other words, the through hole TH that penetrates the interlayer insulation film IL1, the insulation film IF1, the device isolation region ISO and the channel underlayer UC and reaches as far as the middle of the potential fixing layer VC is formed.

As described above, etching is performed such that the bottom of the through hole TH is situated in the potential fixing layer VC and below the bottom of the device isolation region ISO.

In a case of using a silicon oxide film as the interlayer insulation film IL1 and using a silicon nitride film as the insulation film IF1, films are first removed by dry etching using, for example, a dry etching gas containing a fluorine gas such as $SF_6$. Then, the device isolation region ISO, the channel underlayer (AlGaN layer) UC and a portion to the middle of the potential fixing layer (pGaN layer) VC are removed by dry etching, for example, using a dry etching gas containing a chlorine gas such as $BCl_3$, The order of forming the contact holes C1S and C1D, and the through hole TH is not restricted to the order described above but the contact holes C1S and the C1D may be formed also after forming the through hole TH. Alternatively, after removing the interlayer insulation film IL1 in the through hole forming region, the source electrode coupling region, and the drain electrode coupling region, the insulation film IF1 in the through hole forming region, the device isolation region ISO, the channel underlayer UC, and the middle of the potential fixing layer VC are removed and, further, the insulation film IF1 in the source electrode coupling region and the drain electrode coupling region may be removed. As described above, various steps can be adopted for the steps of forming the contact holes C1S and C1D, and the through hole TH.

The cap layer CP is exposed at the bottom of the contact holes C1S and C1D formed by the steps described above and the potential fixing layer VC is exposed at the bottom of the through hole TH formed by the steps described above.

Figure 20:
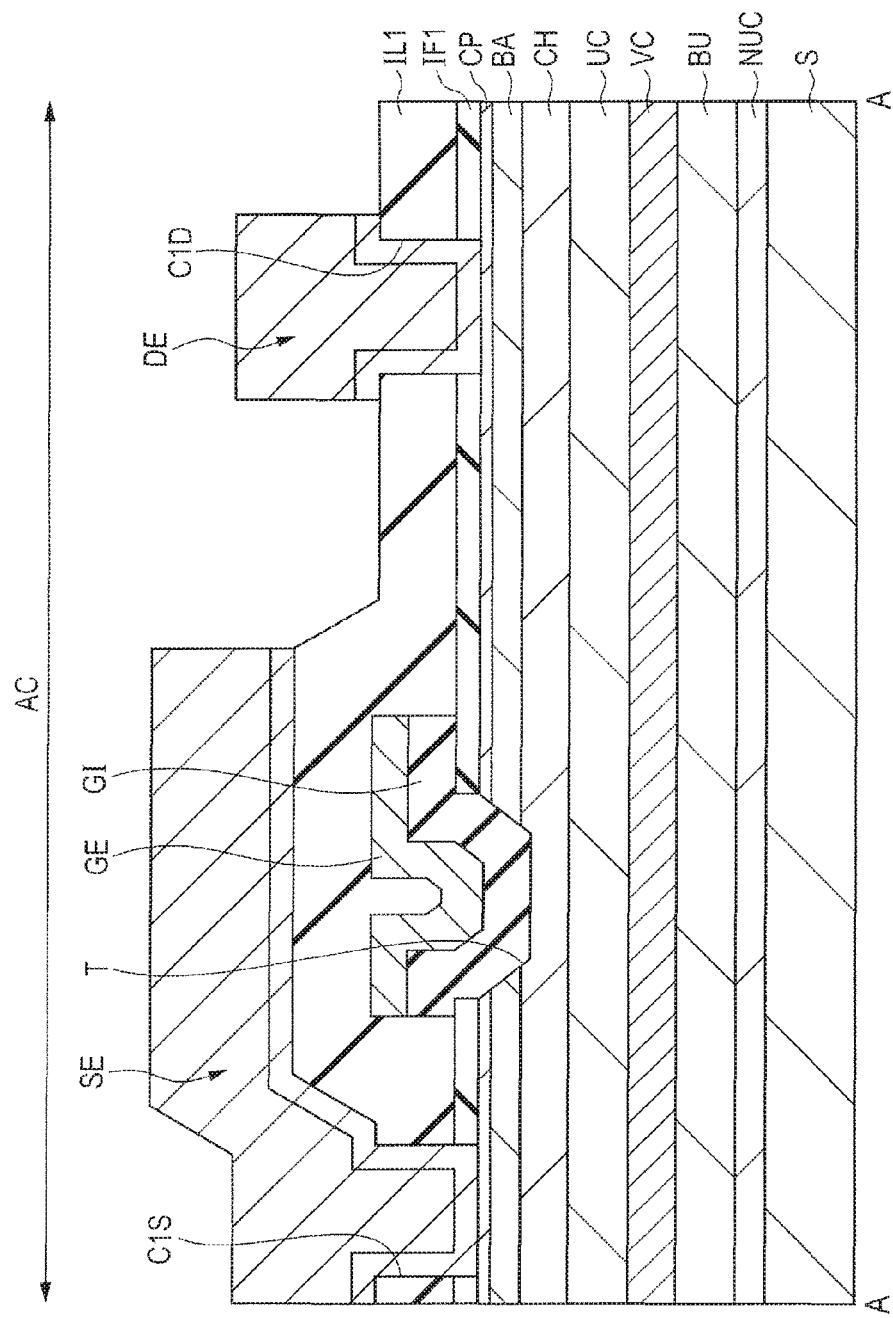
FIG. 20 is a cross sectional view illustrating a manufacturing step of the semiconductor device according to the first embodiment, which is a cross sectional view illustrating a manufacturing step succeeding to FIG. 17.
Figure 21:
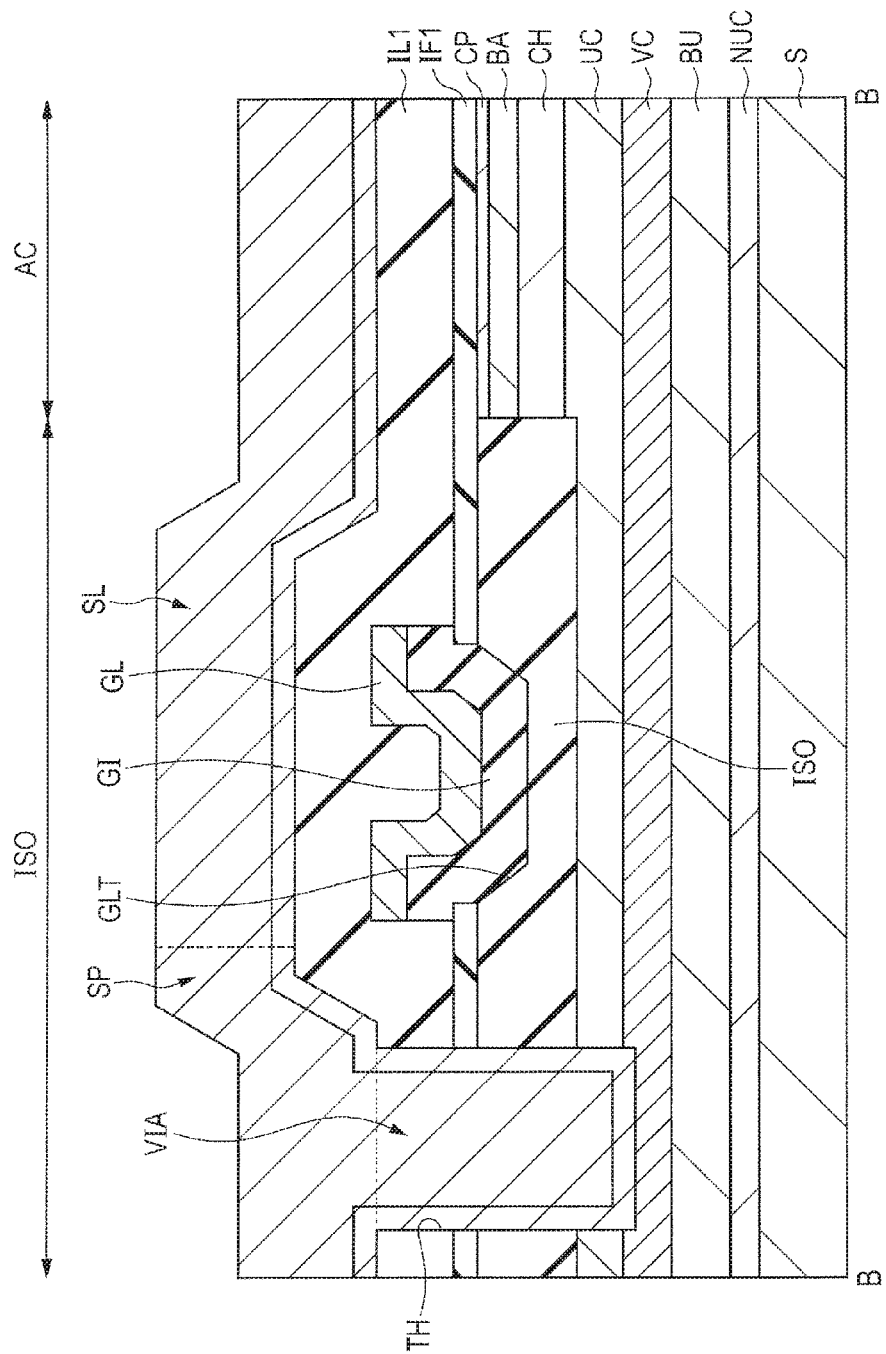
FIG. 21 is a cross sectional view illustrating a manufacturing step of the semiconductor device according to the first embodiment, which is a cross sectional view illustrating a manufacturing step succeeding to FIG. 18.
Figure 22:
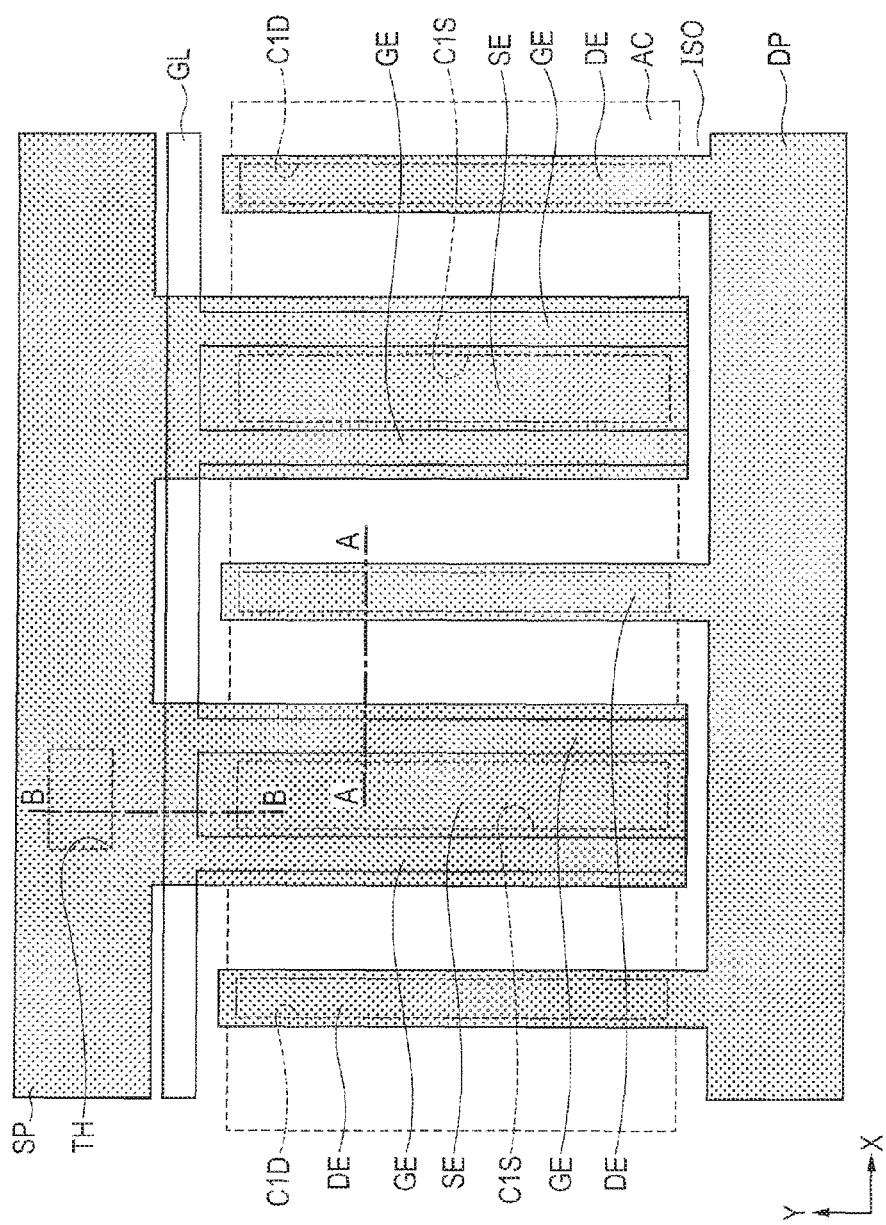
FIG. 22 is a plan view illustrating a manufacturing step of the semiconductor device according to the first embodiment.

Then, as illustrated in FIG. 20 to FIG. 22, a source electrode SE and a drain electrode DE are famed over the cap layer CP on both sides of the gate electrode GE. Further, a source pad SP is formed at the end of the source electrode SE and a drain pad DP is formed at the end of the drain electrode DE (FIG. 22).

For example, a conductive film is formed over the interlayer insulation film IL1 including the inside of the contact holes C1S and C1D and the through hole TH. For example, a stacked film (Al/TiN) comprising a titanium nitride film (TiN) film and an aluminum (Al) film thereover is formed as the conductive film by a sputtering method or the like. The thickness of the titanium nitride film is, for example, about 50 nm and the thickness of the aluminum film is, for example, about 1000 nm.

Then, a photoresist film (not illustrated) is formed in regions for forming the source electrode SE, the drain electrode DE, the source pad SP, and the drain pad DP by using photolithography, and the conductive film (Al/TiN) is etched by using the photoresist film (not illustrated) as a mask. Dry etching is applied, for example, by using a dry etching gas containing a chlorine gas such as $BCl_3$. By the step, a coupling portion VIA in which the conductive film is filled in the through hole TH is faulted and, further, the source electrode SE, the drain electrode DE, the source pad SP, and the drain pad DP are formed. As illustrated in FIG. 22, the planar shape for each of the source electrodes SE and the drain electrodes DE is a rectangular shape (linear shape) having a longer side in the direction Y. Further, the planar shape for each of the source pad SP and the drain pad DP is a rectangular shape (linear shape) having a longer side in the direction X. The source pad SP is disposed so as to couple a plurality of source electrodes SE and the drain pad DP is disposed so as to couple a plurality of the drain electrodes DE.

The through hole TH is positioned below the source pad SP, and the source pad SP and the potential fixing layer VC are electrically coupled by way of the coupling portion VIA (FIG. 21).

Then, a protective film (also referred to as an insulation film, a cover film, or a surface protective film) PRO is formed over the interlayer insulation film IL1 including a portion over the source electrode SE, the drain electrode DE, the source pad SP, and the drain pad DP. For example, a silicon oxynitride (SiON) film is deposited as a protective layer PRO over the interlayer insulation film IL1 by using, for example, a CVD method (refer to FIG. 3 and FIG. 4).

By the steps described above, the semiconductor device of this embodiment can be formed. The steps are merely an example but the semiconductor device of this embodiment may be manufactured also by other steps than the steps described above.

As described above, according to this embodiment, since the potential fixing layer VC as a conductive layer is disposed between the buffer layer BU and the channel layer CH and coupled with the source electrode SE, fluctuation of characteristics of the semiconductor element can be decreased. That is, the potential fixing layer VC can prevent the effect of the change of potential caused by the change of the amount of charges in the layers below the potential fixing layer VC (for example, buffer layer BU, etc.) from exerting as far as the channel layer CH. Thus, fluctuations of characteristics such as a threshold voltage or on-resistance can be decreased.

In this embodiment, while the p-type nitride semiconductor layer was used as the potential fixing layer VC but a n-type nitride semiconductor layer may also be used. For example, silicon (Si) can be used as the n-type impurity. The n-type impurity involves a problem that the drain breakdown voltage is deteriorated. However, since the concentration controllability is good and the activation ratio is high, the potential can be fixed more effectively. On the other hand, when a positive voltage (positive bias) is applied to the drain electrode DE by using the p-type nitride semiconductor layer, the potential fixing layer VC is depleted to form a high resistance layer. Thus, deterioration of the drain breakdown voltage can be suppressed, or drain breakdown voltage can be improved.

Further, in this embodiment, since the coupling portion VIA in the through hole TH is disposed in the device isolation region ISO outside of the active region AC in which electrons are conducted and below the region forming the source pad SP, the semiconductor elements can be refined and integrated at a high integration degree. Further, since a large active region AC can be ensured in which the electrons can be conducted, on-resistance per unit area can be decreased.

Reduction of the fluctuation of characteristics of the semiconductor element according to the device of this embodiment is to be described more specifically.

For example, in a case where an impurity such as Fe is added in the buffer layer for increasing the breakdown voltage (refer to JP-A No. 2008-288474), Fe forms a deep energy level. Since such a deep energy level forms a site for trapping and releasing the electrons or holes during operation of the semiconductor element, this causes fluctuation of characteristics such as the threshold voltage. Particularly, at a deep energy level, fluctuation of characteristics such as the threshold voltage may be sometimes caused over an extremely long time from several minutes to several days in accordance with the energy depth or the position.

On the contrary, in this embodiment, since the potential fixing layer VC is provided as a conductive layer between the buffer layer BU and the channel layer CH and coupled with the source electrode SE, fluctuation of the characteristics of the semiconductor element can be decreased.

Further, in a case of using the super lattice structure for the buffer layer BU, the super lattice structure forms an extremely deep quantum well (extremely high barrier for the transportation of electrons or holes). Accordingly, when charges such as electrons or holes are trapped near the super lattice structure, it is difficult that they are transported in a direction perpendicular to the substrate. Accordingly, when the super lattice structure is used, it is difficult to remove unnecessary charges and this may possibly fluctuate characteristics such as the threshold voltage over an extremely long time.

On the contrary, in this embodiment, since the potential fixing layer VC which is the conductive layer is provided between the buffer layer BU and the channel layer CH and coupled with the source electrode SE, fluctuation of the characteristics of the semiconductor element can be decreased.

Further, when a plasma treatment is applied during manufacturing steps, charges tend to be introduced into the semiconductor layer. The plasma treatment includes, for example, PECVD, and the plasma defoliation treatment of the photoresist film. Fluctuation of the characteristics such as the threshold voltage can be caused also by the charges introduced during such treatment. Particularly, since the nitride semiconductor has a large band gap and a high insulation property, charges introduced by the plasma treatment, etc. are difficult to be drawn out and may cause fluctuation of the characteristics such as the threshold voltage over an extremely long time.

On the contrary, in this embodiment, since the potential fixing layer VC is disposed as the electroconductive layer between the buffer layer BU and the channel layer CH and coupled with the source electrode SE, fluctuation of the characteristics of the semiconductor element can be decreased.

Figure 23A:
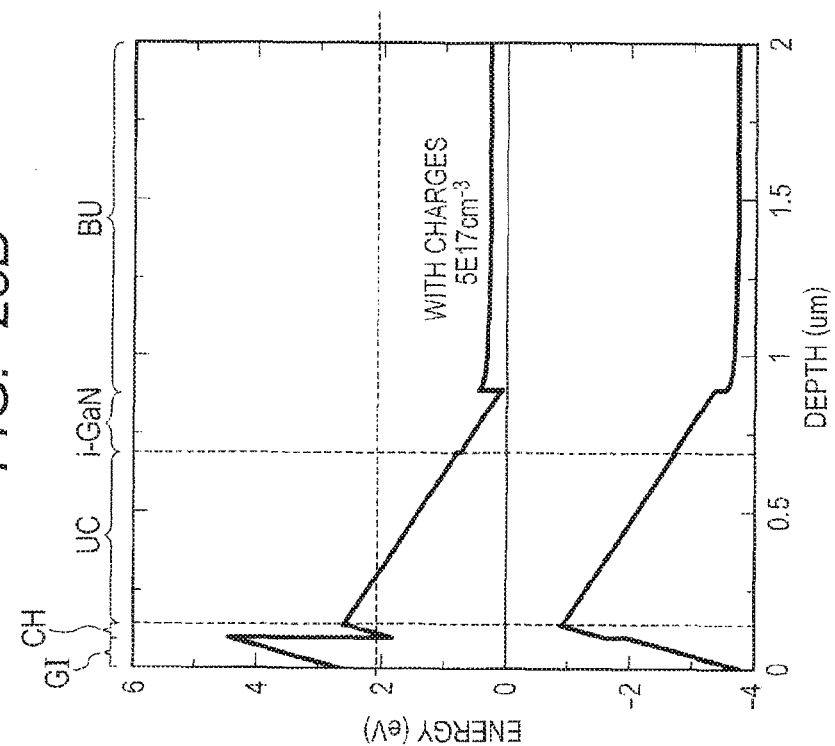
FIGS. 23A and 23B are band diagrams for a portion just below a gate electrode of a semiconductor device in which a non-doped gallium nitride layer (i-GaN layer) is provided instead of a potential fixing layer (p-GaN layer)
Figure 23B:
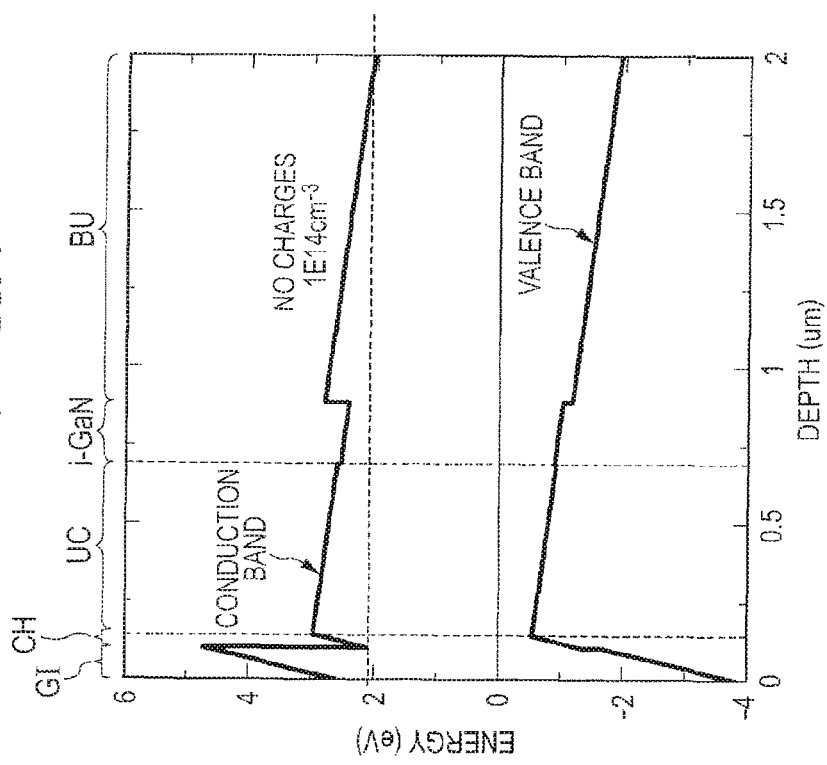
Figure 24A:
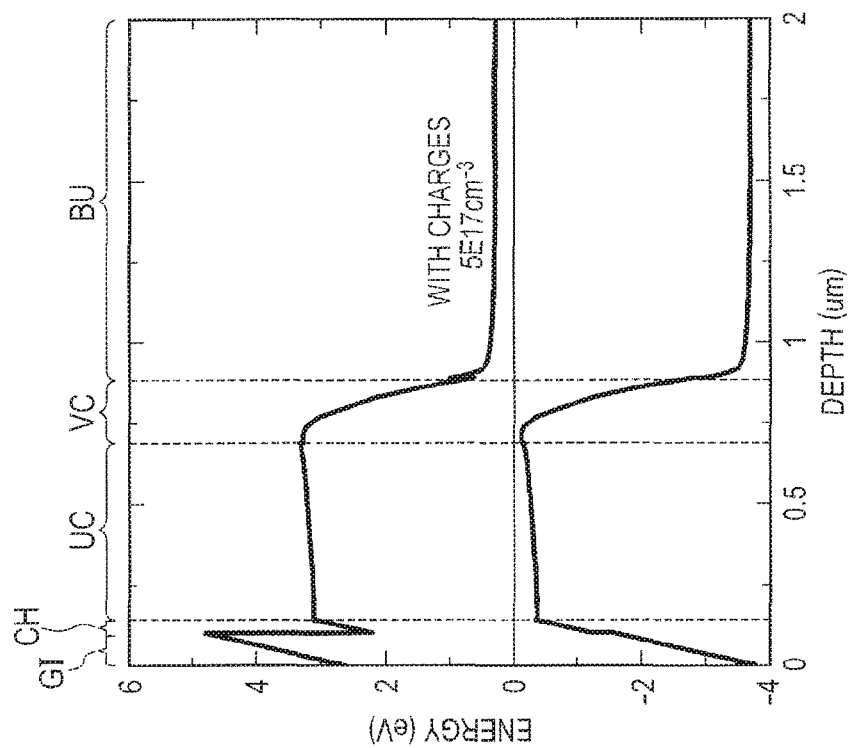
FIGS. 24A and 24B are band diagrams for a portion just below the gate electrode of the semiconductor device when a potential fixing layer (p-GaN layer) is provided in the first embodiment.
Figure 24B:
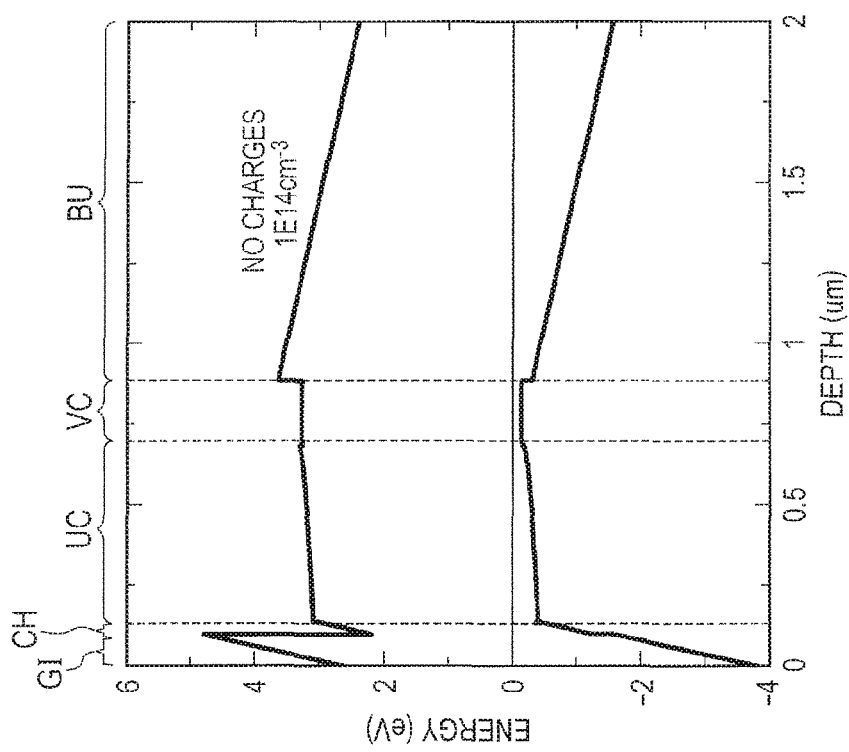

FIGS. 23A and 23B are band diagrams for a portion just below a gate electrode of a semiconductor device when a non-doped gallium nitride (i-GaN layer) is provided instead of a potential fixing layer (p-GaN layer). FIGS. 24A and 24B are band diagrams for a portion just below the gate electrode of the semiconductor device when a potential fixing layer (p-GaN layer) of this embodiment is provided. A portion just below the gate electrode means a portion downward from a gate insulation film GI (direction of depth) in a trench T. Each of FIGS. 23A and 24A shows a case in which "charge is not present", that is, when the impurity concentration in the buffer layer BU is $1\times10^{14}$ (1E14) $cm^{-3}$ or less that corresponds to a non-doped state and each of FIG. 23B and FIG. 24B shows a case in which "charge is present", that is, the buffer layer is doped with the impurity to provide an impurity concentration (carrier concentration) of $5\times10^{17}$ (5E17) $cm^{-3}$. Further, in each of FIGS. 23A and 23B and FIGS. 24A and 24B, the abscissa represents a position just below the gate electrode (depth: DEPTH [µm]) and the ordinate represents the level of energy (ENERGY [eV]). The upper band shows a conduction band and a lower band shows a valence electron band.

As illustrated in FIGS. 23A and 23B, when the i-GaN layer is provided instead of the potential fixing layer, the state of the band energy of the semiconductor layers (CH, UC) on the side of the surface from the i-GaN layer changes depending on the presence or absence of charges. Thus, the energy of the conduction band of the channel CH changes depending on the presence or absence of charges (refer to a broken line portion near 2 eV in FIGS. 23A and 23B).

On the other hand, in this embodiment as shown in FIGS. 24A and 24B in which the potential fixing layer is provided, the energy of the conduction band in the channel layer CH does not change depending on the presence or absence of charges. Thus, change of the band energy in the semiconductor layers (CH, UC) on the side of the surface from the potential fixing layer can be suppressed. As a result, fluctuation of the characteristics of the semiconductor element such as the threshold voltage and the on-resistance can be suppressed.

Figure 25:
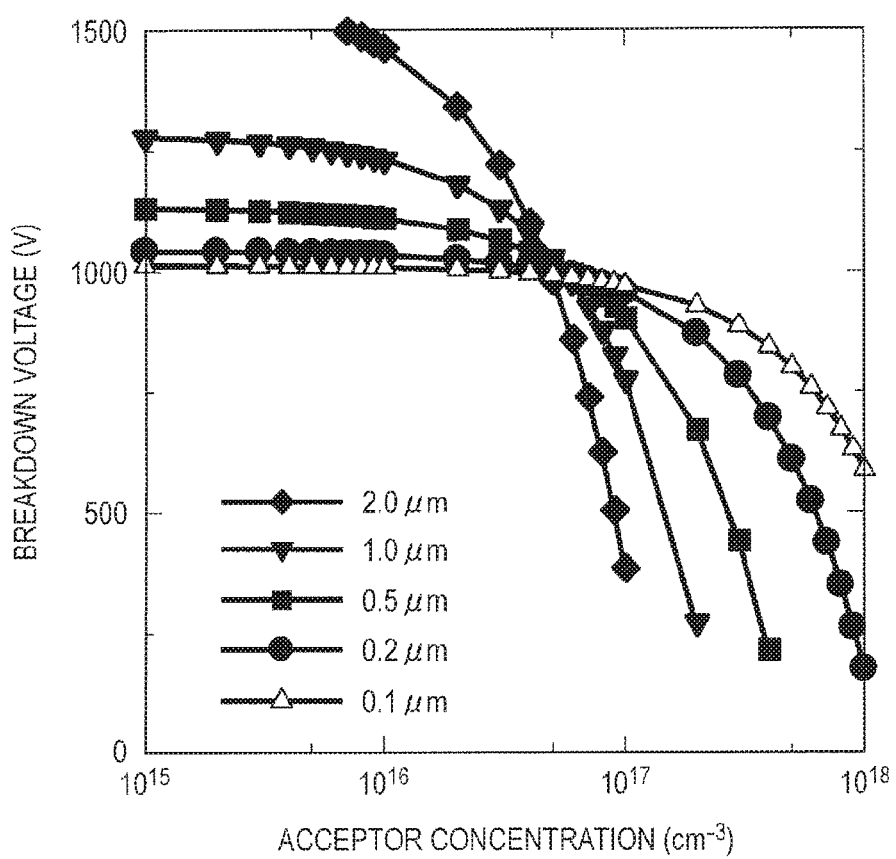
FIG. 25 is a graph illustrating a relation between a drain breakdown voltage in the longitudinal direction and a concentration of acceptors activated in a potential fixing layer.

FIG. 25 is a graph illustrating a relation between a vertical drain breakdown voltage and a concentration of activated acceptor in the potential fixing layer. The graph shows the result of simple calculation for the dependence of the concentration of the acceptor activated in the potential fixing layer to the vertical drain breakdown voltage. The abscissa represents the acceptor concentration [$cm^{-3}$] and the ordinate represents the drain breakdown voltage [V]. As illustrated in FIG. 25, for a defined thickness of the potential fixing layer, the drain breakdown voltage lowers as the concentration of the acceptor increases in the potential fixing layer. That is, in each of the cases where the thickness of the potential fixing layer is 2.0 µm, 1.0 µm, 0.5 µm, 0.2 µm, and 0.1 µm, the drain breakdown voltage was lowered as the acceptor concentration increased. Particularly, when the acceptor concentration exceeds $1\times10^{17}$ (1E17) $cm^{-3}$, the drain breakdown voltage is deteriorated remarkably. Accordingly, with a view point of ensuring the breakdown voltage, it is preferred to use a p-type impurity to the potential fixing layer. The upper limit of the concentration is necessarily determined such that the breakdown voltage does not lower below a desired level.

Second Embodiment

In the first embodiment 1, the coupling portion VIA is formed in the device isolation region ISO but the coupling portion VIA may be disposed in the active region AC. For example, in this embodiment, the coupling portion VIA is provided below the source electrode SE.

The semiconductor device of this embodiment is to be described in details with reference to the drawings:

[Description of Structure]

Figure 26:
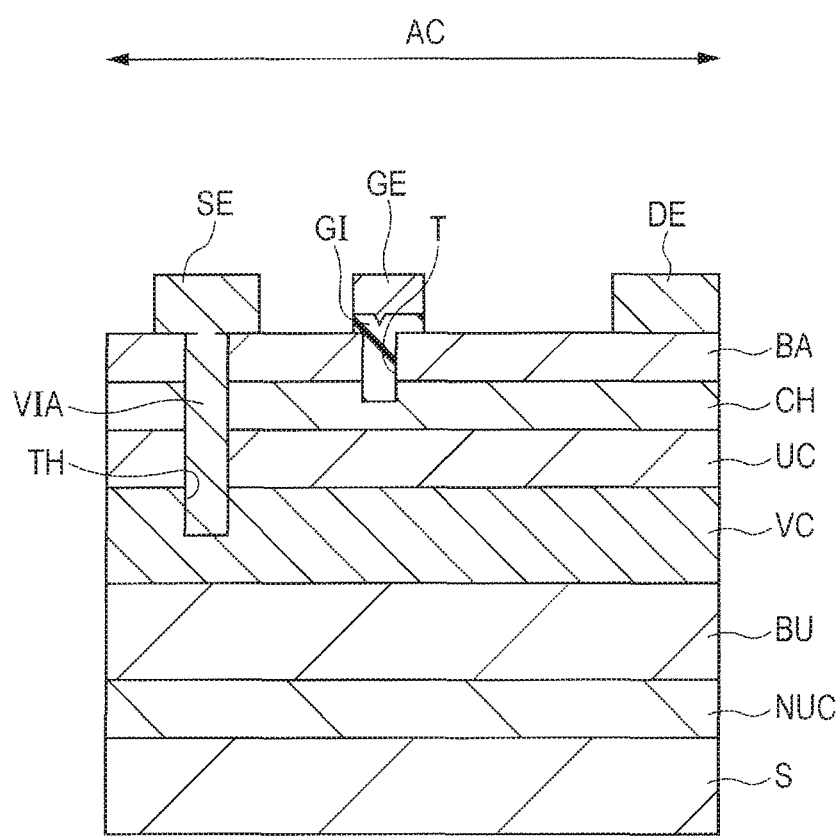
FIG. 26 is a cross sectional view schematically illustrating a configuration of a semiconductor device according to a second embodiment.

FIG. 26 is a cross sectional view schematically illustrating a configuration of a semiconductor device of this embodiment. The semiconductor device (semiconductor element) of this embodiment is a MIS field effect transistor using nitride semiconductors. The semiconductor device can be used as a high electron mobility transistor (HEMT) type power transistor. The semiconductor device of this embodiment is a so-called recessed gate semiconductor device.

In the semiconductor device of this embodiment, a nucleation layer NUC, a buffer layer EU, a potential fixing layer VC, a channel underlayer UC, a channel layer (also referred to as an electron transport layer) CH, and a buffer layer BA are formed successively above a substrate S in the same manner as in the first embodiment. The nucleation layer NUC comprises a nitride semiconductor layer. The buffer layer BU comprises one or a plurality of nitride semiconductor layers with addition of an impurity that forms a deep energy level to the nitride semiconductor. In this embodiment, a super lattice structure comprising a plurality of nitride semiconductor layers is used. The potential fixing layer VC comprises a nitride semiconductor layer with addition of a p-type impurity to the nitride semiconductor and has electroconductivity. The channel underlayer UC comprises a nitride semiconductor layer having an electron affinity smaller than that of the channel layer CH and an average lattice constant in the direction of the substrate surface smaller than that of the channel layer CH. The channel layer CH comprises a nitride semiconductor layer having an electron affinity larger than that of the channel underlayer UC. The barrier layer BA comprises a nitride semiconductor layer having an electron affinity smaller that of the channel layer CH and an electron affinity smaller than that of the channel underlayer UC. An insulation layer (not illustrated) is formed over the barrier layer BA. A cap layer may also be provided between the insulation film (protective film) and the barrier layer BA. The cap layer comprises a nitride semiconductor layer having an electron affinity larger than that of the barrier layer BA.

The MISFET of this embodiment has a gate electrode GE formed by way of a gate insulation film GI over the channel layer CH and a source electrode SE and a drain electrode DE formed over the barrier layer BA on both sides of the gate electrode GE in the same manner as in the first embodiment. The MISFET is formed in an active region AC partitioned by a device isolation ISO. Further, the gate electrode GE is formed by way of a gate insulation film GI inside a trench T that penetrates the barrier layer BA and reaches as far as the middle of the channel layer CH.

In this embodiment, a coupling portion (also referred to as a via) VIA that penetrates the barrier layer BA, the channel layer CH, and the channel underlayer UC and reaches as far as the potential fixing layer VC therebelow is disposed below the source electrode SE in the active region AC. The coupling portion VIA is electrically coupled with the source electrode SE. Since the potential fixing layer VC is disposed and coupled with the source electrode SE, fluctuation of the characteristics such as the threshold voltage and the on-resistance can be decreased as described specifically in the first embodiment. Further, since the coupling portion VIA is disposed in the active region AC in which electrons are conducted, the potential can be fixed more effectively.

Figure 27:
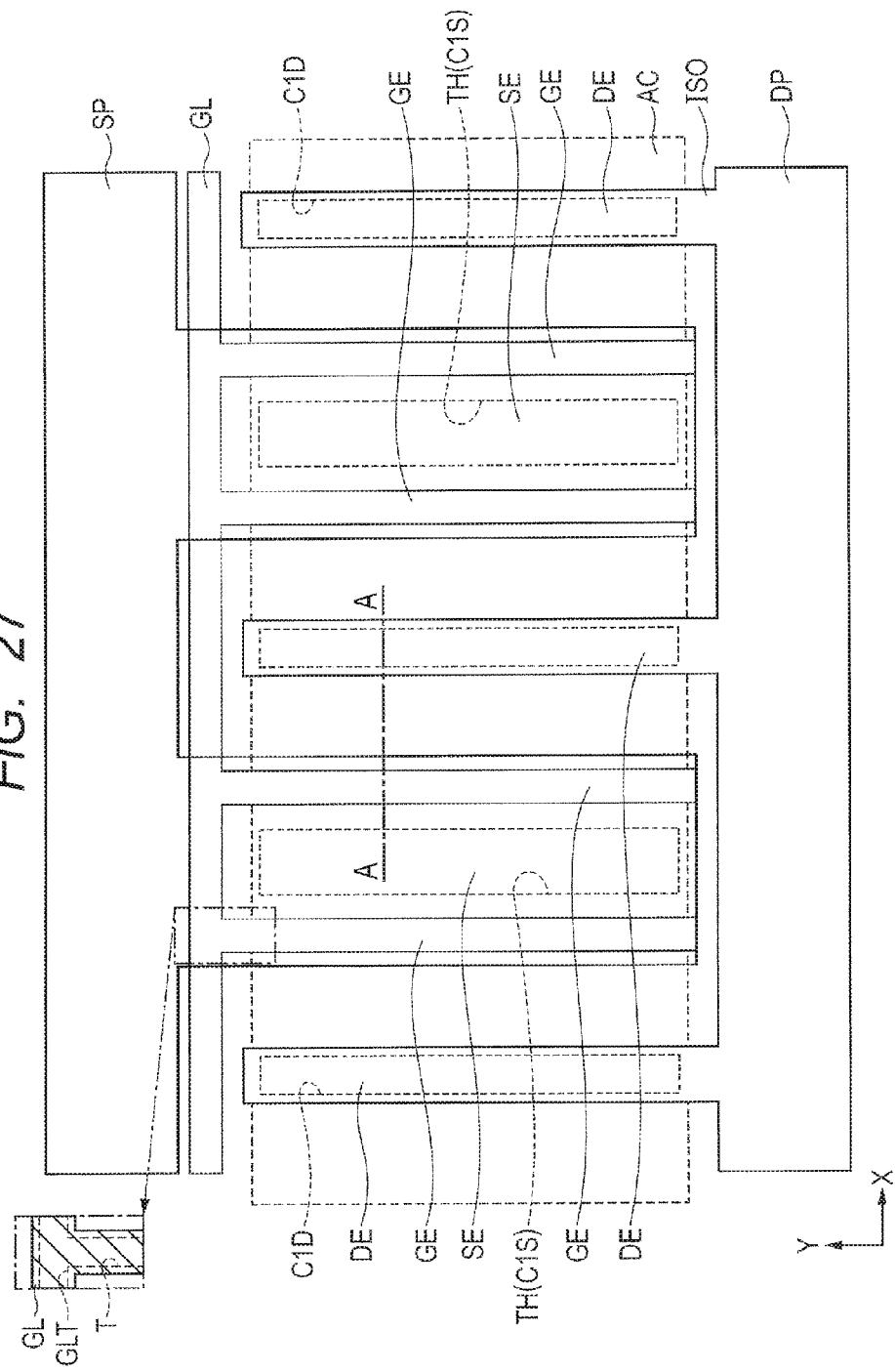
FIG. 27 is a plan view illustrating a configuration of the semiconductor device according to the second embodiment.
Figure 28:
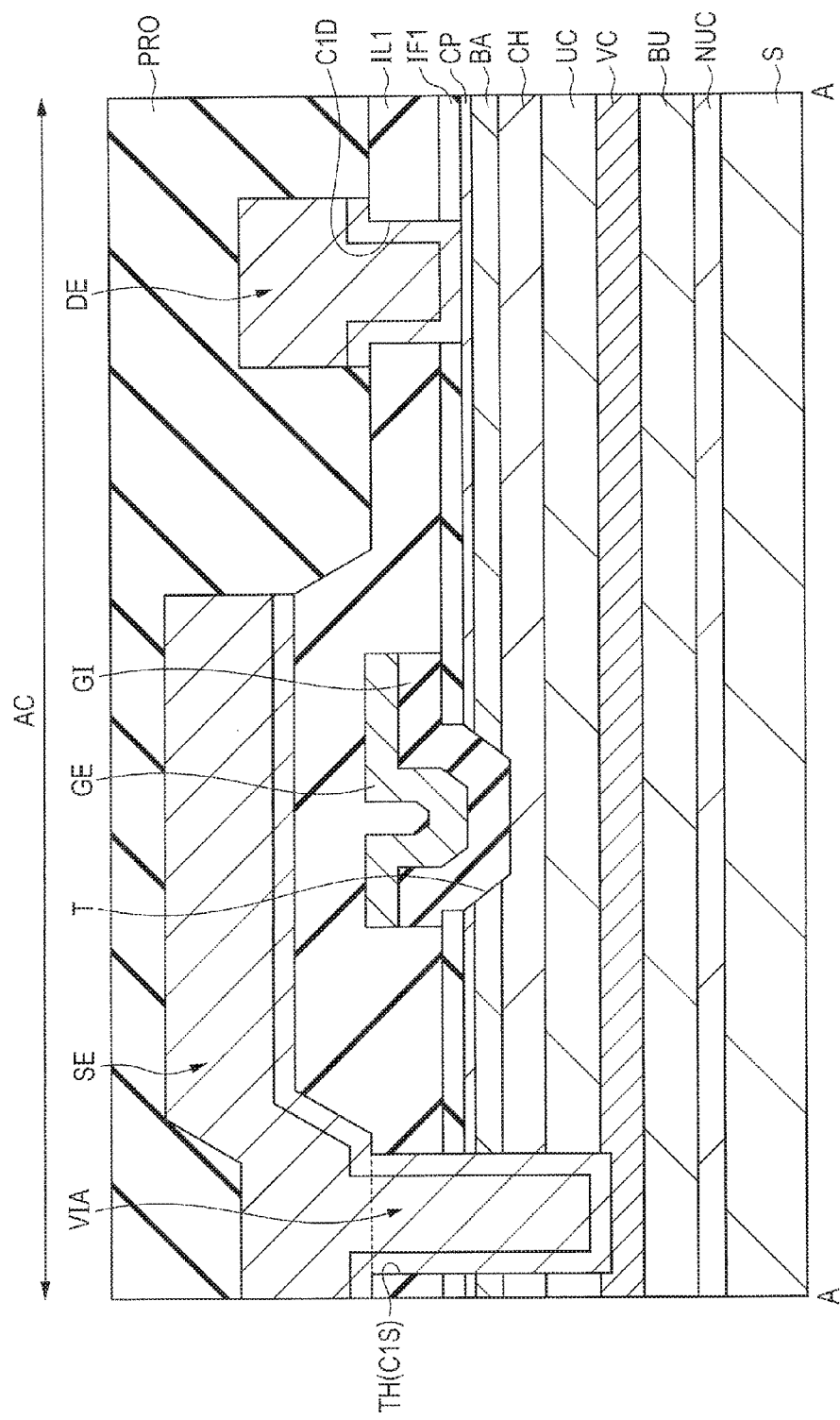
FIG. 28 is a cross sectional view illustrating a configuration of the semiconductor device according to the second embodiment.

The semiconductor device of the second embodiment is to be described further with reference to FIG. 27 and FIG. 28. FIG. 27 is a plan view illustrating the configuration of the semiconductor device according to this embodiment. FIG. 28 is a cross sectional view illustrating the configuration of the semiconductor device of this embodiment. FIG. 28 corresponds to a cross section A-A in FIG. 27. Since other configurations than the position for forming the VIA are identical with those of the first embodiment, configurations identical with those of the first embodiment are not described specifically.

As illustrated in FIG. 27, a plurality of linear drain electrodes DE are disposed each at a predetermined distance in the direction X. Further, a plurality of linear source electrodes SE are disposed each at a predetermined distance in the direction X. In the same manner as in the first embodiment, each of the source electrodes SE and each of the drain electrodes DE are disposed alternately to each other in the direction X.

In the same manner as in the first embodiment, a contact hole C1D as a coupling portion between the drain electrode DE and the cap layer CP is disposed below the drain electrode DE. A coupling portion VIA for electrically coupling the source electrode SE and the potential fixing layer VC is disposed below the source electrode SE. The coupling portion VIA is disposed inside a through hole TH and the planar shape thereof is a rectangular shape having a longer side in the direction Y.

A gate electrode GE is disposed between the contact hole C1D below the drain electrode DE and the through hole TH below the source electrode SE. The gate electrode GE has a rectangular shape having a longer side in the direction Y in the same manner as in the first embodiment. The two (paired) gate electrodes GE are disposed on both sides of the through hole below one source electrode SE. The two gate electrodes GE are disposed on both sides of the through hole TH below the source electrode SE. As described above, two gate electrodes GE are disposed repetitively corresponding to the plurality of source electrodes.

In the same manner as in the first embodiment, the plurality of drain electrodes DE are coupled by a drain pad DP and the plurality of source electrodes SE are coupled by a source pad SP.

The through hole TH is disposed below the source electrode SE. An electroconductive film is filled in the through hole TH to form the coupling portion VIA. Accordingly, the source electrode SE and the potential fixing layer VC are electrically coupled by way of the coupling portion VIA (FIG. 28). A protective film (also referred to as an insulation film, a cover film, or a surface protective film) PRO is disposed over the source electrode SE and the drain electrode DE.

Respective materials forming the substrate S, the nucleation layer NUC, the buffer layer BU, the potential fixing layer VC, the channel underlayer UC, the channel layer (also referred to as an electron transport layer) CH, the barrier layer BA, the cap layer CP, and the insulation layer IF1 are as described in the first embodiment.

Respective materials forming the gate insulation film GI, the gate electrode GE, the interlayer insulation film IL1, and the protective film PRO are as described in the first embodiment.

Respective materials forming the source electrode SE, the drain electrode DE, the source pad SP, the drain pad DP, and the coupling portion VIA are as described in the first embodiment.

[Description of Manufacturing Method]

Then, a method of manufacturing the semiconductor device of this embodiment is to be descried and the configuration of the semiconductor device is made clearer with reference to FIG. 29 to FIG. 34. FIG. 29 to FIG. 34 are cross sectional views or plan views illustrating the steps of manufacturing the semiconductor device of this embodiment.

Figure 29:
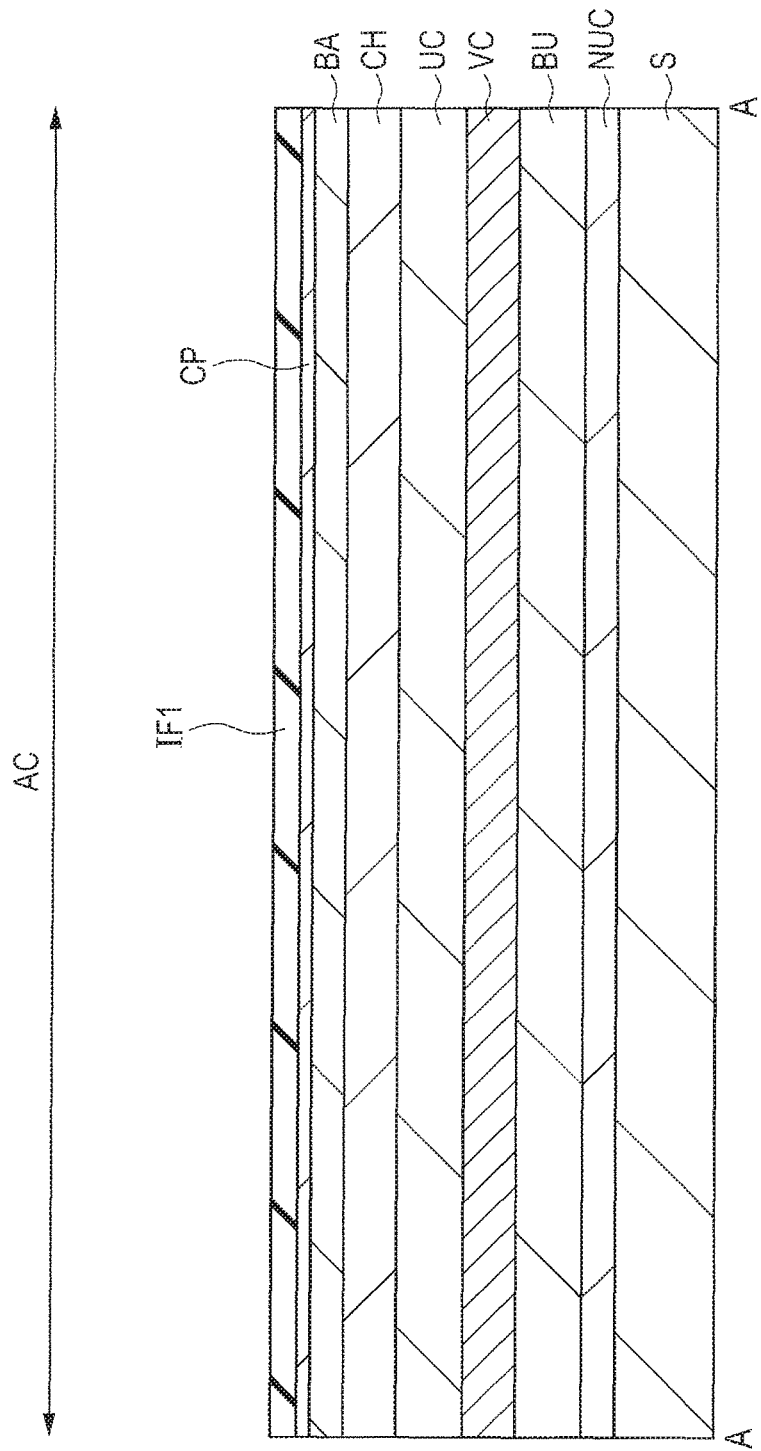
FIG. 29 is a cross sectional view illustrating a manufacturing step of the semiconductor device according to the second embodiment.

As illustrated in FIG. 29, a nucleation layer NUC and a buffer layer BU are formed successively above a substrate S. They can be formed by using the materials described in the first embodiment and can be formed in the same manner as in the first embodiment.

Then, for example, a gallium nitride layer containing a p-type impurity (p-GaN layer) is heteroepitaxially grown as a potential fixing layer VC over the buffer layer BU by using, for example, a metal organic chemical vapor deposition method. For example, magnesium (Mg) is used as the p-type impurity. For example, a gallium nitride layer is deposited to about 200 nm while being doped with magnesium (Mg). The Mg concentration in the deposition film is, for example, about $5 \times 10^{18}$ (5E18) $cm^{-3}$.

Then, a channel underlayer UC, a channel layer CH, a barrier layer BA, a cap layer CP, and an insulation film IF1 are formed successively over the potential fixing layer VC. They can be formed by using the materials described in the first embodiment and can be formed in the same manner as in the first embodiment. Then, a device isolation region (ISO) is formed in the same manner as in the first embodiment.

Figure 30:
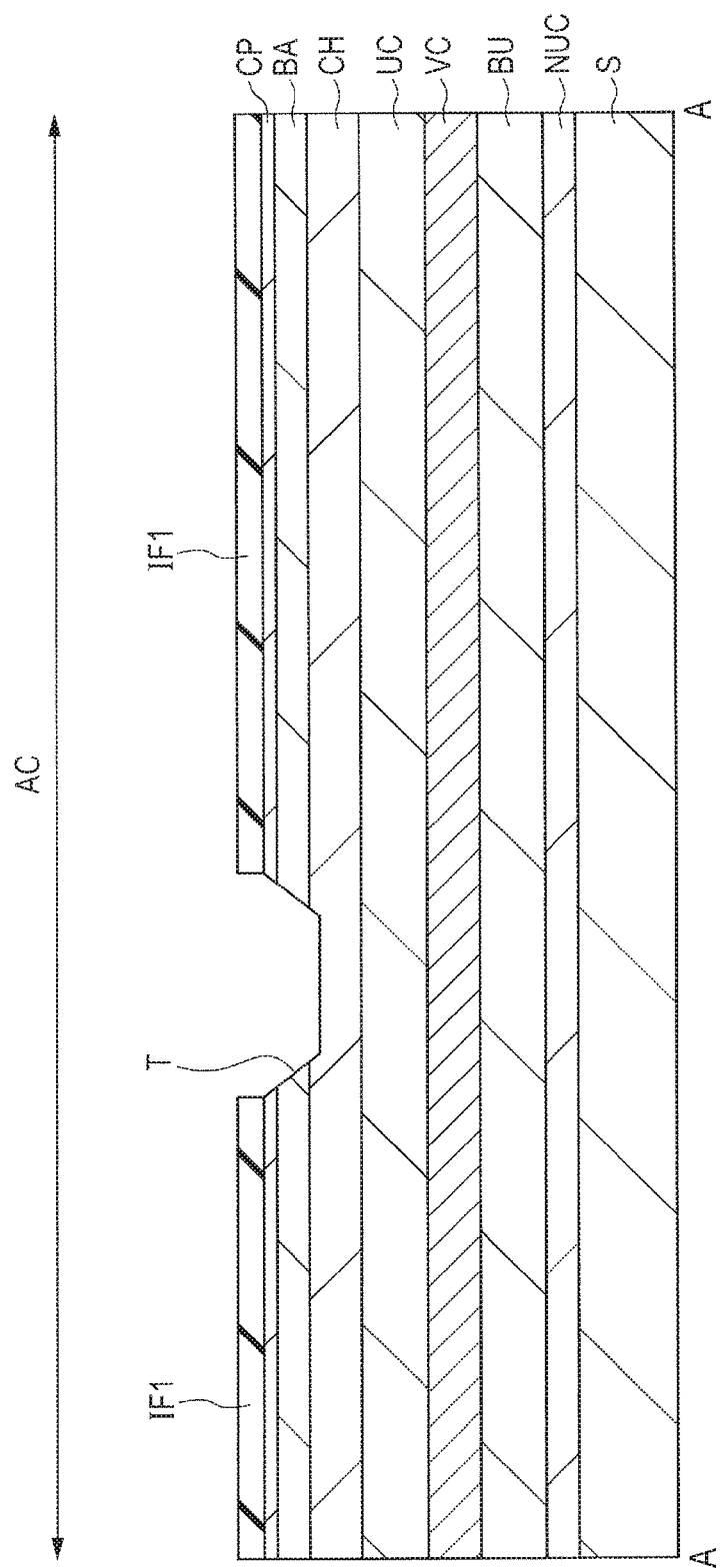
FIG. 30 is a cross sectional view illustrating a manufacturing step of the semiconductor device according to the second embodiment, which is a cross sectional view illustrating a manufacturing step succeeding to FIG. 29.

Then, as illustrated in FIG. 30, an opening is formed in a gate electrode forming region of the insulation film IF1 and the cap layer CP, the barrier layer BA, and the channel layer CH are dry etched using the insulation film IF1 as a mask, thereby forming a trench T that penetrates the cap layer CP, and the barrier layer BA and reaches as far as the middle of the channel layer CH. In this step, a trench for a gate line GL (GLT) is formed in a device isolation region (ISO).

Figure 31:
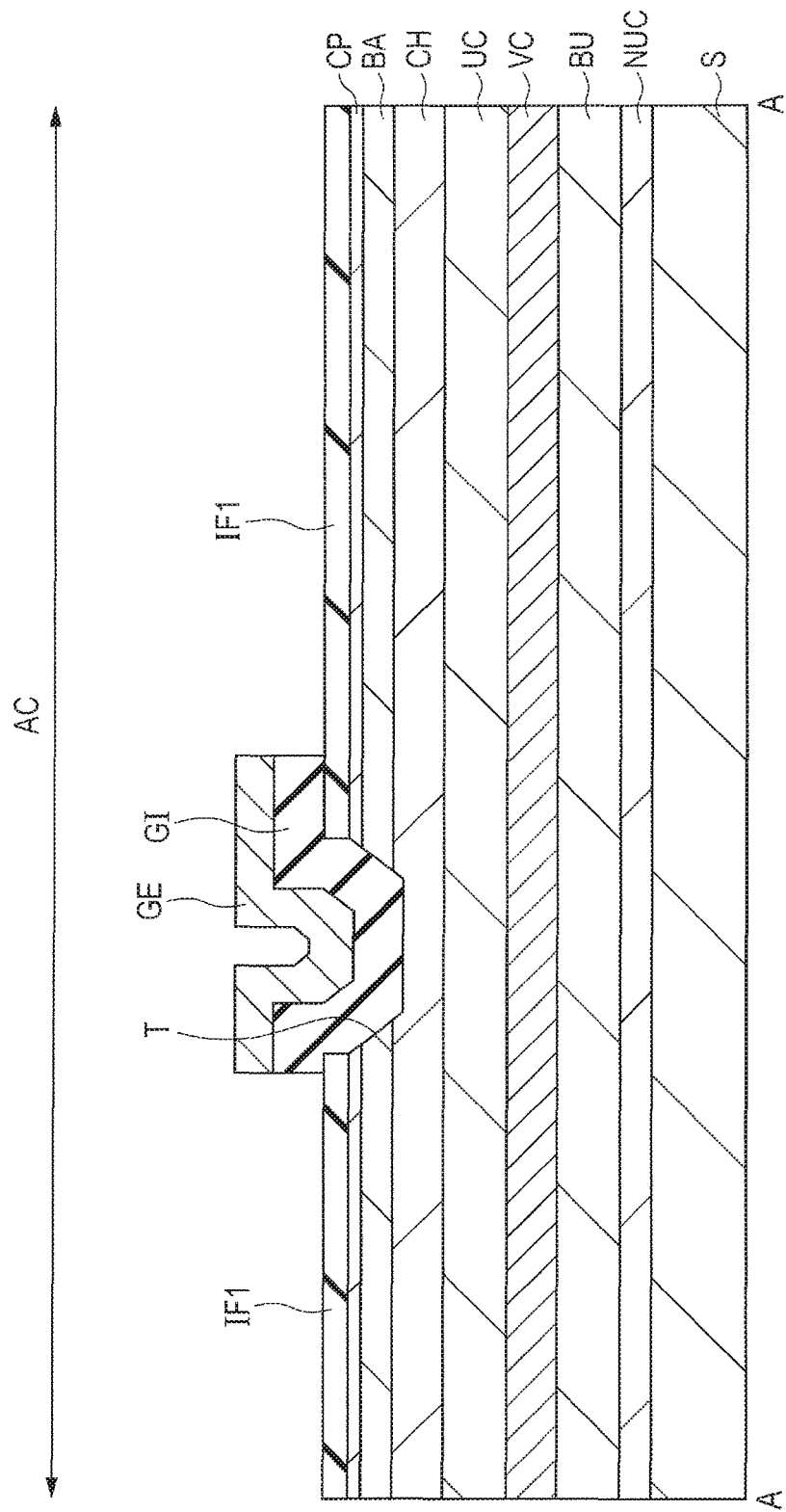
FIG. 31 is a cross sectional view illustrating a manufacturing step of the semiconductor device according to the second embodiment, which is a cross sectional view illustrating a manufacturing step succeeding to FIG. 30.

Then, as illustrated in FIG. 31, a gate electrode GE is formed by way of a gate insulation film GI over the insulation film IF1 including the inside of the trench T. The gate insulation film GI and the gate electrode GE can be formed by using the materials described in the first embodiment in the same manner as in the first embodiment.

Figure 32:
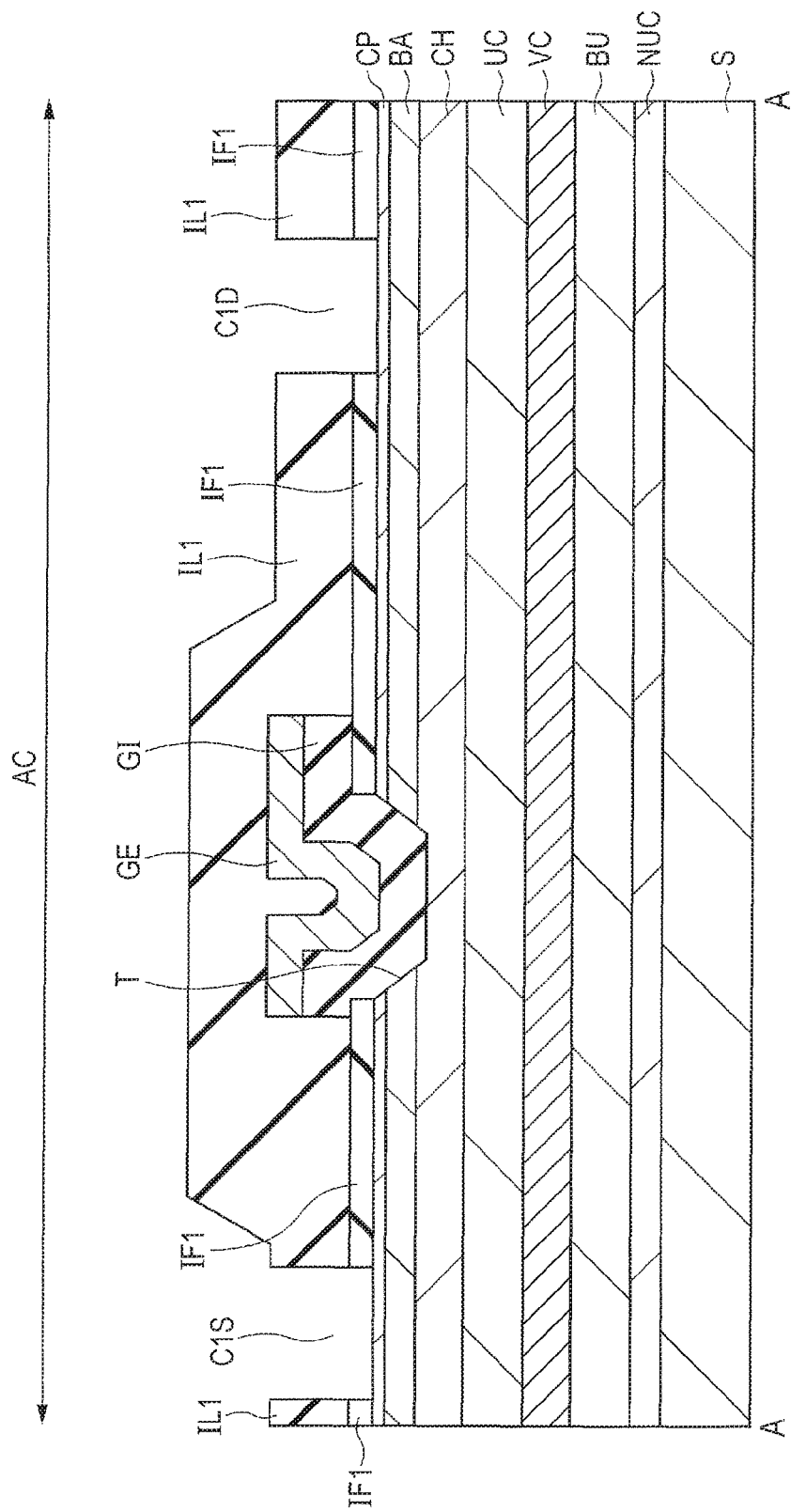
FIG. 32 is a cross sectional view illustrating a manufacturing step of the semiconductor device according to the second embodiment, which is a cross sectional view illustrating a manufacturing step succeeding to FIG. 31.

Then, as illustrated in FIG. 32, an interlayer insulation film IL1 is formed over the insulation film IF1 including a portion over the gate electrode GE in the same manner as in the first embodiment.

Figure 33:
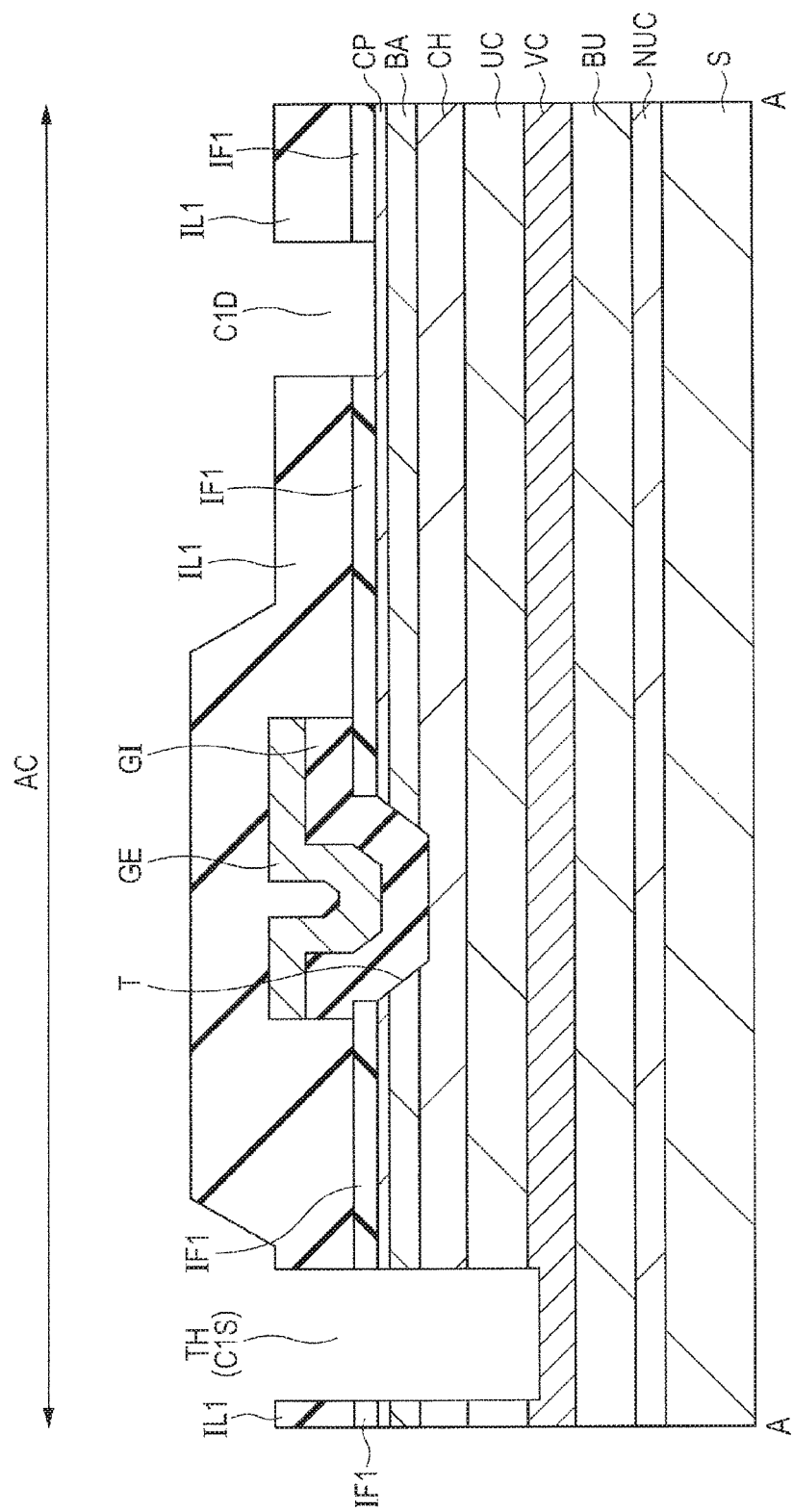
FIG. 33 is a cross sectional view illustrating a manufacturing step of the semiconductor device according to the second embodiment, which is a cross sectional view illustrating a manufacturing step succeeding to FIG. 32.

Then, a contact hole C1D and a through hole TH are formed in the interlayer insulation film IF1 and the insulation film IF1 (FIG. 33).

For example, a first photoresist film having openings in a source electrode coupling region and a drain electrode coupling region respectively is formed over the interlayer insulation film IL1. Then, the interlayer insulation film IL1 and the insulation film IF1 are etched by using the first photoresist film as a mask, thereby forming contact holes C1S and C1D (FIG. 32). Then, after removing the first photoresist film, a second photoresist film having an opening above the first contact hole C1S is formed over the interlayer insulation film IL1 including the inside of the contact hole C1D. Then, the cap layer CP, the barrier layer BA, the channel layer CH, the channel underlayer UC, and a portion of the potential fixing layer are etched by using the second photoresist film as a mask, thereby forming a through hole TH. In other words, a through hole TH that penetrates the cap layer CP, the barrier layer BA, the channel layer CH, the channel underlayer UC, and reaches as far as the middle of the potential fixing layer VC is formed (FIG. 33). Etching is performed such that the bottom of the through hole TH is in the potential fixing layer VC and situated below the bottom of the device isolation region (ISO).

In a case of using a silicon oxide film as the interlayer insulation film IL1 and using a silicon nitride film as the insulation film IF1, the films are removed first by dry etching using, for example, a dry etching gas containing a fluorine gas such as $SF_6$. Then, the cap layer (GaN layer) CP, the barrier layer (AlGaN layer) BA, and the channel layer (GaN layer) CH, the channel underlayer (AlGaN layer) UC and as far as the middle of the potential fixing layer (pGaN layer) VC are removed by dry etching using a dry etching gas containing, for example, a chlorine gas such as $BCl_3$.

The order of forming the contact hole C1D and the through hole TH are not restricted only to that described above, but the contact hole C1D may also be formed after faulting the through hole. Further, after removing the interlayer insulation film IL1 in the source electrode region and the drain electrode coupling region, the insulation film IF1, the barrier layer BA, the channel layer CH, the channel underlayer UC, and as far as the middle of the potential fixing layer VC may be removed and, further, the insulation film IF1 in the drain electrode coupling region may be removed. As described above, various steps can be adopted for the step of forming the contact hole C1D and the through hole TH.

The cap layer CP is exposed at the bottom of the contact hole C1D and the potential fixing layer VC is exposed at the bottom of the through hole TH which are formed by the steps described above.

Figure 34:
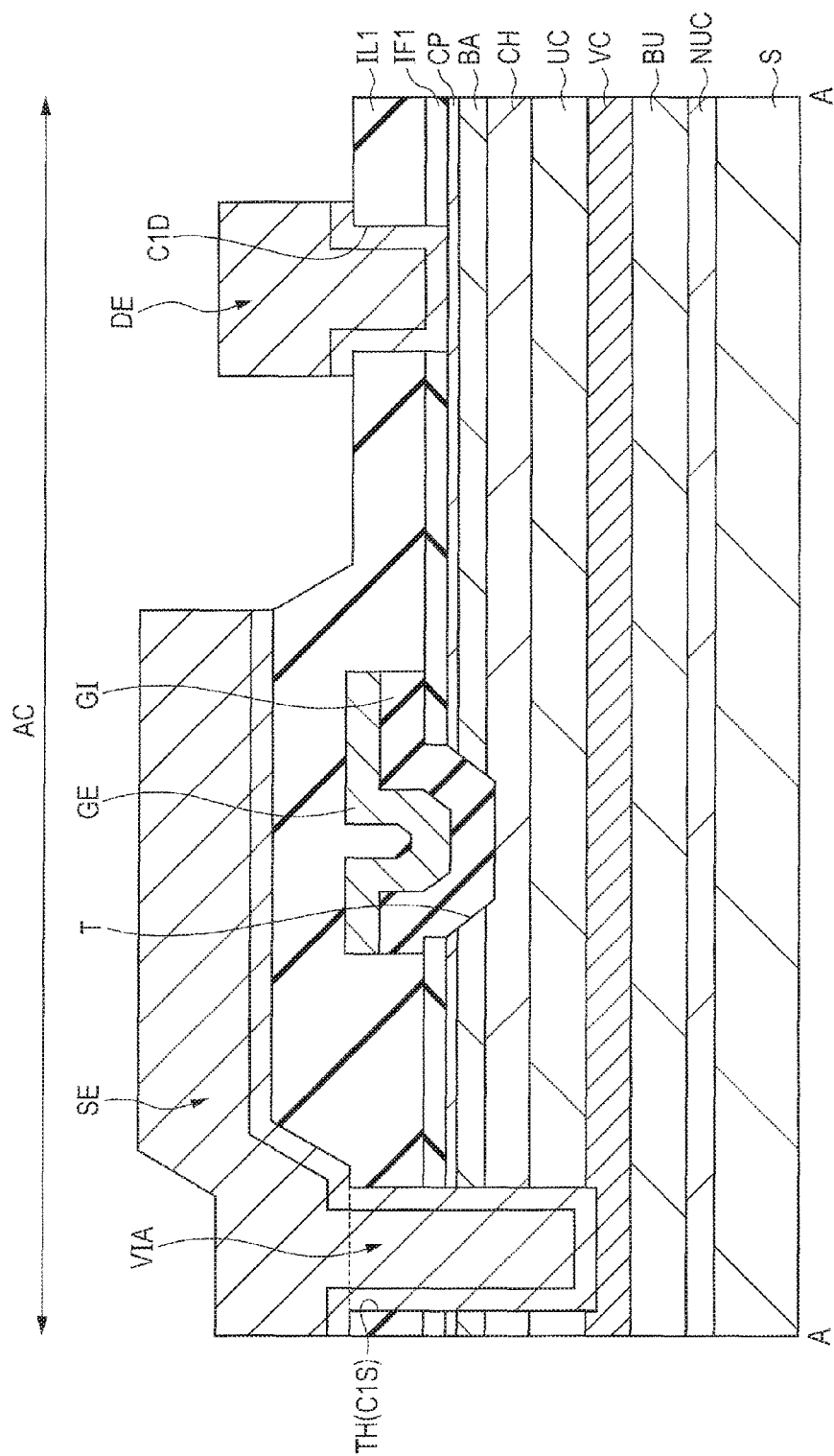
FIG. 34 is a cross sectional view illustrating a manufacturing step of the semiconductor device according to the second embodiment, which is a cross sectional view illustrating a manufacturing step succeeding to FIG. 33.

Then, as illustrated in FIG. 34, an electroconductive film is formed over the interlayer insulation film IL1 including the inside of the contact hole C1D and the through hole TH, thereby forming the source electrode SE, the drain electrode DE, the source pad (SP), the drain pad (DP), and the coupling portion VIA. They can be formed by using the materials described in the first embodiment and can be formed in the same manner as in the first embodiment.

Then, in the same manner as in the first embodiment, a protective film PRO is formed over the interlayer insulation film IL1 including a region over the source electrode SE, the drain electrode DE, the source pad (SP), and drain pad (DP) (FIG. 28).

With the steps described above, the semiconductor device of this embodiment can be formed. The steps described above are only an example and the semiconductor device of this embodiment may also be manufactured by other steps than those described above.

As described above, according to this embodiment, since the potential fixing layer VC as an electroconductive layer is disposed between the buffer layer BU and channel layer CH and coupled with the source electrode SE, fluctuation of the characteristics of the semiconductor element can be decreased. That is, the potential fixing layer VC can prevent the effect caused by the change of potential due to the change of amount of charges in the layers below the potential fixing layer VC (for example, buffer layer BU, etc.) from exerting as far as on the channel layer CH. This can reduce the fluctuation of the characteristics such as the threshold voltage and the on-resistance.

While the p-type nitride semiconductor layer is used as the potential fixing layer VC in this embodiment, an n-type nitride semiconductor layer may also be used. For example, silicon (Si) can be used as the n-type impurity. Since the n-type impurity has good concentration controllability and high activation ratio, the potential can be fixed more effectively. On the other hand, when the p-type nitride semiconductor layer is used, the potential fixing layer VC is depleted to form a high resistance layer when a positive voltage (positive bias) is applied to the drain electrode DE. This can improve the drain breakdown voltage.

In this embodiment, since the coupling portion VIA is disposed in the active region AC where electrons are conducted, the potential can be fixed more effectively.

Third Embodiment

While recessed gate semiconductor devices are shown as an example in the first and the second embodiments, a semiconductor device of other configurations may also be used. For example, a junction type semiconductor device in which a gate junction layer is disposed below the gate electrode may also be used as in this embodiment.

A semiconductor device of this embodiment is to be described specifically with reference to the drawings.
[Description of Structure]

Figure 35:
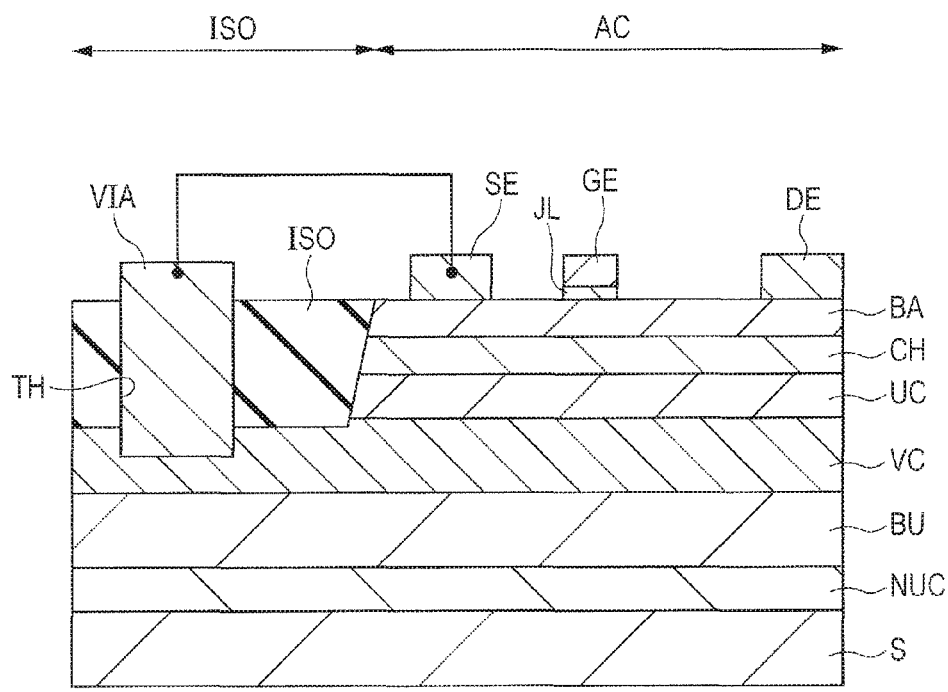
FIG. 35 is a cross sectional view schematically illustrating a configuration of a semiconductor device according to a third embodiment.

FIG. 35 is a cross sectional view schematically illustrating the configuration of a semiconductor device of this embodiment. The semiconductor device (semiconductor element) of this embodiment is a transistor using nitride semiconductors. The semiconductor device can be used as a high electron mobility transistor (HEMT) type power transistor.

In the semiconductor device of this embodiment, a nucleation layer NUC, a buffer layer BU, a potential fixing layer VC, a channel underlayer UC, a channel layer (also referred to as an electron transport layer) CH, and a barrier layer BA are formed successively above a substrate S in the same manner as in the first embodiment. The nucleation layer NUC comprises a nitride semiconductor layer. The buffer layer BU comprises one or a plurality of nitride semiconductor layers with addition of an impurity to form a deep energy level to the nitride semiconductor. In this embodiment, a super lattice structure comprising a plurality of nitride semiconductor layers is used. The potential fixing layer VC comprises a nitride semiconductor layer with addition of a p-type impurity to the nitride semiconductor and has electroconductivity. A channel underlayer UC comprises a nitride semiconductor layer having an electron affinity smaller than that of the channel layer CH and an average lattice constant in the direction of the substrate surface smaller than that of the channel layer CH. The channel layer CH comprises a nitride semiconductor layer having an electron affinity larger than that of the channel underlayer UC. The barrier layer BA comprises a nitride semiconductor layer having an electron affinity smaller than that of the channel layer CH and an electron affinity smaller than that of the channel underlayer UC.

The semiconductor element of this embodiment has a gate electrode GE formed by way of a gate junction layer JL over the barrier layer BA, and a source electrode SE and a drain electrode DE formed over the barrier layer BA on both sides of the gate electrode GE. The semiconductor element is formed in an active region AC partitioned by a device isolation region ISO. A p-type impurity is added to the gate junction layer JL. Further, the gate junction layer JL and the gate electrode GE are preferably in ohmic contact relative to holes.

While a 2-dimensional electron gas (2DEG) is formed near the interface between the channel layer CH and the barrier layer BA on the side of the channel layer CH, since the conduction band of the channel layer CH is raised by negative charges due to ionization of acceptors below the gate junction layer JL, the two dimensional electron gas (2DEG) is not formed. Accordingly, in the semiconductor device of this embodiment, an off-state can be maintained in a state where a positive voltage (threshold voltage) is not applied to the gate electrode GE and an on-state can be maintained in a state where a positive voltage (threshold voltage) is applied to the gate electrode GE. As described above, normally off operation can be performed.

In this embodiment, a coupling portion (also referred to as a via) VIA that penetrates the device isolation region ISO and reaches as far as the potential fixing layer VC therebelow is disposed, and the coupling portion VIA is electrically coupled with the source electrode SE. By disposing the potential fixing layer VC and coupling the same to the source electrode SE, fluctuation of the characteristics such as the threshold voltage and the on-resistance can be reduced as will be described specifically.

FIG. 36 to FIG. 40 are cross sectional views illustrating steps for manufacturing the semiconductor device of this embodiment. In FIG. 36 to FIG. 40, the semiconductor device of the third embodiment is to be described further with reference to FIG. 39 and FIG. 40 which are cross sectional views illustrating the final step. The plan view of the semiconductor device of this embodiment is identical with that of the first embodiment (FIG. 2) except for the trench (T, GLT). For example, FIG. 39 corresponds to the cross section A-A in FIG. 2 and FIG. 40 corresponds to the cross section B-B in FIG. 2. In this embodiment, since other configurations than those for the gate electrode portion are identical with those of the first embodiment, detailed descriptions for the configurations identical with those of the first embodiment are omitted.

Figure 39:
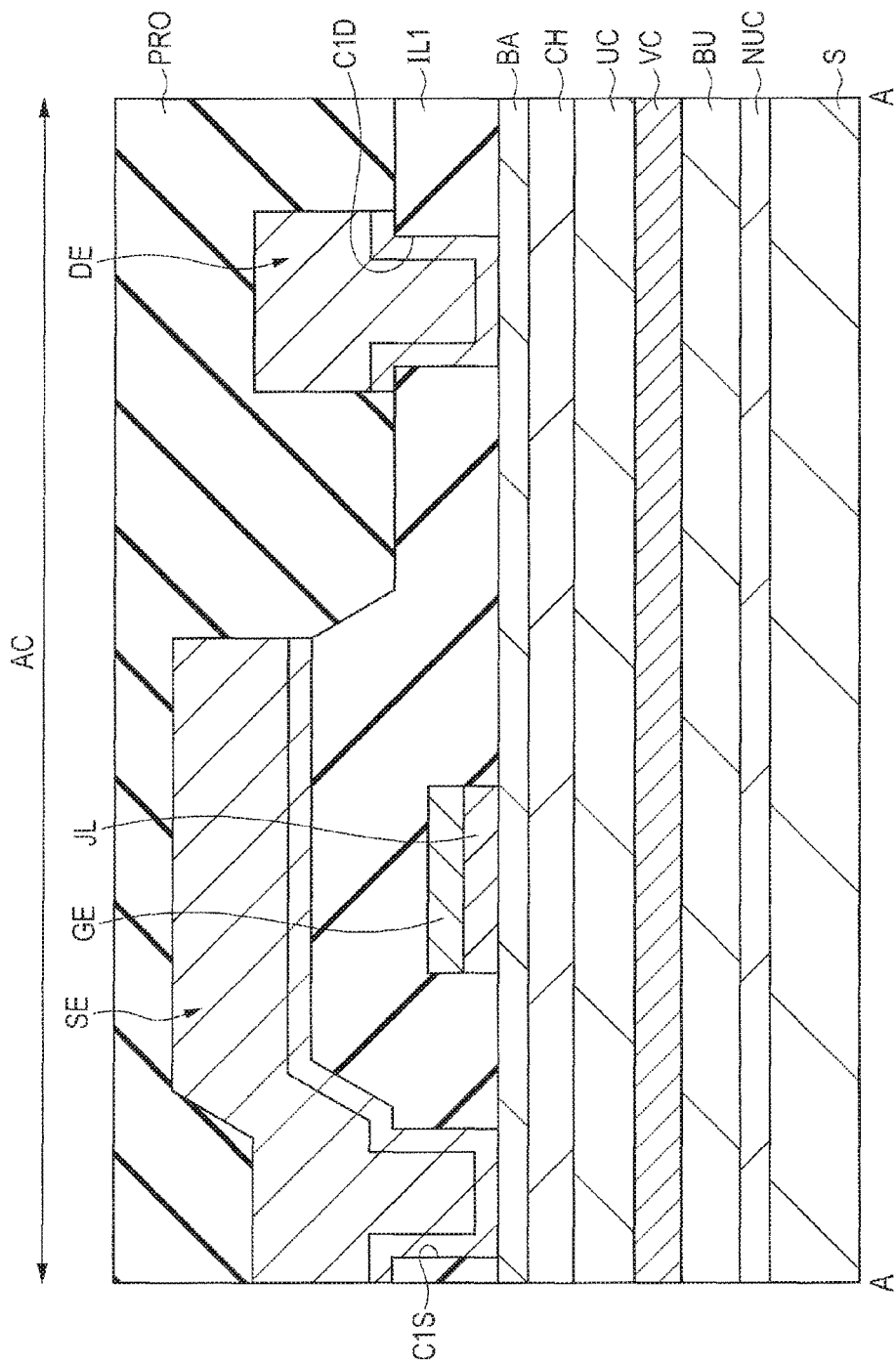
FIG. 39 is a cross sectional view illustrating a manufacturing step of the semiconductor device according to the third embodiment, which is a cross sectional view illustrating a manufacturing step succeeding to FIG. 38.
Figure 40:
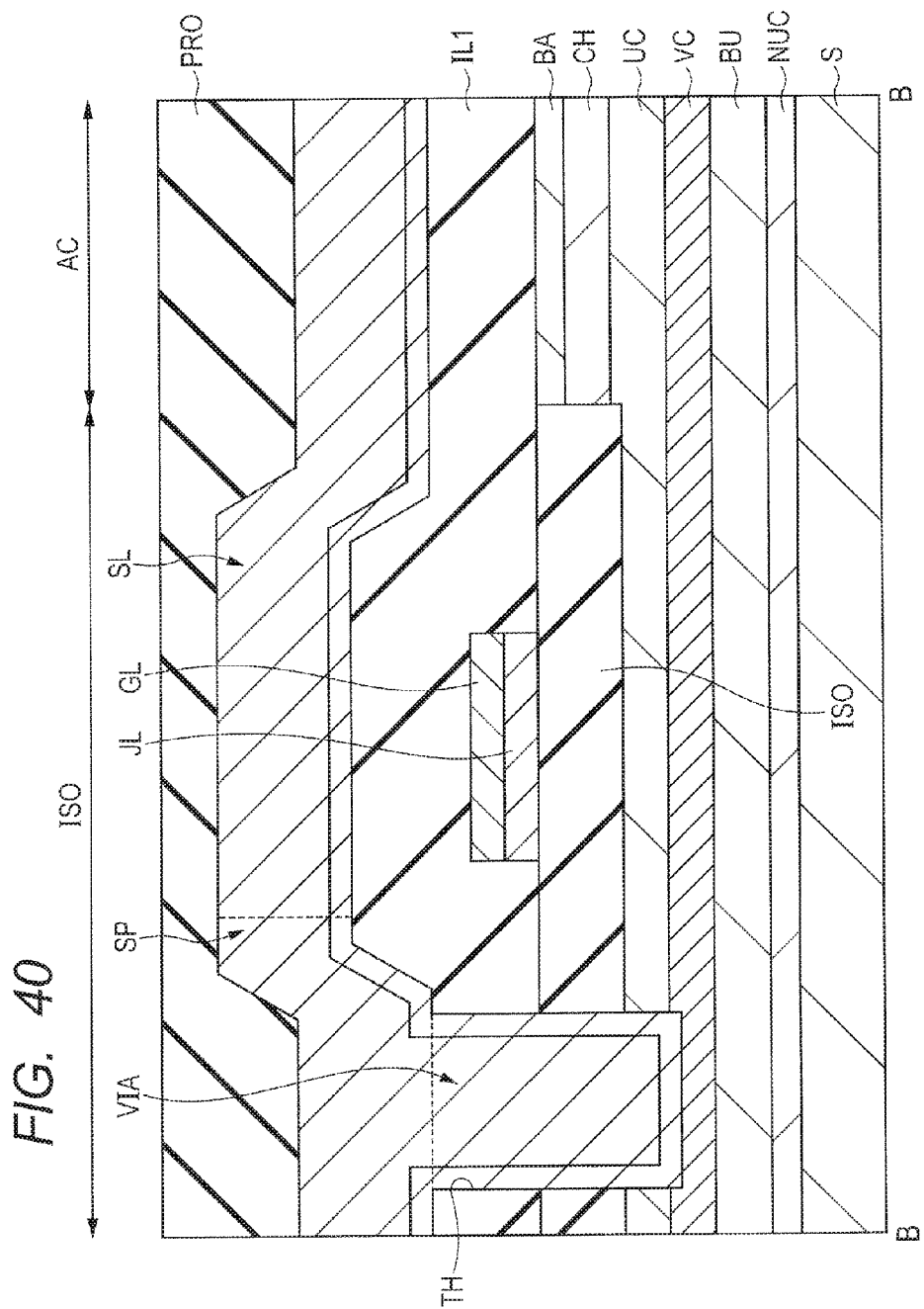
FIG. 40 is a cross sectional view illustrating a manufacturing step of the semiconductor device according to the third embodiment, which is a cross sectional view illustrating a manufacturing step succeeding to FIG. 39.

As illustrated in FIG. 39 and FIG. 40, in the semiconductor device of this embodiment, a nucleation layer NUC, a buffer layer BU, a potential fixing layer VC, a channel underlayer UC, a channel layer (also refer to as an electron transport layer) CH, and a buffer layer BA are formed successively above a substrate S. The semiconductor element of this embodiment has, over the barrier layer BA, a gate electrode GE formed by way of a gate junction layer JL, and a source electrode SE and a drain electrode DE formed over the barrier layer BA on both sides of the gate electrode GE. The semiconductor element is formed in an active region AC partitioned by a device isolation region ISO. A contact hole C1D as a coupling portion between the drain electrode DE and the barrier layer BA is disposed below the drain electrode DE. A contact hole C1S as a coupling portion between the source electrode SE and the barrier layer BA is disposed below the source electrode SE. The drain electrode DE is coupled with the drain pad DP and the source electrode SE is coupled with the source pad SP. Further, the gate electrode GE is coupled with the gate line GL (refer to FIG. 2).

The source electrode SE, the drain electrode DE, and the gate electrode GE are disposed mainly over the active region AC surrounded by the device isolation region ISO. On the other hand, the drain pad DP, the gate line GL and the source pad SP are disposed over the device isolation region ISO (refer to FIG. 2).

A through hole TH is disposed below the source pad SP. An electroconductive film is filled in the through hole TH to form a coupling portion VIA. As will be described later, the coupling portion WA is electrically coupled with the potential fixing layer VC. Accordingly, the source electrode SE and the potential fixing layer VC are electrically coupled by way of the source pad SP and the coupling portion VIA. Further, a protective film (also referred to as an insulation film, a cover film, or a surface protective film) PRO is disposed over the source electrode SE and the drain electrode DE.

Respective materials for forming the substrate S, the nucleation layer NUC, the buffer layer BU, the potential fixing layer VC, the channel underlayer UC, the channel layer (also referred to as an electron transport layer) CH and the barrier layer BA are as described in the first embodiment.

For example, a GaN layer can be used as the gate junction layer JL. Further, while the GaN layer can be formed to a desired thickness in accordance with the intended characteristics and it is, for example, about 50 nm. As the material for the gate junction layer JL, AlN, InN, etc. can be used in addition to GaN. For the gate junction layer JL, a p-type impurity is added preferably. The p-type impurity includes, for example, Be, C, and Mg.

Respective materials for forming the gate electrode GE, the interlayer insulation film ILL and the protective film PRO are as described in the first embodiment.

Respective materials for forming the source electrode SE, the drain electrode DE, the source pad SP, the drain pad DP and the coupling portion VIA are as described in the first embodiment.

(Description of Manufacturing Method)

Then, a method of manufacturing the semiconductor device of this embodiment is to be described and the configuration of the semiconductor device is made clearer with reference to FIG. 36 to FIG. 40.

Figure 36:
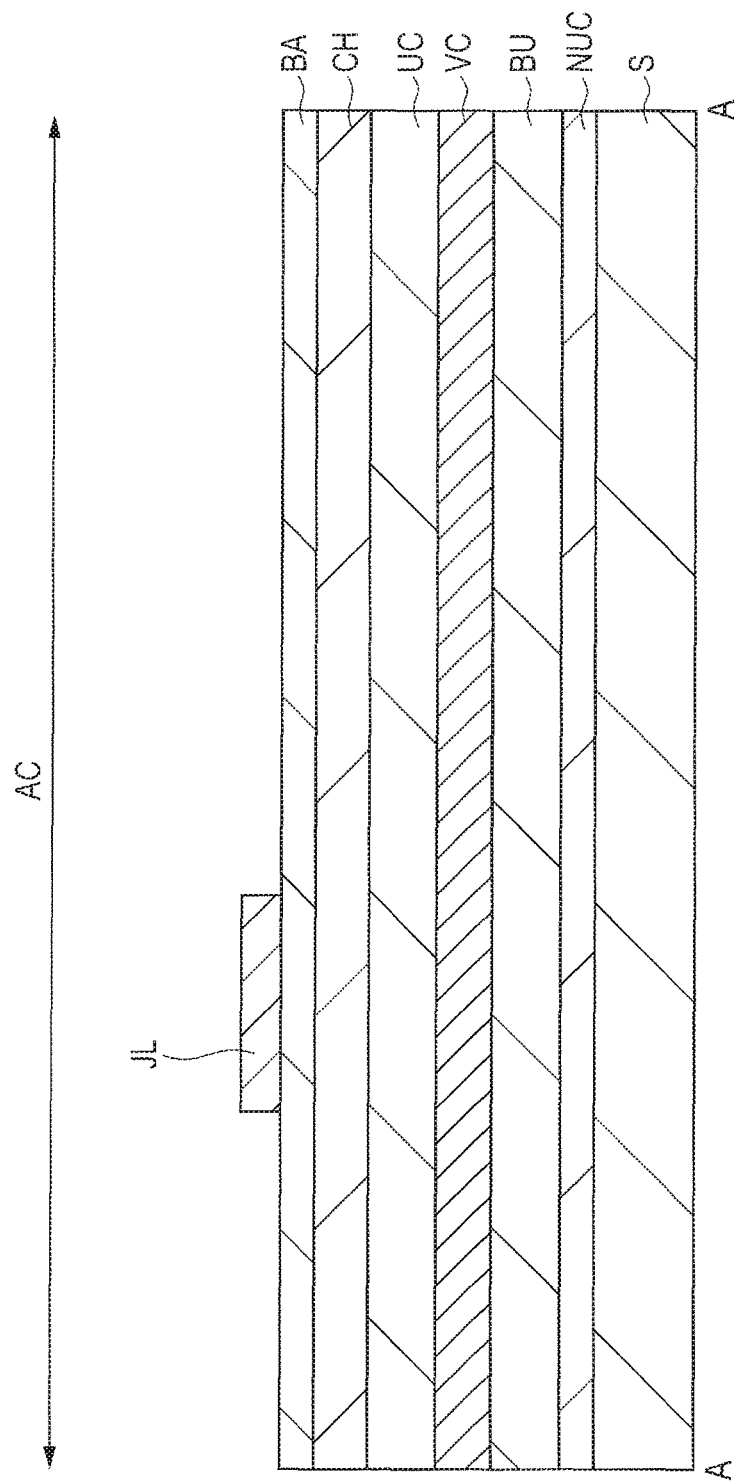
FIG. 36 is a cross sectional view illustrating a manufacturing step of the semiconductor device according to the third embodiment.

As illustrated in FIG. 36, the nucleation layer NUC and the buffer layer BU are formed successively above the substrate S. They can be formed by using the materials described in the first embodiment and can be formed in the same manner as in the first embodiment.

Then, for example, a gallium nitride layer containing a p-impurity (p-GaN layer) is heteroepitaxially grown as a potential fixing layer VC over the buffer layer BU by using, for example, the organic metal vapor deposition method. For example, magnesium (Mg) is used as the p-type impurity. A gallium nitride layer is deposited to about 200 nm while being doped, for example, with magnesium (Mg). The Mg concentration in the deposited film is, for example, about $5 \times 10^{18}$ (5E18) cm$^{-3}$.

Then, the channel underlayer UC, the channel layer CH, and the barrier layer BA are formed successively over the potential fixing layer VC. They can be formed by using the materials described in the first embodiment and can be formed in the same manner as in the first embodiment. Then, a device isolation region ISO is formed in the same manner as in the first embodiment.

Then, for example, a gallium nitride layer containing a p-type impurity (p-GaN layer) is heteroepitaxially grown as a gate junction layer JL over the barrier layer BA by using, for example, the organic metal vapor phase deposition method. For example, magnesium (Mg) is used as the p-type impurity. A gallium nitride layer is deposited to about 50 nm while being doped, for example, with magnesium (Mg).

Then, a photoresist having an opening for a gate forming region is formed over the gate junction layer JL and the gate junction layer JL is dry etched by using the photoresist film as a mask.

Figure 37:
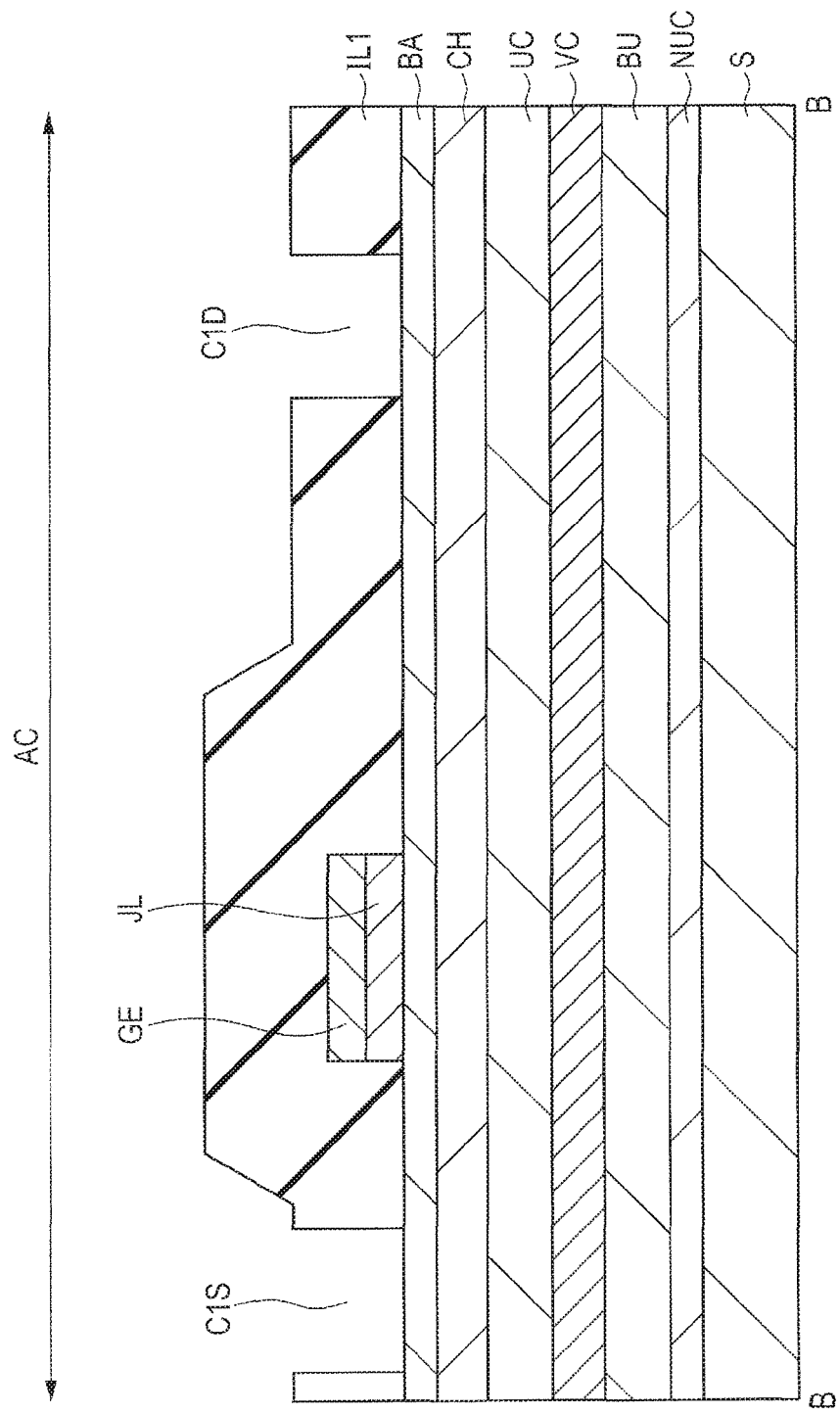
FIG. 37 is a cross sectional view illustrating a manufacturing step of the semiconductor device according to the third embodiment, which is a cross sectional view illustrating a manufacturing step succeeding to FIG. 36.
Figure 38:
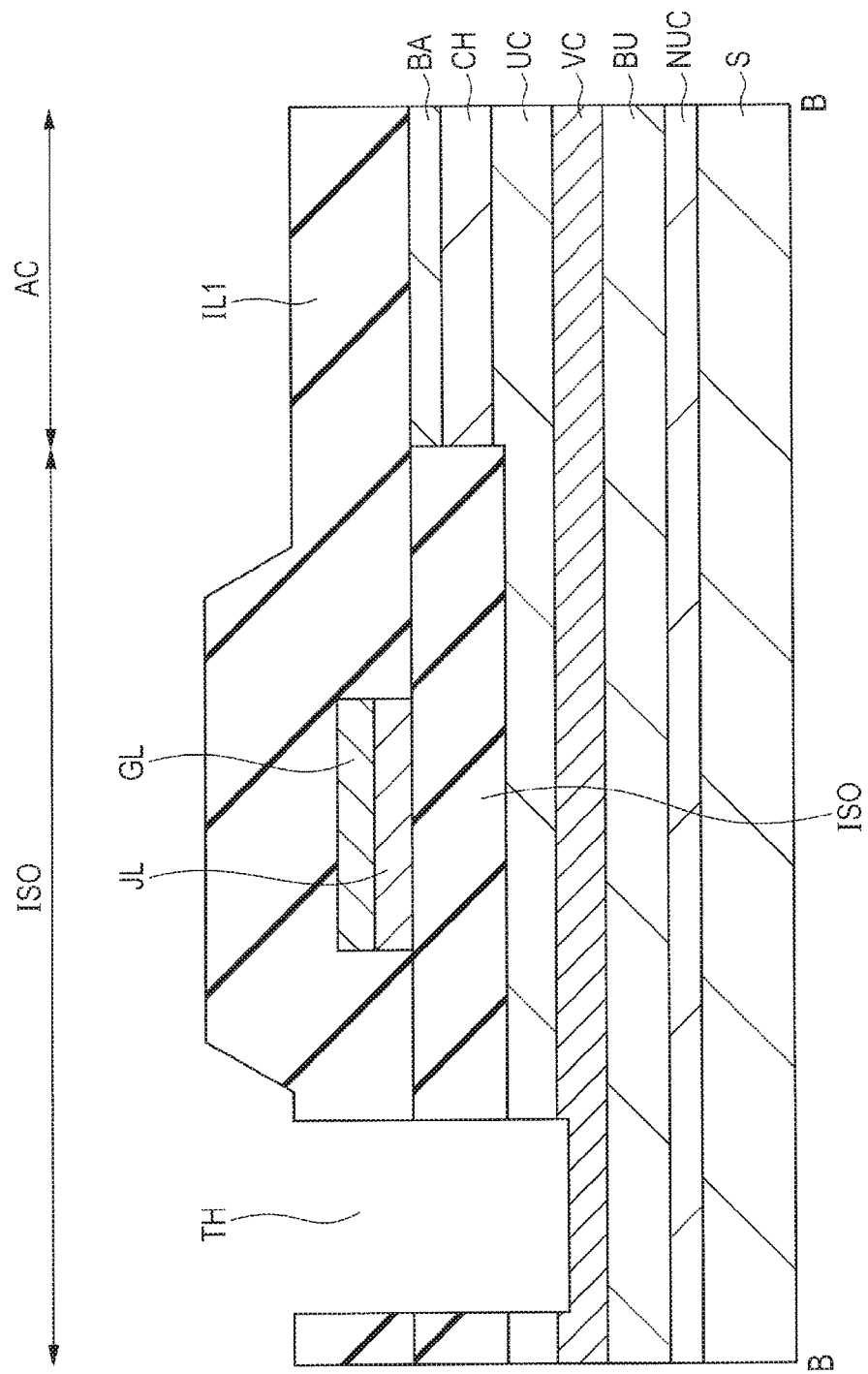
FIG. 38 is a cross sectional view illustrating a manufacturing step of the semiconductor device according to the third embodiment, which is a cross sectional view illustrating a manufacturing step succeeding to FIG. 37.

Then, as illustrated in FIG. 37 and FIG. 38, a gate electrode GE is formed over the gate junction layer JL. For example, a TiN (titanium nitride) film is deposited as an electroconductive film to a thickness of about 200 nm over the gate junction layer JL by using, for example, a sputtering method. Then, the TiN film is etched, thereby forming a gate electrode GE.

Then, the interlayer insulation film IL1 is formed over the barrier layer BA including a portion over the gate electrode GE in the same manner as in the first embodiment.

Then, the contact holes C1S and C1D, and the through hole TH are formed in the interlayer insulation film IL1 in the same manner as in the first embodiment.

The barrier layer BA is exposed at the bottom of the contact holes C1S and C1D and the potential fixing layer VC is exposed at the bottom of the through hole TH, which are formed in the steps described above.

Then, as illustrated in FIG. 39 and FIG. 40, a conductive film is formed over the interlayer insulation film IL1 including a region of the contact holes C1S, C1D and the through hole TH, thereby forming the source electrode SE, the drain electrode DE, the source pad SP, the drain pad (DP), and the coupling portion VIA. They can be formed by using the materials described in the first embodiment and can be formed in the same manner as in the first embodiment.

Then, a protective film PRO is formed over the interlayer insulation film IL1 including a region over the source electrode SE, the drain electrode DE, the source pad SP and the drain pad (DP) in the same manner as in the first embodiment.

With the steps described above, the semiconductor device of this embodiment can be formed. The steps described above are only an example and the semiconductor device of this embodiment may also be manufactured by the steps other than those described above.

As described above, according to this embodiment, since the potential fixing layer VC as an electroconductive layer is disposed between the buffer layer BU and channel layer CH and coupled with the source electrode SE, fluctuation of the characteristics of the semiconductor element can be reduced. That is, the potential fixing layer VC can prevent the effect caused by the change of potential due to the change of amount of charges in the layers below the potential fixing layer VC (for example, buffer layer BU, etc.) from exerting as far as on the channel layer CH. This can reduce the fluctuation of the characteristics such as the threshold voltage and the on-resistance.

In this embodiment, while the p-type nitride semiconductor layer is used as the potential fixing layer VC, an n-type nitride semiconductor layer may also be used. For example, silicon (Si) can be used as the n-type impurity. Since the n-type impurity has good concentration controllability and high activation ratio, the potential can be fixed more effectively. On the other hand, when the p-type nitride semiconductor layer is used, the potential fixing layer VC is depleted to form a high resistance layer when a positive voltage (positive bias) is applied to the drain electrode DE. This can improve the drain breakdown voltage.

Further, in this embodiment, since the coupling portion VIA in the through hole TH is disposed in the device isolation region ISO outside the active region AC where electrons are conducted and below the region forming the source pad SP, the semiconductor device can be refined in the size and integrated at higher degree. Further, since a large active region AC can be ensured in which the electrons can be conducted, the on-resistance per unit area can be decreased.

Fourth Embodiment

In the third embodiment, the coupling portion VIA is disposed in the device isolation region ISO, but the coupling portion VIA may be disposed also in the active region AC. For example, in this embodiment, the coupling portion VIA is disposed below the source electrode SE.

Figure 41:
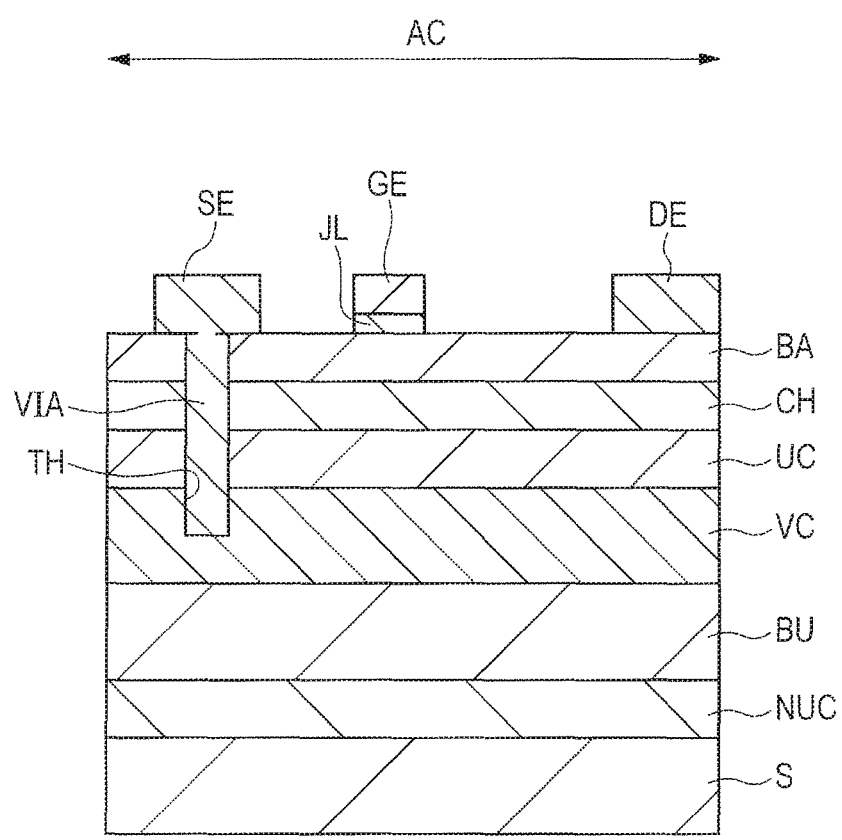
FIG. 41 is a cross sectional view schematically illustrating a configuration of a semiconductor device according to a fourth embodiment.

A semiconductor device of this embodiment is to be described specifically with reference to the drawings.
[Description of Structure]
FIG. 41 is a cross sectional view schematically illustrating the configuration of a semiconductor device of this embodiment. The semiconductor device (semiconductor element) of this embodiment is a transistor using nitride semiconductors. The semiconductor device can be used as a high electron mobility transistor (HEMT) type power transistor.

In the semiconductor device of this embodiment, a nucleation layer NUC, a buffer layer BU, a potential fixing layer VC, a channel underlayer UC, a channel layer (also referred to as an electron transport layer) CH, and a barrier layer BA are famed successively above a substrate S in the same manner as in the third embodiment. The nucleation layer NUC comprises a nitride semiconductor layer. The buffer layer BU comprises one or a plurality of nitride semiconductor layers with addition of an impurity to form a deep energy level to the nitride semiconductor. In this embodiment, a super lattice structure comprising a plurality of nitride semiconductor layers is used. The potential fixing layer VC comprises a nitride semiconductor layer with addition of a p-type impurity to the nitride semiconductor and has electroconductivity. A channel underlayer UC comprises a nitride semiconductor layer having an electron affinity smaller than that of the channel layer CH and an average lattice constant in the direction of the substrate surface smaller than that of the channel layer CH. The channel layer CH comprises a nitride semiconductor layer having an electron affinity larger than that of the channel underlayer UC. The barrier layer BA comprises a nitride semiconductor layer having an electron affinity smaller than that of the channel layer CH and an electron affinity smaller than that of the channel underlayer UC.

The semiconductor element of this embodiment, like the third embodiment, has a gate electrode GE formed by way of a gate junction layer JL over the barrier layer BA, and a source electrode SE and a drain electrode DE formed over the barrier layer BA on both sides of the gate electrode GE. The semiconductor element is formed in an active region AC partitioned by a device isolation region ISO. The gate junction layer JL comprises a nitride semiconductor layer having an electron affinity larger than that of the barrier layer BA. The gate junction layer JL and the gate electrode GE are preferably in a Schottky coupling.

In this embodiment, a coupling portion (also referred to as a via) VIA that penetrates the barrier layer BA, the channel layer CH, and the channel underlayer UC and reaches as far as the potential fixing layer VC therebelow is provided below the source electrode SE of the active region AC. The coupling portion VIA is electrically coupled with the source electrode SE. As described above, since the potential fixing layer VC is disposed and coupled with the source electrode SE, fluctuation of the characteristics such as the threshold voltage and the on-resistance can be reduced as has been described in the third embodiment. Further, since the coupling portion VIA is disposed in the active region AC in which electrons are conducted, the potential can be fixed more effectively.

Figure 42:
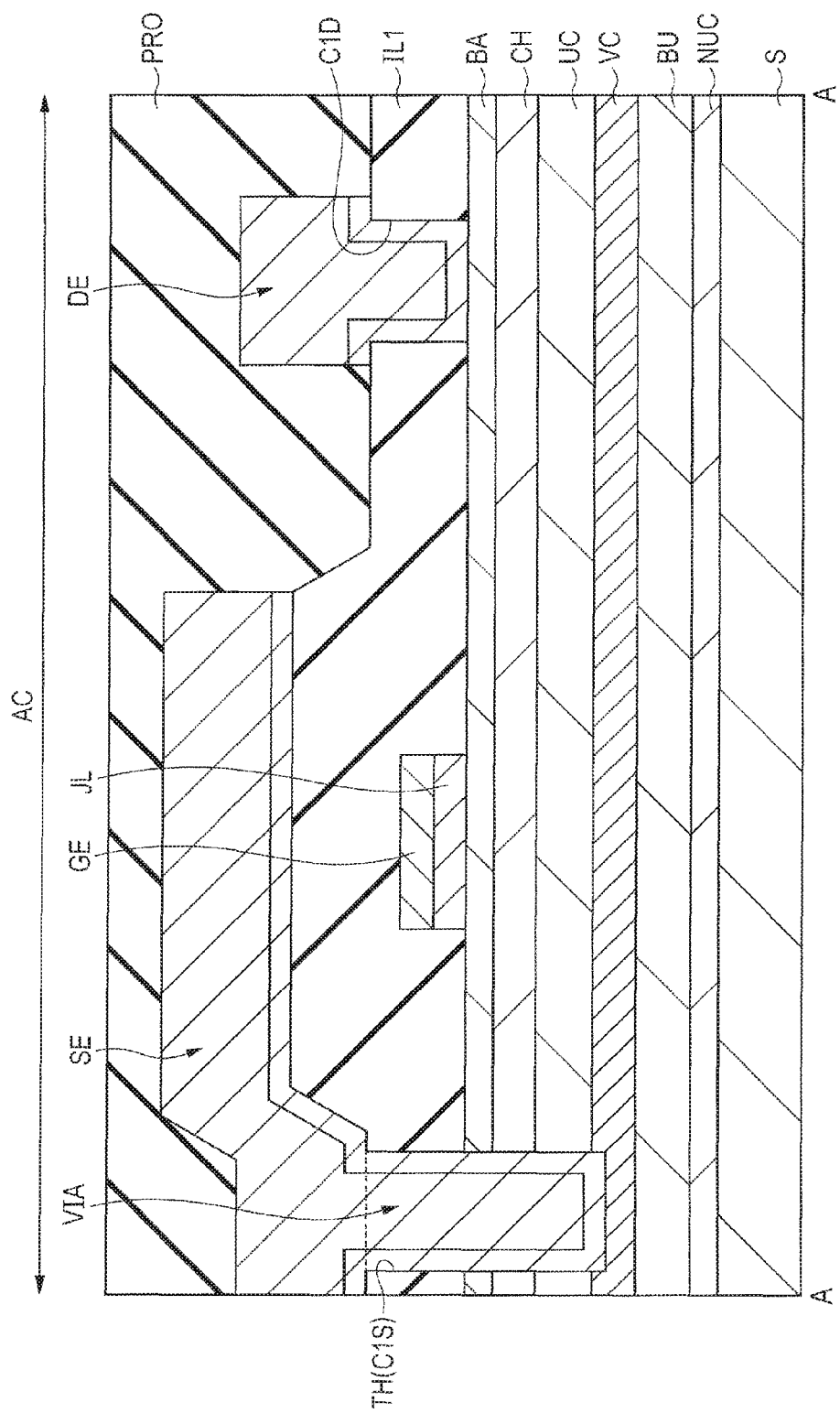
FIG. 42 is a cross sectional view illustrating a configuration of the semiconductor device according to the fourth embodiment.

The semiconductor device of the fourth embodiment is to be described further with reference to FIG. 42. FIG. 42 is a cross sectional view illustrating a configuration of the semiconductor device of this embodiment.

As illustrated in FIG. 42, in the semiconductor device of this embodiment, a nucleation layer NUC, a buffer layer BU, a potential fixing layer VC, a channel underlayer UC, a channel layer (also referred to as an electron transport layer) CH, and a barrier layer BA are formed successively above a substrate S. The semiconductor element of this embodiment has a gate electrode GE formed by way of a gate junction layer JL over the barrier layer BA, and a source electrode SE and a drain electrode DE formed over the barrier layer BA on both sides of the gate electrode GE. The semiconductor element is formed in an active region AC partitioned by a device isolation region ISO. A contact hole C1D as a coupling portion between the drain electrode DE and the barrier layer BA is disposed below the drain electrode DE. A coupling portion (also referred to as a via) VIA for electrically coupling the source electrode SE and the potential fixing layer VC is disposed below the source electrode SE. The coupling portion VIA is disposed inside the through hole TH. Accordingly, the source electrode SE and potential fixing layer VC are electrically coupled by way of the coupling portion VIA.

In the same manner as in the third embodiment, the drain electrode DE is coupled with a drain pad DP and the source electrode SE is coupled with a source pad SP. The gate electrode GE is coupled with the gate line GL (refer to FIG. 2). Further, the source electrode SE, the drain electrode DE, and the gate electrode GE are disposed mainly over the active region AC surrounded by the device isolation region ISO. On the other hand, the drain pad DP, the gate line GL, and the source pad SP are disposed over the device isolation region ISO (refer to FIG. 2).

A protective film (also referred to as an insulation film, a cover film, or a surface protective film) PRO is disposed over the source electrode SE and the drain electrode DE.

Respective materials for forming the substrate S, the nucleation layer NUC, the buffer layer BU, the potential fixing layer VC, the channel underlayer UC, the channel layer (also referred to as an electron transport layer) CH, and the barrier layer BA are as described in the first embodiment.

For example, a GaN layer can be used as the gate junction layer JL. The material for forming the gate junction layer JL is as described in the third embodiment.

Respective materials of the gate electrode GE, the interlayer insulation film ILL and the protective film PRO are as described in the first embodiment.

Respective materials for forming the source electrode SE, the drain electrode DE, the source pad SP, the drain pad DP, and the coupling portion VIA are as described in the first embodiment.

(Description of Manufacturing Method)
Then, a method of manufacturing the semiconductor device of this embodiment is to be described and the configuration of the semiconductor device is made clearer with reference to FIG. 42.

First, in the same manner as in the third embodiment, a nucleation layer NUC and a buffer layer BU are formed successively above a substrate S. Then, a potential fixing layer VC, a channel underlayer UC, a channel layer CH, a barrier layer BA, a gate junction layer JL, and a gate electrode GE are formed over the buffer layer BU in the same manner as in the third embodiment.

Then, contact hole C1D and a through hole TH are formed, for example, in the interlayer insulation film IL1 in the same manner as in the second embodiment.

The barrier layer BA is exposed at the bottom of the contact hole C1D and the potential fixing layer VC is exposed at the bottom of the through hole TH, which are formed in the steps described above.

Then, an electroconductive film is formed over the interlayer insulation film IL1 including a region of the contact hole C1D and the through hole TH, thereby forming the source electrode SE, the drain electrode DE, the source pad (SP), the drain pad (DP), and the coupling portion VIA. They can be formed by using the materials described in the first embodiment and can be formed in the same manner as in the first embodiment.

Then, a protective film PRO is formed over the interlayer insulation film IL1 including a region over the source electrode SE, the drain electrode DE, the source pad (SP) and the drain pad (DP) in the same manner as in the first embodiment.

With the steps described above, the semiconductor device of this embodiment can be formed. The steps described above are only an example and the semiconductor device of this embodiment may also be manufactured by the steps other than those described above.

As described above, according to this embodiment, since the potential fixing layer VC as an electroconductive layer is disposed between the buffer layer BU and channel layer CH and coupled with the source electrode SE, fluctuation of the characteristics of the semiconductor element can be reduced. That is, the potential fixing layer VC can prevent the change of potential caused by the change of amount of charges in the layers below the potential fixing layer VC (for example, buffer layer BU, etc.) from exerting as far as on the channel layer CH. This can reduce the fluctuation of the characteristics such as the threshold voltage and the on-resistance.

In this embodiment, while the p-type nitride semiconductor layer is used as the potential fixing layer VC, an n-type nitride semiconductor layer may also be used. For example, silicon (Si) can be used as the n-type impurity. Since the n-type impurity has good concentration controllability and high activation ratio, the potential can be fixed more effectively. On the other hand, when the p-type nitride semiconductor layer is used, the potential fixing layer VC is depleted to form a high resistance layer when a positive voltage (positive bias) is applied to the drain electrode DE. This can improve the drain breakdown voltage.

Further, in this embodiment, since the coupling portion VIA is disposed in the active region AC in which electrons are conducted, the potential can be fixed more effectively.

While the inventions made by the present inventors have been described specifically by way of the preferred embodiments, it will be apparent that the inventions are not restricted to the embodiments described above but can be modified variously within a range not departing the gist thereof. For example, the potential fixing layer (VC) is applicable also to semiconductor devices having configurations other than those for the gate electrode portions as described in the first to the fourth embodiments.

What is claimed is:

1. A semiconductor device, comprising:
   a first nitride semiconductor layer formed over a substrate;
   a second nitride semiconductor layer formed over the first nitride semiconductor layer;
   a third nitride semiconductor layer formed over the second nitride semiconductor layer;
   a fourth nitride semiconductor layer formed over the third nitride semiconductor layer;
   a trench that penetrates the fourth nitride semiconductor layer and ends above a bottom surface of the third nitride semiconductor layer;
   a gate electrode disposed by way of a gate insulation film in the trench;
   a first electrode and a second electrode formed respectively over the fourth nitride semiconductor layer on both sides of the gate electrode; and
   a coupling portion for coupling the first electrode and the first nitride semiconductor layer,
   wherein an electron affinity of the third nitride semiconductor layer is larger than an electron affinity of the second nitride semiconductor layer,
   wherein an electron affinity of the fourth nitride semiconductor layer is smaller than the electron affinity of the second nitride semiconductor layer,
   wherein the first nitride semiconductor layer contains a p-type or an n-type impurity,
   wherein the coupling portion is disposed inside a through hole that penetrates the fourth nitride semiconductor layer, the third nitride semiconductor layer, and the second nitride semiconductor layer and reaches as far as the first nitride semiconductor layer, and
   wherein a bottom of the through hole is situated at a surface of the first nitride semiconductor layer or in the middle of the first nitride semiconductor layer.

2. The semiconductor device according to claim 1, wherein the first electrode is disposed over the coupling portion.

3. The semiconductor device according to claim 1, wherein the first nitride semiconductor layer contains a p-type impurity.

4. The semiconductor device according to claim 1, wherein a super lattice layer is interposed between the substrate and the first nitride semiconductor layer, and
   wherein the super lattice layer comprises two or more stacks each comprising a fifth nitride semiconductor layer and a sixth nitride semiconductor layer having an electron affinity different from that of the filth nitride semiconductor layer and disposed repetitively.

5. The semiconductor device according to claim 1, wherein a terminal potion, which is electrically coupled with the first electrode, is disposed over the coupling portion.

6. The semiconductor device according to claim 1, wherein a bottom surface of the trench is located above the bottom surface of the third nitride semiconductor layer.

7. A semiconductor device, comprising:
   a first nitride semiconductor layer formed over a substrate;
   a second nitride semiconductor layer formed over the first nitride semiconductor layer;
   a third nitride semiconductor layer formed over the second nitride semiconductor layer;
   a fourth nitride semiconductor layer formed over the third nitride semiconductor layer;
   a gate electrode disposed by way of a fifth nitride semiconductor layer over the fourth nitride semiconductor layer;
   a first electrode and a second electrode formed respectively over the fourth nitride semiconductor layer on both sides of the gate electrode; and
   a coupling portion for coupling the first electrode and the first nitride semiconductor layer, wherein an electron affinity of the third nitride semiconductor layer is larger than an electron affinity of the second nitride semiconductor layer, wherein an electron affinity of the fourth nitride semiconductor layer is smaller than the electron affinity of the second nitride semiconductor layer, wherein an electron affinity of the fifth nitride semiconductor layer is larger than the electron affinity of the fourth nitride semiconductor layer, wherein the first nitride semiconductor layer contains a p-type or an n-type impurity, wherein the substrate includes a first region and a second region, wherein the gate electrode, the first electrode, and the second electrode are formed in the first region, wherein the second region includes a device isolation region formed in the fourth nitride semiconductor layer and the third nitride semiconductor layer, and wherein the coupling portion is disposed inside a through hole that penetrates the device isolation region and the second nitride semiconductor layer, and reaches as far as the first nitride semiconductor layer.

8. The semiconductor device according to claim 7, wherein a terminal portion elect idly coupled with the first electrode is disposed over the coupling portion.

9. The semiconductor device according to claim 7, wherein a bottom of the through hole is situated at a surface of the first nitride semiconductor layer or in a middle of the first nitride semiconductor layer.

10. A semiconductor device, comprising:
a first nitride semiconductor layer formed over a substrate;
a second nitride semiconductor layer formed over the first nitride semiconductor layer;
a third nitride semiconductor layer formed over the second nitride semiconductor layer;
a fourth nitride semiconductor layer formed over the third nitride semiconductor layer;
a gate electrode disposed by way of a fifth nitride semiconductor layer over the fourth nitride semiconductor layer;
a first electrode and a second electrode formed respectively over the fourth nitride semiconductor layer on both sides of the gate electrode; and
a coupling portion for coupling the first electrode and the first nitride semiconductor layer, wherein an electron affinity of the third nitride semiconductor layer is larger than an electron affinity of the second nitride semiconductor layer, wherein an electron affinity of the fourth nitride semiconductor layer is smaller than the electron affinity of the second nitride semiconductor layer, wherein an electron affinity of the fifth nitride semiconductor layer is larger than the electron affinity of the fourth nitride semiconductor layer, wherein the first nitride semiconductor layer contains a p-type or an n-type impurity, wherein the coupling portion is disposed inside a through hole that penetrates the fourth nitride semiconductor layer, the third nitride semiconductor layer, and the second nitride semiconductor layer, and reaches as far as the first nitride semiconductor layer, wherein the substrate includes a first region and a second region, wherein the gate electrode, the first electrode, and the second electrode are formed in the first region, wherein the second region includes a device isolation region formed in the fourth nitride semiconductor layer and the third nitride semiconductor layer, and wherein the coupling portion is disposed inside the through hole, the through hole penetrating the device isolation region.

11. The semiconductor device according to claim 10, wherein a bottom surface of the through hole is located above a bottom surface of the first nitride semiconductor layer.

* * * * *